United States Patent
Mori et al.

(10) Patent No.: US 11,466,113 B2
(45) Date of Patent: Oct. 11, 2022

(54) COMPOSITION, FILM, INFRARED TRANSMITTING FILTER, SOLID IMAGE PICKUP ELEMENT, IMAGE DISPLAY DEVICE, AND INFRARED SENSOR

(71) Applicant: FUJIFILM Corporation, Tokyo (JP)

(72) Inventors: Masahiro Mori, Haibara-gun (JP);
Akio Mizuno, Haibara-gun (JP);
Kazuya Oota, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 319 days.

(21) Appl. No.: 16/515,483

(22) Filed: Jul. 18, 2019

(65) Prior Publication Data
US 2019/0338064 A1  Nov. 7, 2019

Related U.S. Application Data

(63) Continuation of application No. PCT/JP2018/002279, filed on Jan. 25, 2018.

(30) Foreign Application Priority Data

Jan. 30, 2017 (JP) .............................. JP2017-014422

(51) Int. Cl.
*C09D 7/40* (2018.01)
*C09D 151/00* (2006.01)
(Continued)

(52) U.S. Cl.
CPC .............. *C08F 290/12* (2013.01); *C09D 7/40* (2018.01); *C09D 151/00* (2013.01); *G02B 5/22* (2013.01); *H01L 27/146* (2013.01)

(58) Field of Classification Search
CPC ........ C08F 265/04; C08F 290/12; C09D 7/40; C09D 151/00; H01L 27/146;
(Continued)

(56) References Cited

U.S. PATENT DOCUMENTS 10,961,381 B2 * 3/2021 Mori .................... C08K 5/3415
2014/0120473 A1 5/2014 Aoyagi
(Continued)

FOREIGN PATENT DOCUMENTS

JP 11-172128 A 6/1999
JP 11-209554 A 8/1999
(Continued)

OTHER PUBLICATIONS

Japanese Notice of Reasons for Refusal dated Jun. 9, 2020, for corresponding Japanese Patent Application No. 2018-564627, with an English translation.
(Continued)

*Primary Examiner* — Bijan Ahvazi
(74) *Attorney, Agent, or Firm* — Birch, Stewart, Kolasch & Birch, LLP

(57) ABSTRACT

Provided is a composition with which a film having reduced color unevenness can be formed. In addition, provide are a film, an infrared transmitting filter, a solid image pickup element, an image display device, and an infrared sensor. The composition including a light shielding material; and a compound A having a weight-average molecular weight of 3000 or higher that has a radically polymerizable ethylenically unsaturated group, in which the compound A includes a repeating unit having a graft chain, and a ratio Amin/Bmax of a minimum value Amin of an absorbance of the composition in a wavelength range of 400 to 640 nm to a maximum value Bmax of an absorbance of the composition in a wavelength range of 940 to 1300 nm is 5 or higher.

15 Claims, 1 Drawing Sheet

(51) Int. Cl.
  *G02B 5/22* (2006.01)
  *H01L 27/146* (2006.01)
  *C08F 290/12* (2006.01)

(58) Field of Classification Search
  CPC ..... H01L 27/14649; G02B 5/22; G02B 5/208;
    C08L 33/02; C08L 33/10; C08L 33/14;
    C08L 37/00; C08L 2203/16; C08K 5/19;
    C08K 5/3415
  See application file for complete search history.

(56) References Cited

U.S. PATENT DOCUMENTS

| | | | |
|---|---|---|---|
| 2015/0260885 A1 | 9/2015 | Takishita et al. | |
| 2016/0075807 A1 | 3/2016 | Idei et al. | |
| 2017/0283587 A1 | 10/2017 | Hamada | |
| 2018/0057690 A1* | 3/2018 | Mori | C09B 23/164 |
| 2018/0305552 A1 | 10/2018 | Matsumura et al. | |
| 2019/0338064 A1 | 11/2019 | Mori et al. | |
| 2021/0109445 A1 | 4/2021 | Takahashi et al. | |

FOREIGN PATENT DOCUMENTS

| | | |
|---|---|---|
| JP | 2002-226587 A | 8/2002 |
| JP | 2006-248113 A | 9/2006 |
| JP | 2008-189747 A | 8/2008 |
| JP | 2013-77009 A | 4/2013 |
| JP | 2014-130338 A | 7/2014 |
| JP | 2015-25116 A | 2/2015 |
| JP | 6804567 B2 | 12/2020 |
| TW | 201641612 A | 12/2016 |
| WO | WO 2016/129324 A1 | 8/2016 |
| WO | WO 2016/158114 A1 | 10/2016 |
| WO | WO 2016/190162 A1 | 12/2016 |
| WO | WO 2017/130825 A1 | 8/2017 |

OTHER PUBLICATIONS

Korean Office Action, dated Jun. 16, 2020, for corresponding Korean Application No. 10-2019-7021886, with an English translation.
Chinese Office Action and Search Report for corresponding Chinese Application No. 201880008984.4, dated May 7, 2021, with English translation of the Office Action.
International Preliminary Report on Patentability and Written Opinion of the International Searching Authority (Forms PCT/IB/326, PCT/IB/373 and PCT/ISA/237) for International Application No. PCT/JP2018/002279, dated Aug. 8, 2019, with Engiish translation.
International Search Report (Form PCT/ISA/210) for International Application No. PCT/JP2018/002279, dated Apr. 17, 2018, with Endish translation.
Taiwanese Office Action and Search Report for corresponding Taiwanese Applicalion No. 107102571, dated Jul. 16, 2021, with an English translation.
Japanese Office Action for corresponding Japanese Application No. 2018-564627, dated Jun. 20, 2022, with English translation.

* cited by examiner

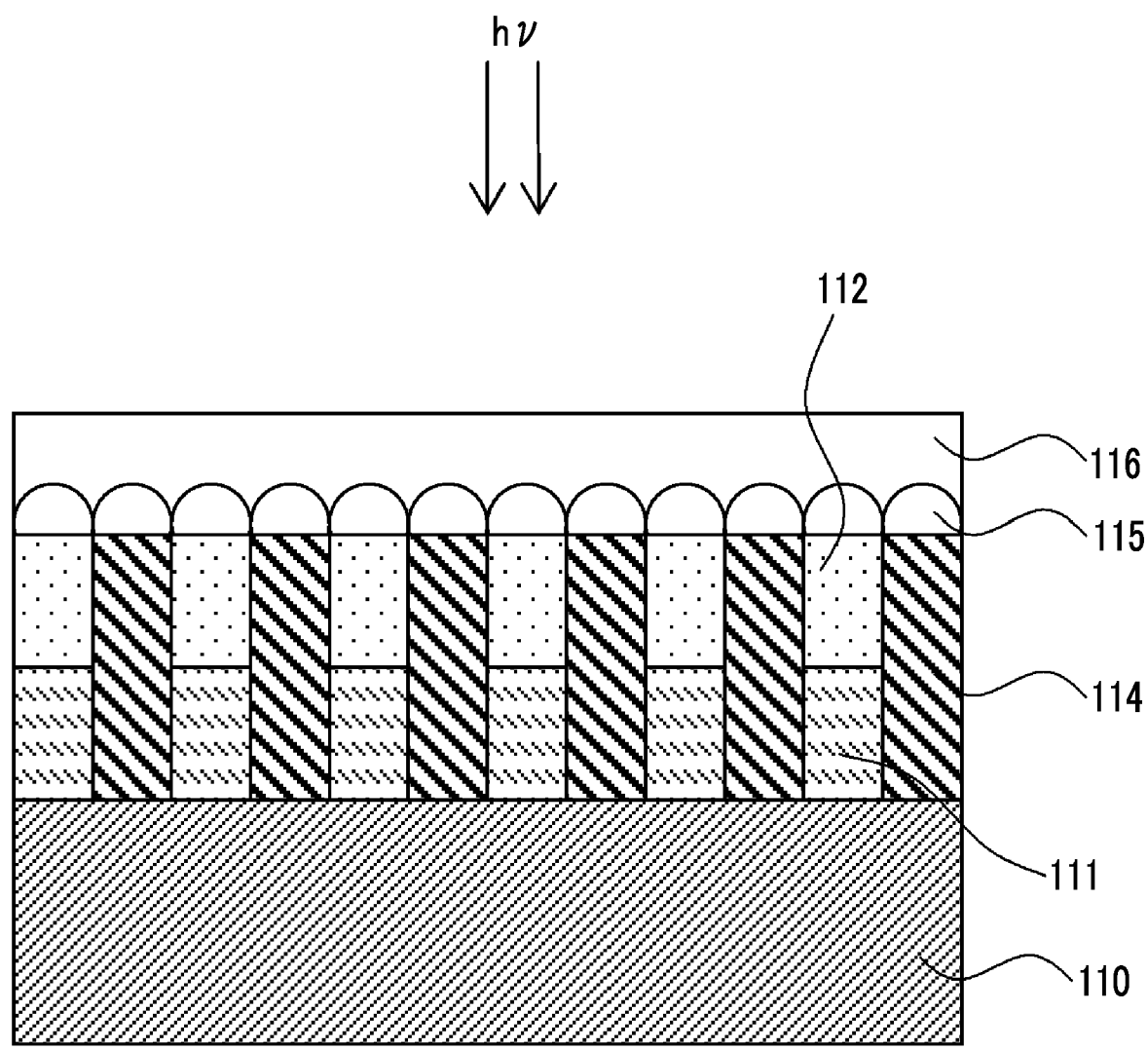

COMPOSITION, FILM, INFRARED TRANSMITTING FILTER, SOLID IMAGE PICKUP ELEMENT, IMAGE DISPLAY DEVICE, AND INFRARED SENSOR

CROSS-REFERENCE TO RELATED APPLICATIONS

This application is a Continuation of PCT International Application No. PCT/JP2018/002279 filed on Jan. 25, 2018, which claims priority under 35 U.S.C § 119(a) to Japanese Patent Application No. 2017-014422 filed on Jan. 30, 2017. Each of the above application(s) is hereby expressly incorporated by reference, in its entirety, into the present application.

BACKGROUND OF THE INVENTION

1. Field of the Invention

The present invention relates to a composition, a film, an infrared transmitting filter, a solid image pickup element, an image display device, and an infrared sensor.

2. Description of the Related Art

A solid image pickup element is used as an optical sensor in various applications. For example, infrared light is less likely to be scattered than visible light due to its longer wavelength and can be used in, for example, distance measurement or three-dimensional measurement. In addition, infrared light is invisible to humans or animals. Therefore, even in a case where a subject is irradiated with infrared light using an infrared light source at night, the object cannot recognize the infrared light. Thus, infrared light can be used for imaging a nocturnal wild animal or imaging a subject without provoking the object for security reasons. This way, an optical sensor (infrared sensor) that detects infrared light can be used in various applications, and the development of an infrared transmitting filter has been desired recently.

JP2013-077009A describes a radiation-sensitive coloring composition including a pigment, a photopolymerization initiator, and a polymerizable compound, in which in a case where a radiation-sensitive coloring composition layer having a spectral transmittance of 30% at a wavelength of 600 nm is formed, the radiation-sensitive coloring composition layer satisfies the following conditions (1) to (5):

(1) a spectral transmittance at a wavelength of 400 nm is 20% or lower;
(2) a spectral transmittance at a wavelength of 550 nm is 10% or lower;
(3) a spectral transmittance at a wavelength of 700 nm is 70% or higher;
(4) a wavelength at which a spectral transmittance is 50% is in a range of 650 nm to 680 nm; and
(5) the radiation-sensitive coloring composition layer has a thickness in a range of 0.55 μm to 1.8 μm.

JP2014-130338A describes a composition in which, in a case where a film having a thickness of 1 μm is formed using the composition, a maximum value of a light transmittance of the film in a thickness direction in a wavelength range of 400 to 750 nm is 20% or lower, and a minimum value of a light transmittance of the film in the thickness direction in a wavelength range of 900 to 1300 nm is 90% or higher.

SUMMARY OF THE INVENTION

As spectral characteristics required for an infrared transmitting filter, spectral characteristics in which the light shielding properties of visible light is high and transmission of infrared light in a specific wavelength range can be selectively allowed are desired. In a case where a composition is used for manufacturing an infrared transmitting filter in order to achieve the above-described spectral characteristics, this composition includes a light shielding material formed of a plurality of colorants and the like in many cases.

However, according to an investigation by the present inventors, it was found that the light shielding material or the like is likely to aggregate during film formation such that color unevenness is likely to occur in the film formed using the composition. In particular, it was found that, in a case where the composition includes a plurality of colorants as a light shielding material, the aggregation is likely to occur, and color unevenness is likely to occur.

Accordingly, an object of the present invention is to provide a composition with which a film having reduced color unevenness can be manufactured. In addition, another object of the present invention is to provide a film, an infrared transmitting filter, a solid image pickup element, an image display device, and an infrared sensor.

As a result of thorough investigation under the above-described circumstances, the present inventors found that the objects of the present invention can be achieved with a composition having a configuration described below, thereby completing the present invention. Accordingly, the present invention provides the following.

<1> A composition comprising
a light shielding material; and
a compound A having a weight-average molecular weight of 3000 or higher that has a radically polymerizable ethylenically unsaturated group,
in which the compound A includes a repeating unit having a graft chain, and
a ratio Amin/Bmax of a minimum value Amin of an absorbance of the composition in a wavelength range of 400 to 640 nm to a maximum value Bmax of an absorbance of the composition in a wavelength range of 1100 to 1300 nm is 5 or higher.

<2> The composition according to <1>,
in which the radically polymerizable ethylenically unsaturated group included in the compound A is at least one selected from a vinyl group, a vinyloxy group, an allyl group, a methallyl group, a (meth)acryloyl group, a styrene group, a cinnamoyl group, and a maleimide group.

<3> The composition according to <1> or <2>,
in which the graft chain includes at least one structure selected from a polyester structure, a polyether structure, a poly(meth)acryl structure, a polyurethane structure, a polyurea structure, and a polyamide structure.

<4> The composition according to <3>,
in which the graft chain includes a polyester structure.

<5> The composition according to any one of <1> to <4>,
in which the weight-average molecular weight of the repeating unit having a graft chain is 1000 or higher.

<6> The composition according to any one of <1> to <5>,
in which the compound A includes a repeating unit having a radically polymerizable ethylenically unsaturated group and a repeating unit having a graft chain.

<7> The composition according to any one of <1> to <6>,
wherein the compound A includes a repeating unit represented by the following Formula (A-1-1) and a repeating unit represented by the following Formula (A-1-2),

in Formula (A-1-1), $X^1$ represents a main chain of the repeating unit, $L^1$ represents a single bond or a divalent linking group, and $Y^1$ represents a group having a radically polymerizable ethylenically unsaturated group, and in Formula (A-1-2), $X^2$ represents a main chain of the repeating unit, $L^2$ represents a single bond or a divalent linking group, and $W^1$ represents a graft chain.

<8> The composition according to any one of <1> to <7>, in which the compound A further includes a repeating unit having an acid group.

<9> The composition according to any one of <1> to <8>, in which an amount of the radically polymerizable ethylenically unsaturated group in the compound A is 0.2 to 5.0 mmol/g.

<10> The composition according to any one of <1> to <9>, in which an acid value of the compound A is 20 to 150 mgKOH/g.

<11> The composition according to any one of <1> to <10>, in which the light shielding material includes two or more chromatic colorants and forms black using a composition of the two or more chromatic colorant.

<12> The composition according to any one of <1> to <11>, in which the light shielding material includes an organic black colorant.

<13> The composition according to any one of <1> to <12>, further comprising: a near infrared absorber.

<14> A film which is formed using the composition according to any one of <1> to

<13>.

<15> An infrared transmitting filter comprising:

the film according to <14>.

<16> A solid image pickup element comprising:

the film according to <14>.

<17> An image display device comprising:

the film according to <14>.

<18> An infrared sensor comprising:

the film according to <14>.

According to the present invention, a composition with which a film having reduced color unevenness can be provided. In addition, a film, a near infrared cut filter, a solid image pickup element, an image display device, and an infrared sensor can be provided.

BRIEF DESCRIPTION OF THE DRAWINGS

FIG. 1 is a schematic diagram showing an embodiment of an infrared sensor.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate or methacrylate, "(meth)acryl" denotes either or both of acryl and methacryl, and "(meth)acryloyl" denotes either or both of acryloyl and methacryloyl.

In this specification, a weight-average molecular weight and a number-average molecular weight are defined as values in terms of polystyrene obtained by gel permeation chromatography (GPC).

In this specification, the weight-average molecular weight (Mw) and the number-average molecular weight (Mn) can be obtained, for example, by using HLC-8220GPC (manufactured by Tosoh Corporation), using a column in which TOSOH TSK gel Super HZM-H, TOSOH TSK gel Super HZ4000, and TOSOH TSK gel Super HZ2000 are linked to each other, and using tetrahydrofuran as a developing solvent.

In this specification, in a chemical formula, Me represents a methyl group, Et represents an ethyl group, Bu represents a butyl group, and Ph represents a phenyl group.

In this specification, "near infrared light" denotes light (electromagnetic wave) in a wavelength range of 700 to 2500 nm.

In this specification, a total solid content denotes the total mass of all the components of the composition excluding a solvent.

In this specification, the term "step" denotes not only an individual step but also a step which is not clearly distinguishable from another step as long as an effect expected from the step can be achieved.

<Composition>

A composition according to an embodiment of the present invention comprises: a light shielding material; and a compound A having a weight-average molecular weight of 3000 or higher that has a radically polymerizable ethylenically unsaturated group, in which the compound A includes a repeating unit having a graft chain, and a ratio Amin/Bmax of a minimum value Amin of an absorbance of the composition in a wavelength range of 400 to 640 nm to a maximum value Bmax. of an absorbance of the composition in a wavelength range of 1100 to 1300 nm is 5 or higher.

With the composition according to the embodiment of the present invention, a film having suppressed color unevenness can be manufactured. The reason why this effect is obtained is presumed to be as follows. It is presumed that the compound A approaches the light shielding material due to an interaction between the radically polymerizable ethylenically unsaturated group or an acid group in the compound A and the light shielding material such that the light shielding material is present in the composition to be surrounded by the compound A. The compound A includes the repeating unit having a graft chain. Therefore, it is presumed that the aggregation of the light shielding material or the like can be suppressed due to a steric hindrance caused by the graft chain. In addition, the compound A has the radically polymerizable ethylenically unsaturated group, but the radically polymerizable ethylenically unsaturated group is highly reactive. Therefore, it is presumed that the compound A is cured in the vicinity of the light shielding material. Therefore, it is presumed that the aggregation with the light shielding material during film formation can be effectively suppressed. Thus, according to the present invention, it is presumed that a film having reduced color unevenness can be manufactured.

In addition, in the composition according to the embodiment of the present invention, the ratio Amin/Bmax of the minimum value Amin of the absorbance of the composition in a wavelength range of 400 to 640 nm to the maximum value Bmax of the absorbance of the composition in a wavelength range of 1100 to 1300 nm is 5 or higher. Therefore, a film that shields visible light and allows transmission of infrared light in a specific wavelength range can be formed.

In addition, the compound A has the radically polymerizable ethylenically unsaturated group, but the radically polymerizable ethylenically unsaturated group is highly reactive. Therefore, the curing properties of the film can be improved, and the adhesiveness of the film with a support or the like can be improved.

In the composition according to the embodiment of the present invention, the absorbance conditions can be suitably achieved by adjusting, for example, the kind and content of the light shielding material.

Regarding the spectral characteristics of the composition according to the embodiment of the present invention, the value of Amin/Bmax is preferably 7.5 or higher, more preferably 15 or higher, and still more preferably 30 or higher.

An absorbance $A\lambda$ at a wavelength $\lambda$ is defined by the following Expression (1).

$$A\lambda = -\log(T\lambda/100) \quad (1)$$

$A\lambda$ represents the absorbance at the wavelength $\lambda$, and $T\lambda$ represents a transmittance (%) at the wavelength $\lambda$.

In the present invention, a value of the absorbance may be a value measured in the form of a solution or a value of a film which is formed using the composition. In a case where the absorbance is measured in the form of the film, it is preferable that the absorbance is measured using a film that is formed by applying the composition to a glass substrate using a method such as spin coating such that the thickness of the dried film is a predetermined value, and drying the applied composition using a hot plate at 100° C. for 120 seconds. The thickness of the film can be obtained by measuring the thickness of the substrate including the film using a stylus surface profilometer (DEKTAK 150, manufactured by ULVAC Inc.).

In addition, the absorbance can be measured using a well-known spectrophotometer of the related art. Measurement conditions of the absorbance are not particularly limited. It is preferable that the maximum value Bmax of the absorbance in a wavelength range of 1100 to 1300 nm is measured under conditions which are adjusted such that the minimum value Amin of the absorbance in a wavelength range of 400 to 640 nm is 0.1 to 3.0. By measuring the absorbance under the above-described conditions, a measurement error can be further reduced. A method of adjusting the minimum value Amin of the absorbance in a wavelength range of 400 to 640 nm to be 0.1 to 3.0 is not particularly limited. For example, in a case where the absorbance is measured in the form of the composition, for example, a method of adjusting the optical path length of a sample cell can be used. In addition, in a case where the absorbance is measured in the form of the film, for example, a method of adjusting the thickness of the film can be used.

A specific example of a method of measuring the spectral characteristics and the thickness of the film formed using the composition according to the embodiment of the present invention is as follows.

The composition according to the embodiment of the present invention is applied to a glass substrate using a method such as spin coating such that the thickness of the dried film is a predetermined value, and then is dried using a hot plate at 100° C. for 120 seconds. The thickness of the film is obtained by measuring the thickness of the dried substrate including the film using a stylus surface profilometer (DEKTAK 150, manufactured by ULVAC Inc.). The transmittance of the dried substrate including the film is measured in a wavelength range of 300 to 1300 nm using an ultraviolet-visible-near infrared spectrophotometer (U-4100, manufactured by Hitachi High-Technologies Corporation).

The composition according to the embodiment of the present invention can also be referred to as an infrared light transmitting composition because it allows transmission of infrared light. Hereinafter, each of components which can form the composition according to the embodiment of the present invention will be described.

<<Light Shielding Material>>

The composition according to the embodiment of the present invention includes the light shielding material. In the present invention, it is preferable that the light shielding material is a coloring material that absorbs light in a wavelength range of violet to red. In addition, in the present invention, it is preferable that the light shielding material is a coloring material that shields light in a wavelength range of 400 to 640 nm. In addition, it is preferable that the light shielding material is a coloring material that allows transmission of light in a wavelength range of 1100 to 1300 nm. In the present invention, it is preferable that the light shielding material satisfies at least one of the following requirement (A) or (B).

(1): The coloring material that shields visible light includes two or more chromatic colorants, and a combination of the two or more chromatic colorants forms black.

(2) The coloring material that shields light in the visible range includes an organic black colorant. In the aspect (2), it is preferable that the coloring material that shields light in the visible range further includes a chromatic colorant.

In the present invention, the chromatic colorant denotes a colorant other than a white colorant and a black colorant. In addition, in the present invention, the organic black colorant used as the light shielding material denotes a material that absorbs visible light and allows transmission of at least a part of infrared light. Accordingly, in the present invention, the organic black colorant used as the light shielding material does not denote a black colorant that absorbs both visible light and infrared light, for example, carbon black or titanium black. It is preferable that the organic black colorant is a colorant having an absorption maximum in a wavelength range of 400 nm to 700 nm.

In the present invention, It is preferable that the light shielding material is a material in which the ratio $A_{min}/B_{max}$ of the minimum value $A_{min}$ of the absorbance in a wavelength range of 400 to 640 nm to the maximum value $B_{max}$ of the absorbance in a wavelength range of 1100 to 1300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants. In addition, in the aspect (2), the spectral characteristics may be satisfied using an organic black colorant. In addition, the spectral characteristics may be satisfied using a combination of an organic black colorant and a chromatic colorant.

(Chromatic Colorant)

In the present invention, the chromatic colorant is selected from the group consisting of a red colorant, a green colorant, a blue colorant, a yellow colorant, a violet colorant, and an orange colorant. In the present invention, the chromatic colorant may be a pigment or a dye. It is preferable that the chromatic colorant is a pigment. It is preferable that an average particle size (r) of the pigment satisfies preferably 20 nm≤r<300 nm, more preferably 25 nm≤r<250 nm, and still more preferably 30 nm≤r<200 nm. "Average particle size" described herein denotes the average particle size of secondary particles which are aggregates of primary particles of the pigment. In addition, regarding a particle size distribution of the secondary particles of the pigment (hereinafter, simply referred to as "particle size distribution") which can be used, secondary particles having a particle size of (average particle size±100) nm account for preferably 70 mass % or higher and more preferably 80 mass % or higher in the pigment. The particle size distribution of the secondary particles can be measured using a scattering intensity distribution.

As the pigment, an organic pigment is preferable. Preferable examples of the organic pigment are as follows:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-034966A can also be used.

It is preferable that the light shielding material includes two or more selected from a red colorant, a blue colorant, a yellow colorant, a violet colorant, and a green colorant. That is, it is preferable that the light shielding material forms black using a combination of two or more colorants selected from a red colorant, a blue colorant, a yellow colorant, a violet colorant, and a green colorant. Examples of a preferable combination are as follows.

(1) An aspect in which the light shielding material includes a red colorant and a blue colorant (2) An aspect in which the light shielding material includes a red colorant, a blue colorant, and a yellow colorant (3) An aspect in which the light shielding material includes a red colorant, a blue colorant, a yellow colorant, and a violet colorant (4) An aspect in which the light shielding material includes a red colorant, a blue colorant, a yellow colorant, a violet colorant, and a green colorant (5) An aspect in which the light shielding material includes a red colorant, a blue colorant, a yellow colorant, and a green colorant (6) An aspect in which the light shielding material includes a red colorant, a blue colorant, and a green colorant (7) An aspect in which the light shielding material includes a yellow colorant and a violet colorant In the aspect (1), a mass ratio red colorant:blue colorant between the red colorant and the blue colorant is preferably 20 to 80:20 to 80, more preferably 20 to 60:40 to 80, and more preferably 20 to 50:50 to 80.

In the aspect (2), a mass ratio red colorant:blue colorant: yellow colorant between the red colorant, the blue colorant, and the yellow colorant is preferably 10 to 80:20 to 80:10 to 40, more preferably 10 to 60:30 to 80:10 to 30, and still more preferably 10 to 40:40 to 80:10 to 20.

In the aspect (3), a mass ratio red colorant:blue colorant: yellow colorant:violet colorant between the red colorant, the blue colorant, the yellow colorant, and the violet colorant is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the aspect (4), a mass ratio red colorant:blue colorant: yellow colorant:violet colorant:green colorant between the red colorant, the blue colorant, the yellow colorant, the violet colorant, and the green colorant is preferably 10 to 80:20 to 80:5 to 40:5 to 40:5 to 40, more preferably 10 to 60:30 to 80:5 to 30:5 to 30:5 to 30, and still more preferably 10 to 40:40 to 80:5 to 20:5 to 20.

In the aspect (5), a mass ratio red colorant:blue colorant:yellow colorant:green colorant between the red colorant, the blue colorant, the yellow colorant, and the green colorant is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the aspect (6), a mass ratio red colorant:blue colorant:green colorant between the red colorant, the blue colorant, and the green colorant is preferably 10 to 80:20 to 80:10 to 40, more preferably 10 to 60:30 to 80:10 to 30, and still more preferably 10 to 40:40 to 80:10 to 20.

In the aspect (7), a mass ratio yellow colorant:violet colorant between the yellow colorant and the violet colorant is preferably 10 to 50:40 to 80, more preferably 20 to 40:50 to 70, and still more preferably 30 to 40:60 to 70.

As the yellow colorant, C.I. Pigment Yellow 139, 150, or 185 is preferable, C.I. Pigment Yellow 139 or 150 is more preferable, and C.I. Pigment Yellow 139 is still more preferable. As the blue colorant, C.I. Pigment Blue 15:6 is preferable. As the violet colorant, for example, C.I. Pigment Violet 23 is preferable. As the red colorant, C.I. Pigment Red 122, 177, 224, or 254 is preferable, C.I. Pigment Red 122, 177, or 254 is more preferable, and C.I. Pigment Red 254 is still more preferable. As the green colorant, C.I. Pigment Green 7, 36, 58, or 59 is preferable.

(Organic Black Colorant)

In the present invention, examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include a compound described in JP2010-534726A, JP2012-515233A, and JP2012-515234A. For example, "Irgaphor Black" (manufactured by BASF SE) is available. Examples of the perylene compound include C.I. Pigment Black 31 and 32. Examples of the azomethine compound include compounds described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available.

In the present invention, it is preferable that the bisbenzofuranone compound is one of the following compounds represented by the following formulae or a mixture thereof.

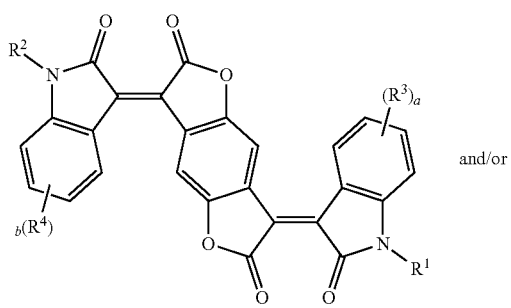

and/or

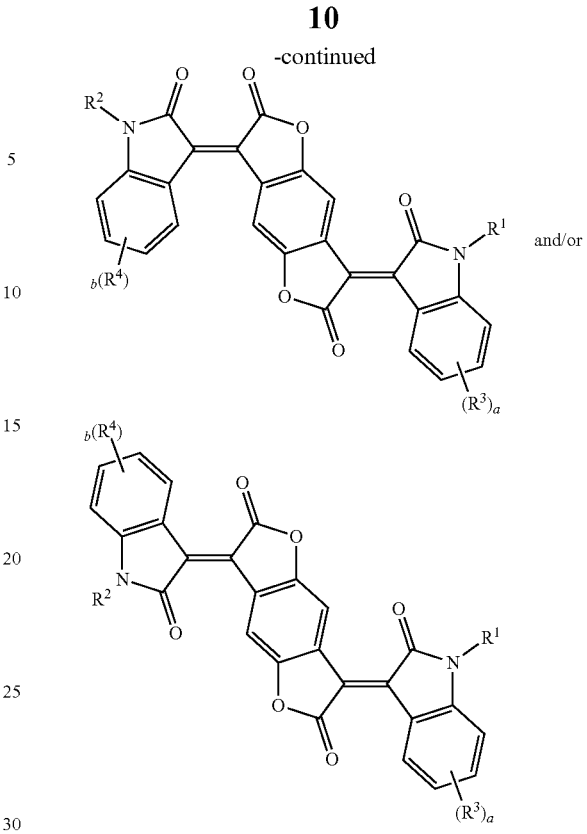

In the formulae, $R^1$ and $R^2$ each independently represent a hydrogen atom or a substituent, $R^3$ and $R^4$ each independently represent a substituent, a and b each independently represent an integer of 0 to 4, in a case where a is 2 or more, a plurality of $R^3$'s may be the same as or different from each other, a plurality of $R^3$'s may be bonded to each other to form a ring, in a case where b is 2 or more, a plurality of $R^4$'s may be the same as or different from each other, and a plurality of $R^4$'s may be bonded to each other to form a ring.

The substituent represented by $R^1$ to $R^4$ is a halogen atom, a cyano group, a nitro group, an alkyl group, an alkenyl group, an alkynyl group, an aralkyl group, an aryl group, a heteroaryl group, $-OR^{301}$, $-COR^{302}$, $-COOR^{303}$, $-OCOR^{304}$, $-NR^{305}R^{306}$, $-NHCOR^{307}$, $-CONR^{308}R^{309}$, $NHCONR^{310}R^{311}$, $-NHCOOR^{312}$, $-SR^{313}$, $-SO_2R^{314}$, $-SO_2OR^{315}$, $-NHSO_2R^{316}$, or $-SO_2NR^{317}R^{318}$. $R^{301}$ to $R^{318}$ each independently represent a hydrogen atom, an alkyl group, an alkenyl group, an alkynyl group, an aryl group, or a heteroaryl group.

The details of the bisbenzofuranone compound can be found in paragraphs "0014" to "0037" of JP2010-534726A, the content of which is incorporated herein by reference.

In the present invention, in a case where an organic black colorant is used as the light shielding material, it is preferable that the organic black colorant is used in combination with a chromatic colorant. By using the organic black colorant in combination with a chromatic colorant, excellent spectral characteristics are likely to be obtained. Examples of the chromatic colorant which can be used in combination with the organic black colorant include a red colorant, a blue colorant, and a violet colorant. Among these, a red colorant or a blue colorant is preferable. Among these colorants, one kind may be used alone, or two or more kinds may be used in combination.

In addition, regarding a mixing ratio between the chromatic colorant and the organic black colorant, the amount of the chromatic colorant is preferably 10 to 200 parts by mass and more preferably 15 to 150 parts by mass with respect to 100 parts by mass of the organic black colorant.

In the present invention, the content of the pigment in the light shielding material is preferably 95 mass % or higher, more preferably 97 mass % or higher, and still more preferably 99 mass % or higher with respect to the total mass of the light shielding material.

In the composition according to the embodiment of the present invention, the content of the light shielding material is preferably 10 to 70 mass % with respect to the total solid content of the composition. The lower limit is preferably 30 mass % or higher and more preferably 40 mass % or higher.

<<Compound A>>

The composition according to the embodiment of the present invention includes the compound A having a weight-average molecular weight (Mw) of 3000 or higher that includes a repeating unit having a graft chain and has a radically polymerizable ethylenically unsaturated group. In the present invention, the compound A can also be used as a dispersant.

The weight-average molecular weight of the compound A is 3000 or higher, preferably 3000 to 50000, more preferably 7000 to 40000, and still more preferably 10000 to 30000. In a case where the weight-average molecular weight of the compound A is 3000 or higher, the dispersibility of the light shielding material or the like is excellent.

As the radically polymerizable ethylenically unsaturated group included in the compound A, a vinyl group, a vinyloxy group, an allyl group, a methallyl group, a (meth)acryloyl group, a styrene group, a cinnamoyl group, or a maleimide group is preferable, a (meth)acryloyl group, a (meth)acryloyl group, a styrene group, or a maleimide group is more preferable, a (meth)acryloyl group is still more preferable, and an acryloyl group is still more preferable. A (meth)acryloyl group is highly reactive and has a low steric hindrance. Therefore, a (meth)acryloyl group is likely to be cured in the vicinity of the light shielding material or the like, and the effects of the present invention can be more significantly obtained.

The amount of the radically polymerizable ethylenically unsaturated group (hereinafter, also referred to as C=C value) in the compound A is preferably 0.2 to 5.0 mmol/g. The upper limit is more preferably 4.0 mmol/g or lower and still more preferably 3.0 mmol/g or lower. The lower limit is more preferably 0.3 mmol/g or higher. The C=C value in the compound A is a numerical value representing the molar amount of the C=C group per 1 g of the solid content of the compound A. The C=C value in the compound A can be calculated from the following expression after extracting a low molecular weight component (A) of the C=C group portion (for example, methacrylic acid in P-1 or acrylic acid in P-2 described below) from the compound A by an alkali treatment and measuring the content of the low molecular weight component (A) by high-performance liquid chromatography (HPLC). In addition, in a case where the C=C group portion cannot be extracted from the compound A by an alkali treatment, a value measured using nuclear magnetic resonance (NMR) is used.

C=C value [mmol/g] in Compound $A$=(Content [ppm] of Low Molecular Weight Component ($a$)/Molecular weight [g/mol] of Low Molecular Weight Component ($a$))/(Weight [g] of Compound $A$×(Solid Content Concentration [mass %] of Compound $A$/100)×10)

In the compound A, it is preferable that the radically polymerizable ethylenically unsaturated group is provided at a side chain of the repeating unit. That is, it is preferable that the compound A includes a repeating unit represented by Formula (A-1-1).

(A-1-1)

In Formula (A-1-1), $X^1$ represents a main chain of the repeating unit, $L^1$ represents a single bond or a divalent linking group, and $Y^1$ represents a group having a radically polymerizable ethylenically unsaturated group.

In Formula (A-1-1), the main chain of the repeating unit represented by $X^1$ is not particularly limited. The main chain is not particularly limited as long as it is a linking group formed of a well-known polymerizable monomer. Examples of the main chain include a poly(meth)acrylic linking group, a polyalkyleneimine linking group, a polyester linking group, a polyurethane linking group, a polyurea linking group, a polyamide linking group, a polyether linking group, and a polystyrene linking group. From the viewpoint of availability and manufacturing suitability of raw materials, a poly(meth)acrylic linking group, a polyalkyleneimine linking group, is preferable, and a (meth)acrylic linking group is more preferable.

Examples of the divalent linking group represented by $L^1$ in Formula (A-1-1) include an alkylene group (preferably an alkylene group having 1 to 12 carbon atoms), an alkyleneoxy group (preferably an alkyleneoxy group having 1 to 12 carbon atoms), an oxyalkylenecarbonyl group (preferably an oxyalkylenecarbonyl group having 1 to 12 carbon atoms), an arylene group (preferably an arylene group having 6 to 20 carbon atoms), —NH—, —SO—, —SO$_2$—, —CO—, —O—, —COO—, OCO—, —S—, and a group including a combination of two or more of the above-described groups. The alkylene group, the alkylene group in the alkyleneoxy group, and the alkylene group in the oxyalkylenecarbonyl group may be linear, branched, or cyclic and is preferably linear or branched. In addition, the alkylene group, the alkylene group in the alkyleneoxy group, and the alkylene group in the oxyalkylenecarbonyl group may have a substituent or may be unsubstituted. Examples of the substituent include a hydroxyl group and an alkoxy group. From the viewpoint of manufacturing suitability, a hydroxyl group is preferable.

Examples of the group having radically polymerizable ethylenically unsaturated group represented by $Y^1$ in Formula (A-1-1) include a group including at least one selected from a vinyl group, a vinyloxy group, an allyl group, a methallyl group, a (meth)acryloyl group, a styrene group, a cinnamoyl group, and a maleimide group. Among these a (meth)acryloyl group, a styrene group, or a maleimide group is preferable, a (meth)acryloyl group is more preferable, and an acryloyl group is still more preferable.

Specific examples of the repeating unit represented by Formula (A-1-1) include a repeating unit represented by the following Formula (A-1-1a) and a repeating unit represented by the following Formula (A-1-1b).

(A-1-1a)

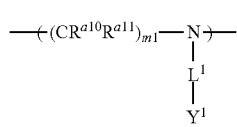

(A-1-1b)

In Formula (A-1-1a), $R^{a1}$ to $R^{a3}$ each independently represent a hydrogen atom or an alkyl group, $Q^{a1}$ represents —CO—, —COO—, —OCO—, —CONH—, or a phenylene group, $L^1$ represents a single bond or a divalent linking group, and $Y^1$ represents a group having a radically polymerizable ethylenically unsaturated group. The number of carbon atoms in the alkyl group represented by $R^{a1}$ to $R^{a3}$ is preferably 1 to 10, more preferably 1 to 3, and still more preferably 1. $Q^{a1}$ represents preferably —COO— or —CONH— and more preferably —COO—.

In Formula (A-1-1b), $R^{a10}$ to and $R^{a10}$ each independently represent a hydrogen atom or an alkyl group, m1 represents an integer of 1 to 5, L represents a single bond or a divalent linking group, and $Y^1$ represents a group having a radically polymerizable ethylenically unsaturated group. The number of carbon atoms in the alkyl group represented by $R^a O$ and $R^a t$ is preferably 1 to 10 and more preferably 1 to 3.

In the present invention, the graft chain in the compound A refers to a polymer chain branched and extending from the main chain of the repeating unit. The length of the graft chain is not particularly limited. However, as the length of the graft chain increases, the steric repulsion effect is improved, and the dispersibility of the light shielding material or the like can be improved. The number of atoms in the graft chain other than hydrogen atoms is preferably 40 to 10000, more preferably 50 to 2000, and still more preferably 60 to 500.

It is preferable that the graft chain includes at least one structure selected from a polyester structure, a polyether structure, a poly(meth)acryl structure, a polyurethane structure, a polyurea structure, and a polyamide structure, it is more preferable that the graft chain includes at least one structure selected from a polyester structure, a polyether structure, or a poly(meth)acryl structure, and it is still more preferable that the graft chain includes a polyester structure. Examples of the polyester structure include a structure represented by the following Formula (G-1), a structure represented by the following Formula (G-4), and a structure represented by the following Formula (G-5). In addition, examples of the polyether structure include a structure represented by the following Formula (G-2). In addition, examples of the poly(meth)acryl structure include a structure represented by the following Formula (G-3).

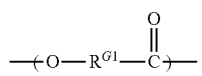
(G-1)

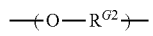
(G-2)

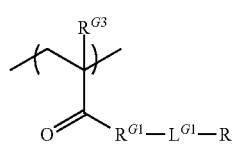
(G-3)

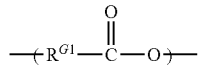
(G-4)

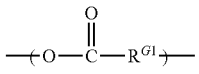
(G-5)

In the formulae, $R^{G1}$ and $R^{G2}$ each independently represent an alkylene group. The alkylene group represented by $R^{G1}$ and $R^{G2}$ is not particularly limited, and a linear or branched alkylene group having 1 to 20 carbon atoms is preferable, a linear or branched alkylene group having 2 to 16 carbon atoms is more preferable, and a linear or branched alkylene group having 3 to 12 carbon atoms is still more preferable.

In the formulae, $R^{G3}$ represents a hydrogen atom or a methyl group.

In the formulae, $Q^{G1}$ represents —O— or —NH—, and $L^{G1}$ represents a single bond or a divalent linking group. Examples of the divalent linking group include an alkylene group (preferably an alkylene group having 1 to 12 carbon atoms), an alkyleneoxy group (preferably an alkyleneoxy group having 1 to 12 carbon atoms), an oxyalkylenecarbonyl group (preferably an oxyalkylenecarbonyl group having 1 to 12 carbon atoms), an arylene group (preferably an arylene group having 6 to 20 carbon atoms), —NH—, —SO—, —SO$_2$—, —CO—, —O—, —COO—, OCO—, —S—, and a group including a combination of two or more of the above-described groups.

$R^{G4}$ represents a hydrogen atom or a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group.

For example, in a case where the graft chain includes a polyester structure, $R^{G1}$ may include only one polyester structure or may include two or more different polyester structures. In addition, in a case where the graft chain includes a polyether structure, $R^{G2}$ may include only one polyether structure or may include two or more different polyether structures. In addition, in a case where the graft chain includes a poly(meth)acryl structure, at least one selected from $R^{G3}$, $Q^{G1}$, $L^{G1}$, or $R^{G4}$ may include only one poly(meth)acryl structure or may include two or more different poly(meth)acryl structures.

A terminal structure of the graft chain is not particularly limited. The terminal structure may be a hydrogen atom or a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. Among these, from the viewpoint of the dispersibility of the light shielding material or the like, a group having a steric repulsion effect is preferable, and an alkyl group or an alkoxy group having 5 to 24 carbon atoms is preferable. The alkyl group and the alkoxy group may be linear, branched, or cyclic and is preferably linear or branched.

In the present invention, as the graft chain, a structure represented by the following Formula (G-1a), Formula (G-2a), Formula (G-3a), Formula (G-4a), or Formula (G-5a) is preferable.

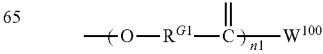
(G-1a)

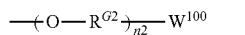 (G-2a)

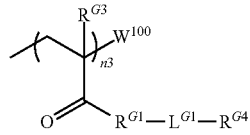 (G-3a)

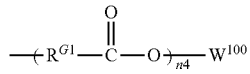 (G-4a)

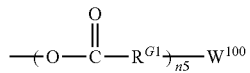 (G-5a)

In the formulae, $R^{G1}$ and $R^{G2}$ each independently represent an alkylene group, $R^{G3}$ represents a hydrogen atom or a methyl group, $Q^{G1}$ represents —O— or —NH—, $L^{G1}$ represents a single bond or a divalent linking group, $R^{G4}$ represents a hydrogen atom or a substituent, and $W^{100}$ represents a hydrogen atom or a substituent. n1 to n5 each independently represent an integer of 2 or more. $R^{G1}$ to $R^{G4}$, $Q^{G1}$, and $L^{G1}$ have the same definitions and the same preferable ranges as $R^{G1}$ to $R^{G4}$, $Q^{G1}$, and $L^{G1}$ described above regarding Formulae (G-1) to (G-5).

In Formulae (G-1a) to (G-5a), it is preferable that $W^{100}$ represents a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. Among these, from the viewpoint of the dispersibility of the light shielding material or the like, a group having a steric repulsion effect is preferable, and an alkyl group or an alkoxy group having 5 to 24 carbon atoms is preferable. The alkyl group and the alkoxy group may be linear, branched, or cyclic and is preferably linear or branched.

In Formulae (G-1a) to (G-5a), n1 to n5 each independently represent preferably an integer of 2 to 100, more preferably an integer of 2 to 80, and still more preferably an integer of 8 to 60.

In a case where n1 in Formula (G-1a) represents 2 or more, $R^{G1}$ in the respective repeating units may be the same as or different from each other. In a case where $R^{G1}$ includes two or more different repeating units, the arrangement of the respective repeating units is not particularly limited and may be random, alternate, or block-shaped. The same shall be applied to Formulae (G-2a) to (G-5a).

Examples of the repeating unit having a graft chain include a repeating unit represented by the following Formula (A-1-2).

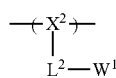 (A-1-2)

In Formula (A-1-2), $X^2$ represents a main chain of the repeating unit, $L^2$ represents a single bond or a divalent linking group, and $W^1$ represents a graft chain.

Examples of the main chain of the repeating unit represented by $X^2$ in Formula (A-1-2) include the structures represented by $X^1$ in Formula (A-1-1), and preferable ranges thereof are the same. Examples of the divalent linking group represented by $L^2$ in Formula (A-1-2) include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, OCO—, —S—, and a group including a combination of two or more of the above-described groups. Examples of the graft chain represented by $W^1$ in Formula (A-1-2) include the graft chains.

Specific examples of the repeating unit represented by Formula (A-1-2) include a repeating unit represented by the following Formula (A-1-2a) and a repeating unit represented by the following Formula (A-1-2b).

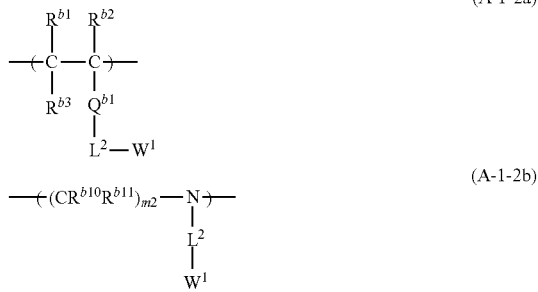

In Formula (A-1-2a), $R^{b1}$ to $R^{b3}$ each independently represent a hydrogen atom or an alkyl group, $Q^{b1}$ represents —CO—, —COO—, —OCO—, —CONH—, or a phenylene group, $L^2$ represents a single bond or a divalent linking group, and $W^1$ represents a graft chain. The number of carbon atoms in the alkyl group represented by $R^{b1}$ to $R^{b3}$ is preferably 1 to 10, more preferably 1 to 3, and still more preferably 1. $Q^{b1}$ represents preferably —COO— or —CONH— and more preferably —COO—.

In Formula (A-1-2b), $R^{b10}$ and $R^{b11}$ each independently represent a hydrogen atom or an alkyl group, m2 represents an integer of 1 to 5, $L^2$ represents a single bond or a divalent linking group, and $W^1$ represents a graft chain. The number of carbon atoms in the alkyl group represented by $R^{b10}$ and $R^{b11}$ is preferably 1 to 10 and more preferably 1 to 3.

In the compound A, the weight-average molecular weight (Mw) of the repeating unit having a graft chain is preferably 1000 or higher, more preferably 1000 to 10000, and still more preferably 1000 to 7500. In the present invention, the weight-average molecular weight of the repeating unit having a graft chain is a value calculated from the weight-average molecular weight of a raw material monomer used for polymerization of the repeating unit. For example, the repeating unit having a graft chain can be formed by polymerization of a macromonomer. Here, the macromonomer refers to a polymer compound in which a polymerizable group is introduced into a polymer terminal. In a case where the repeating unit having a graft chain is formed using a macromonomer, the weight-average molecular weight of the macromonomer corresponds to that of the repeating unit having a graft chain.

It is preferable that the compound A includes a repeating unit having a radically polymerizable ethylenically unsaturated group and a repeating unit having a graft chain. In addition, in the compound A, the content of the repeating unit having a radically polymerizable ethylenically unsaturated group is preferably 10 to 80 mol % and more preferably 20 to 70 mol % with respect to all the repeating units of the compound A. In addition, in the compound A, the content of the repeating unit having a graft chain is preferably 1.0 to 60 mol % and more preferably 1.5 to 50 mol % with respect to all the repeating units of the compound A.

It is also preferable that the compound A further includes a repeating unit having an acid group. By the compound A further including the repeating unit having an acid group, the dispersibility of the light shielding material or the like can be further improved. Further, developability can also be improved. Examples of the acid group include a carboxyl group, a sulfo group, and a phosphate group.

Examples of the repeating unit having an acid group include a repeating unit represented by the following Formula (A-1-3).

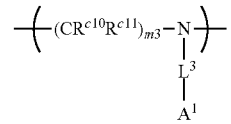

(A-1-3)

In Formula (A-1-3), $X^3$ represents a main chain of the repeating unit, $L^3$ represents a single bond or a divalent linking group, and $A^1$ represents an acid group.

Examples of the main chain of the repeating unit represented by $X^3$ in Formula (A-1-3) include the structures represented by $X^1$ in Formula (A-1-1), and preferable ranges thereof are the same.

Examples of the divalent linking group represented by $L^3$ in Formula (A-1-3) include an alkylene group (preferably an alkylene group having 1 to 12 carbon atoms), an alkenylene group (preferably an alkenylene group having 2 to 12 carbon atoms), an alkyleneoxy group (preferably an alkyleneoxy group having 1 to 12 carbon atoms), an oxyalkylenecarbonyl group (preferably an oxyalkylenecarbonyl group having 1 to 12 carbon atoms), an arylene group (preferably an arylene group having 6 to 20 carbon atoms), —NH—, —SO—, —SO$_2$—, —CO—, —O—, —COO—, OCO—, —S—, and a group including a combination of two or more of the above-described groups. The alkylene group, the alkylene group in the alkyleneoxy group, and the alkylene group in the oxyalkylenecarbonyl group may be linear, branched, or cyclic and is preferably linear or branched. In addition, the alkylene group, the alkylene group in the alkyleneoxy group, and the alkylene group in the oxyalkylenecarbonyl group may have a substituent or may be unsubstituted. Examples of the substituent include a hydroxyl group.

Examples of the acid group represented by $A^1$ in Formula (A-1-3) include a carboxyl group, a sulfo group, and a phosphate group.

Specific examples of the repeating unit represented by Formula (A-1-3) include a repeating unit represented by the following Formula (A-1-3a) and a repeating unit represented by the following Formula (A-1-3b).

(A-1-3a)

(A-1-3b)

In Formula (A-1-3a), $R^{c1}$ to $R^{c3}$ each independently represent a hydrogen atom or an alkyl group, $Q^c$ represents —CO—, —COO—, —OCO—, —CONH—, or a phenylene group, $L^3$ represents a single bond or a divalent linking group, and $A^1$ represents an acid group. The number of carbon atoms in the alkyl group represented by $R^{c1}$ to $R^{c3}$ is preferably 1 to 10, more preferably 1 to 3, and still more preferably 1. $Q^{c1}$ represents preferably —COO— or —CONH— and more preferably —COO—.

In Formula (A-1-3b), $R^{c10}$ and $R^{c11}$ each independently represent a hydrogen atom or an alkyl group, m3 represents an integer of 1 to 5, $L^3$ represents a single bond or a divalent linking group, and $A^1$ represents an acid group. The number of carbon atoms in the alkyl group represented by $R^{c10}$ and $R^{c11}$ is preferably 1 to 10 and more preferably 1 to 3.

As the repeating unit represented by Formula (A-1-3a), a repeating unit represented by the following Formula (A-1-3a-1) is more preferable.

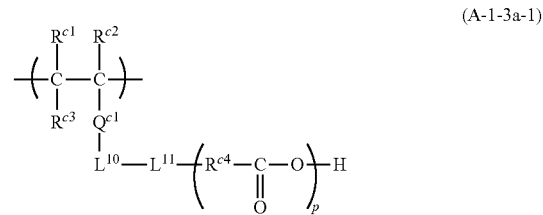

(A-1-3a-1)

In Formula (A-1-3a-1), Rd to $R^{c3}$ each independently represent a hydrogen atom or an alkyl group, $Q^{c1}$ represents —CO—, —COO—, —OCO—, —CONH—, or a phenylene group, $L^{10}$ represents a single bond or an alkylene group, $L^{11}$ represents a single bond, —O—, —S—, —NH—, —CO—, —OCO—, or —COO—, $R^{c4}$ represents an alkylene group or an arylene group, and p represents an integer of 0 to 5. In a case where p represents 0, $L^{11}$ represents —COO—, but $L^{10}$ and $L^{11}$ represent a single bond and $Q^{c1}$ represents —COO—.

In Formula (A-1-3a-1), the number of carbon atoms in the alkyl group represented by $R^{c1}$ to $R^{c3}$ is preferably 1 to 10, more preferably 1 to 3, and still more preferably 1. $Q^{c1}$ represents preferably —COO— or —CONH— and more preferably —COO—.

The number of carbon atoms in the alkylene group represented by L10 in Formula (A-1-3a-1) is preferably 1 to 10 and more preferably 1 to 5. The alkylene group may be linear, branched, or cyclic and is preferably linear or branched and more preferably linear. It is preferable that $L^{10}$ represents a single bond.

In Formula (A-1-3a-1), $L^{11}$ represents preferably a single bond or —OCO— and more preferably a single bond.

In Formula (A-1-3a-1), it is preferable that $R^{C4}$ represents an alkylene group. The number of carbon atoms in the alkylene group is preferably 1 to 12, more preferably 1 to 8, still more preferably 2 to 8, and still more preferably 2 to 6. The alkylene group represented by $R^{c4}$ may be linear, branched, or cyclic and is preferably linear or branched and more preferably linear.

In Formula (A-1-3a-1), p represents an integer of 0 to 5, preferably an integer of 0 to 3, and more preferably an integer of 0 to 2.

In a case where the compound A includes a repeating unit having an acid group, the content of the repeating unit having an acid group is preferably 80 mol % and more preferably 10 to 80 mol % with respect to all the repeating units of the compound A.

The acid value of the compound A is preferably 20 to 150 mgKOH/g. The upper limit is more preferably 100 mgKOH/g or lower. The lower limit is preferably 30 mgKOH/g or higher and more preferably 35 mgKOH/g or higher. In a case where the acid value of the compound A is in the above-described range, particularly excellent dispersibility can be easily obtained. Further, excellent developability can be easily obtained.

The compound A may further include other repeating units. For example, in a case where the compound A includes the repeating unit represented by Formula (A-1-2b) as the repeating unit having a graft chain, the compound A may further include a repeating unit represented by the following Formula (A-1-4b) and/or a repeating unit represented by the following Formula (A-1-5b).

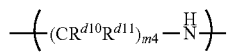

(A-1-4b)

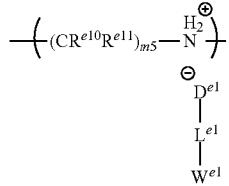

(A-1-5b)

In Formula (A-1-4b), $R^{d10}$ and $R^{d11}$ each independently represent a hydrogen atom or an alkyl group, and m4 represents an integer of 1 to 5. The number of carbon atoms in the alkyl group represented by $R^{d10}$ and $R^{d11}$ is preferably 1 to 10 and more preferably 1 to 3.

In Formula (A-1-5b), $R^{e10}$ and $R^{e11}$ each independently represent a hydrogen atom or an alkyl group, m5 represents an integer of 1 to 5, $D^{e1}$ represents an anionic group, $L^{e1}$ represents a single bond or a divalent linking group, and $W^{e1}$ represents a graft chain. The number of carbon atoms in the alkyl group represented by $R^{e10}$ and $R^{e11}$ is preferably 1 to 10 and more preferably 1 to 3. Examples of the anionic group represented by $D^{e1}$ include —$SO_3$—, —COO—, —$PO_4$—, and —$PO_4H$—. Examples of the divalent linking group represented by $L^{e1}$ and the graft chain represented by $W^{e1}$ are the same as described above regarding $L^2$ and $W^1$ in Formula (A-1-2).

Specific examples of the compound A are as follows.

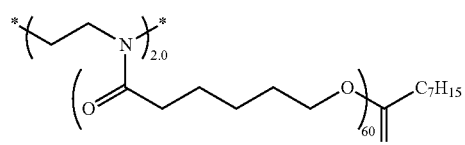

P-1

Molecular Weight: 7019.69

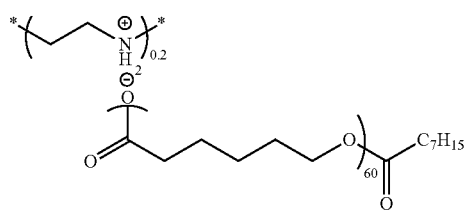

Molecular Weight: 22000

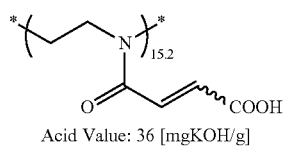

Acid Value: 36 [mgKOH/g]

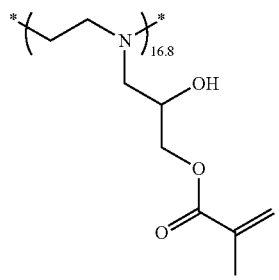 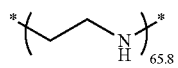

C═C Value: 0.7 [mmol/g]

P-2

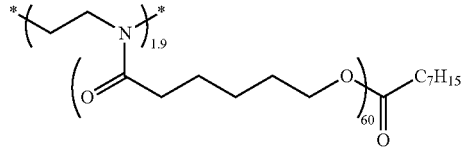

Molecular Weight: 7019.69

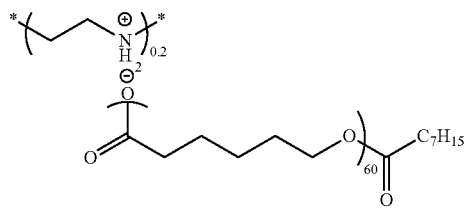

Molecular Weight: 21000

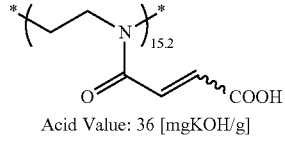

Acid Value: 36 [mgKOH/g]

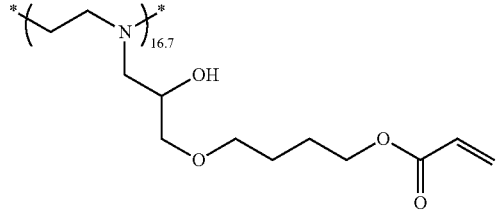

C═C Value: 0.7 [mmol/g]

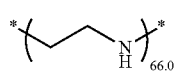

21
-continued
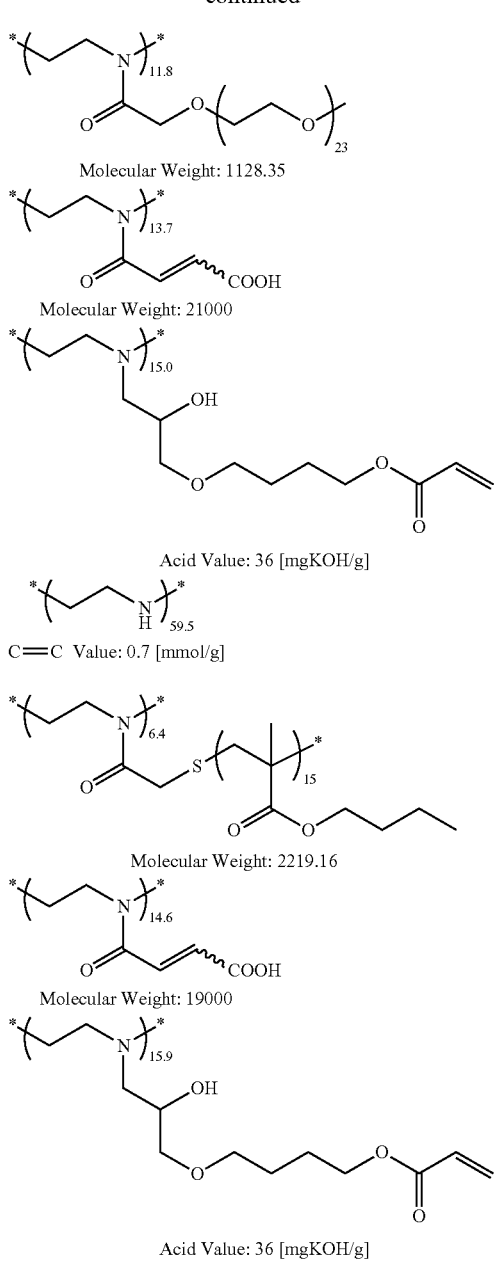
22
-continued
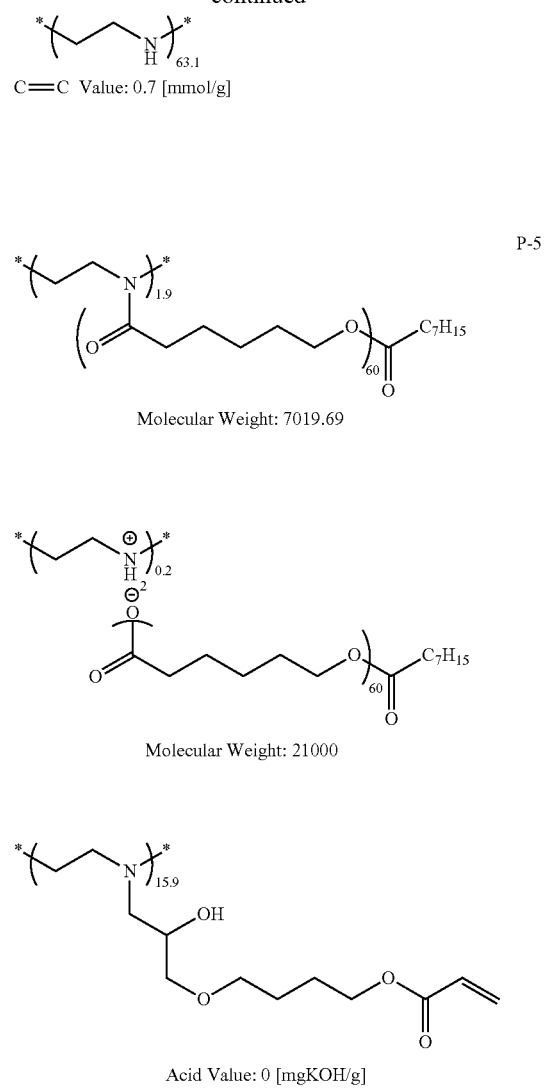
TABLE 1
| Structure of Compound A |
| --- |
| A-1-1 |
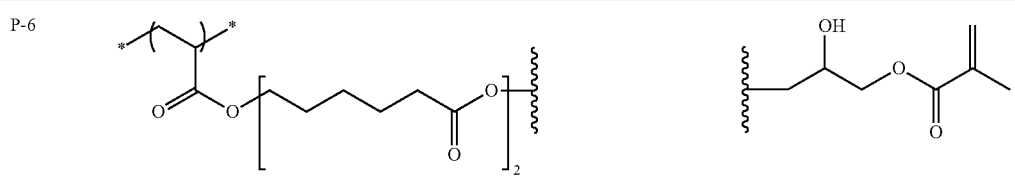
| | C=C Group Structure |
| --- | --- |

TABLE 1-continued
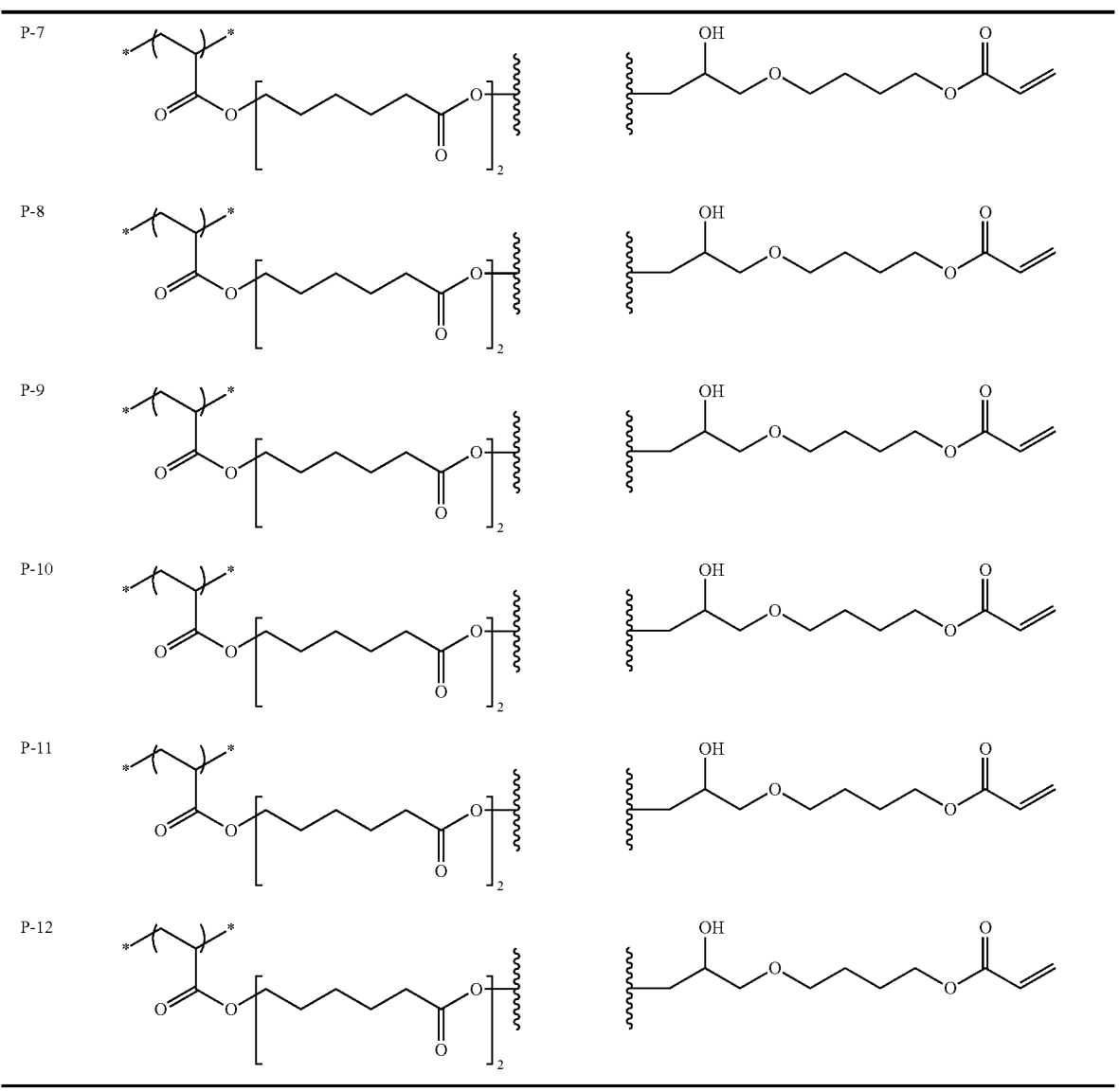
Structure of Compound A
A-1-2
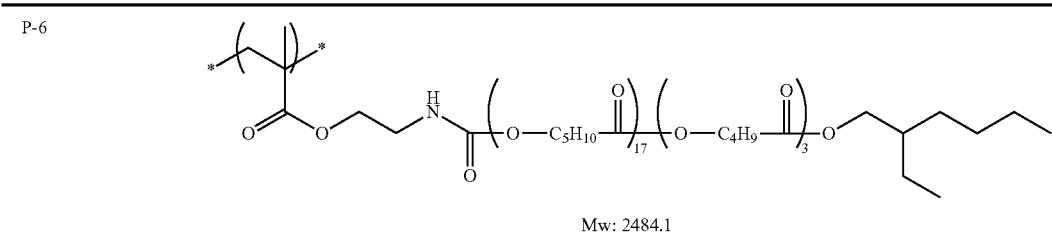
Mw: 2484.1
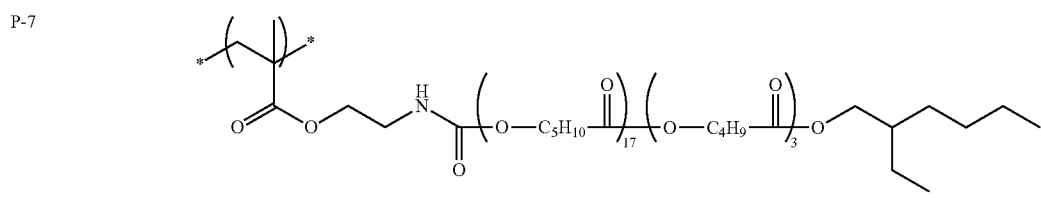
Mw: 2484.1

TABLE 1-continued
P-8 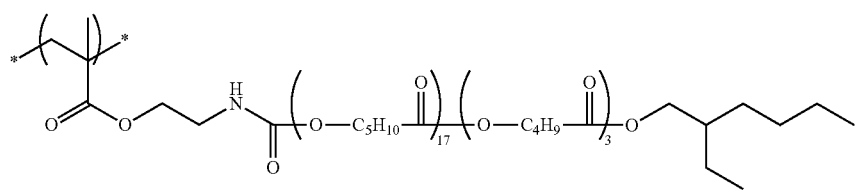
Mw: 2484.1
P-9 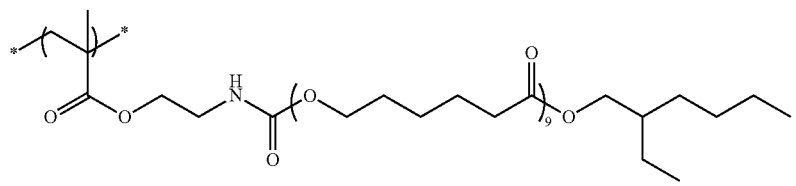
Mw: 1270.62
P-10 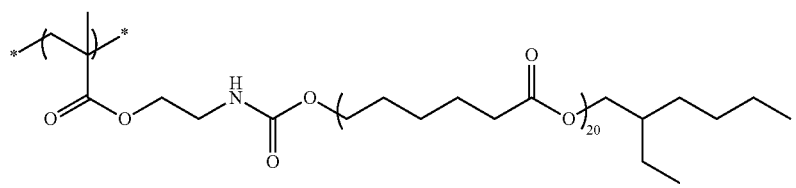
Mw: 2526.16
P-11 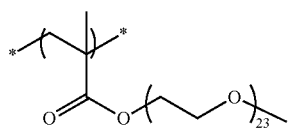
Mw: 1113.34
P-12 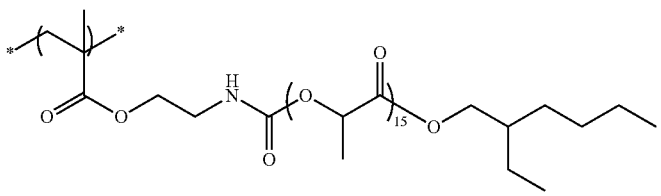
Mw: 1324.26
| | Structure of Compound A | Properties of Compound A | | | Molar Ratio [mol %] of Compound A | | |
|---|---|---|---|---|---|---|---|
| | A-1-3 | Mw | Acid Value [mgKOH/g] | C=C Value [mmol/g] | A-1-1 | A-1-2 | A-1-3 |
| P-6 | 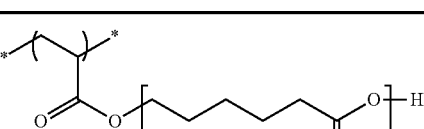 | 22000 | 78 | 0.7 | 32% | 5% | 63% |
| P-7 | 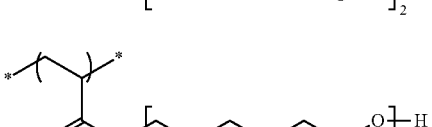 | 18000 | 78 | 0.7 | 32% | 4% | 64% |

TABLE 1-continued

| | | | | | | | |
|---|---|---|---|---|---|---|---|
| P-8 | (structure) | 20000 | 78 | 0.47 | 25% | 9% | 67% |
| P-9 | (structure) | 19000 | 78 | 0.7 | 32% | 10% | 58% |
| P-10 | (structure) | 21000 | 78 | 0.7 | 34% | 5% | 61% |
| P-11 | (structure) | 18000 | 78 | 0.7 | 32% | 11% | 57% |
| P-12 | (structure) | 17000 | 78 | 0.7 | 32% | 10% | 58% |

TABLE 2

| | Structure of Compound A A-1-1 | |
|---|---|---|
| | | C=C Group Structure |
| P-13 | (structure) | (structure) |
| P-14 | (structure) | (structure) |
| P-15 | (structure) | (structure) |

TABLE 2-continued
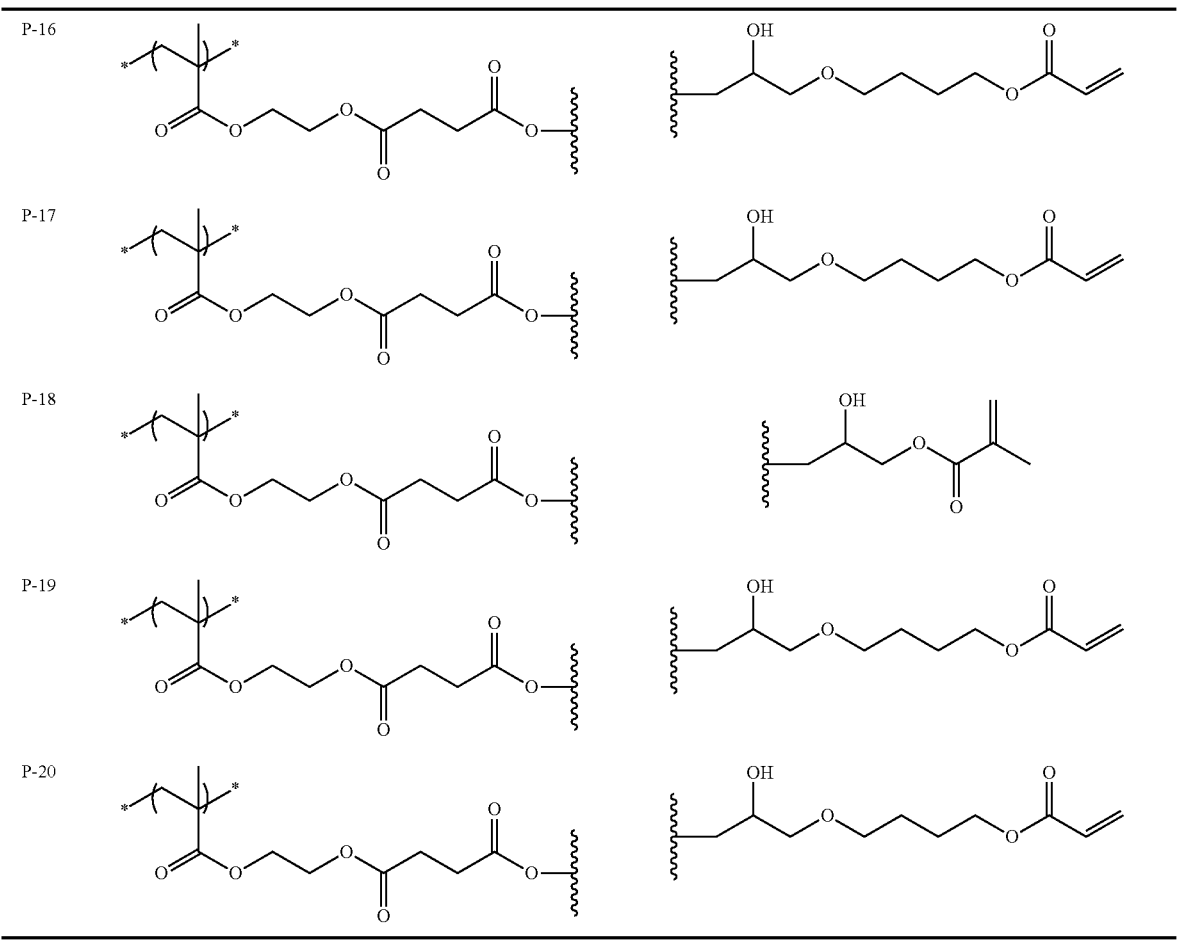
Structure of Compound A
A-1-2
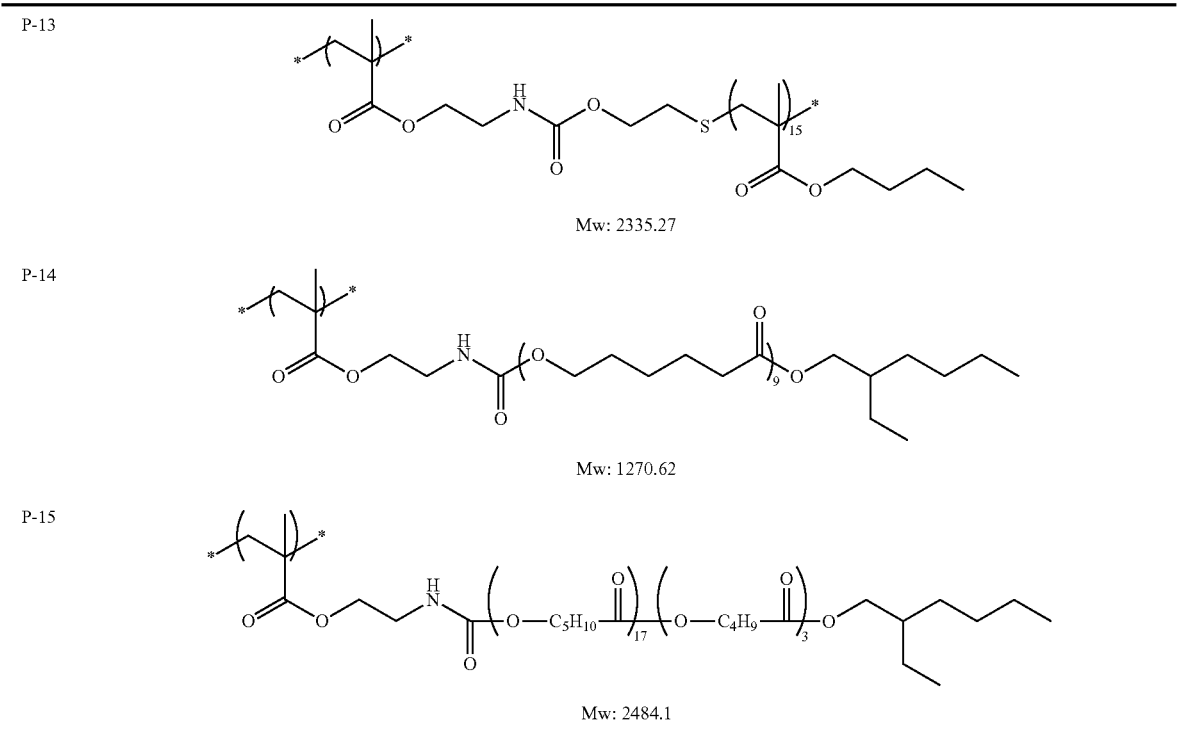

TABLE 2-continued
P-16
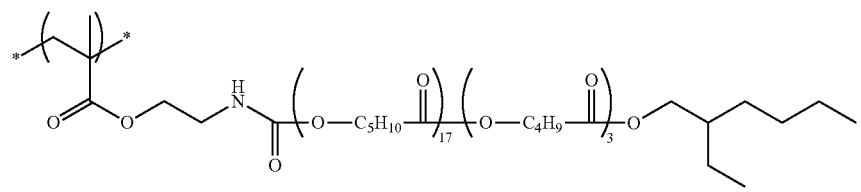
Mw: 2484.1
P-17
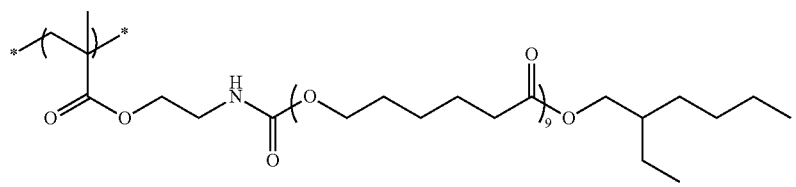
Mw: 1270.62
P-18
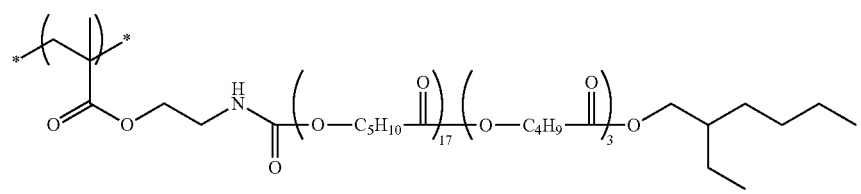
Mw: 2484.1
P-19
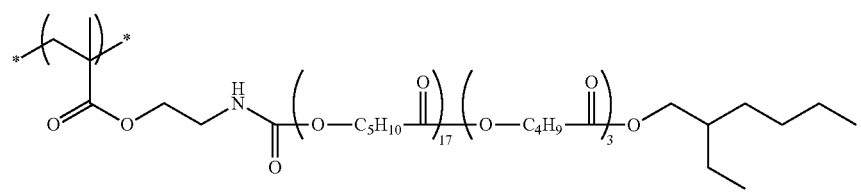
Mw: 2484.1
P-20
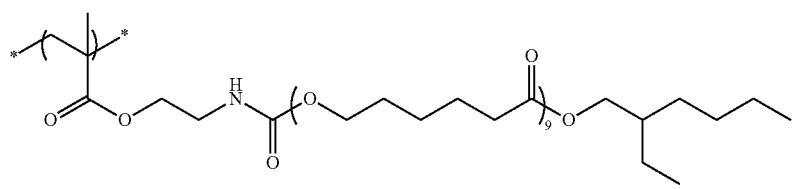
Mw: 1270.62
| | Structure of Compound A | Properties of Compound A | | | Molar Ratio [mol %] of Compound A | | |
|---|---|---|---|---|---|---|---|
| | A-1-3 | Mw | Acid Value [mgKOH/g] | C=C Value [mmol/g] | A-1-1 | A-1-2 | A-1-3 |
| P-13 | 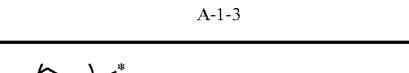 | 23000 | 78 | 0.7 | 32% | 5% | 64% |
| P-14 | None | 18000 | Zero | 0.7 | 58% | 42% | 0% |

TABLE 2-continued

| | Structure | Mw | | | | | |
|---|---|---|---|---|---|---|---|
| P-15 | (structure with ester linkages and terminal COOH) | 21000 | 78 | 0.7 | 31% | 7% | 62% |
| P-16 | (structure with ester linkages and terminal COOH) | 22000 | 78 | 0.7 | 31% | 7% | 62% |
| P-17 | (structure with ester linkages and terminal COOH) | 19000 | 78 | 0.7 | 29% | 13% | 58% |
| P-18 | (structure with ester linkages and terminal COOH) | 20000 | 78 | 0.7 | 31% | 7% | 62% |
| P-19 | (structure with ester linkages and terminal COOH) | 21000 | 78 | 0.7 | 31% | 7% | 62% |
| P-20 | (structure with ester linkages and terminal COOH) | 20000 | 78 | 0.7 | 29% | 13% | 58% |

TABLE 3

| | Structure of Compound A A-1-1 | C=C Group Structure |
|---|---|---|
| P-21 | (polymer structure with ester linkages) | (structure with OH and methacrylate group) |
| P-22 | (polymer structure with ester linkages) | (structure with OH, ether, and acrylate group) |

TABLE 3-continued
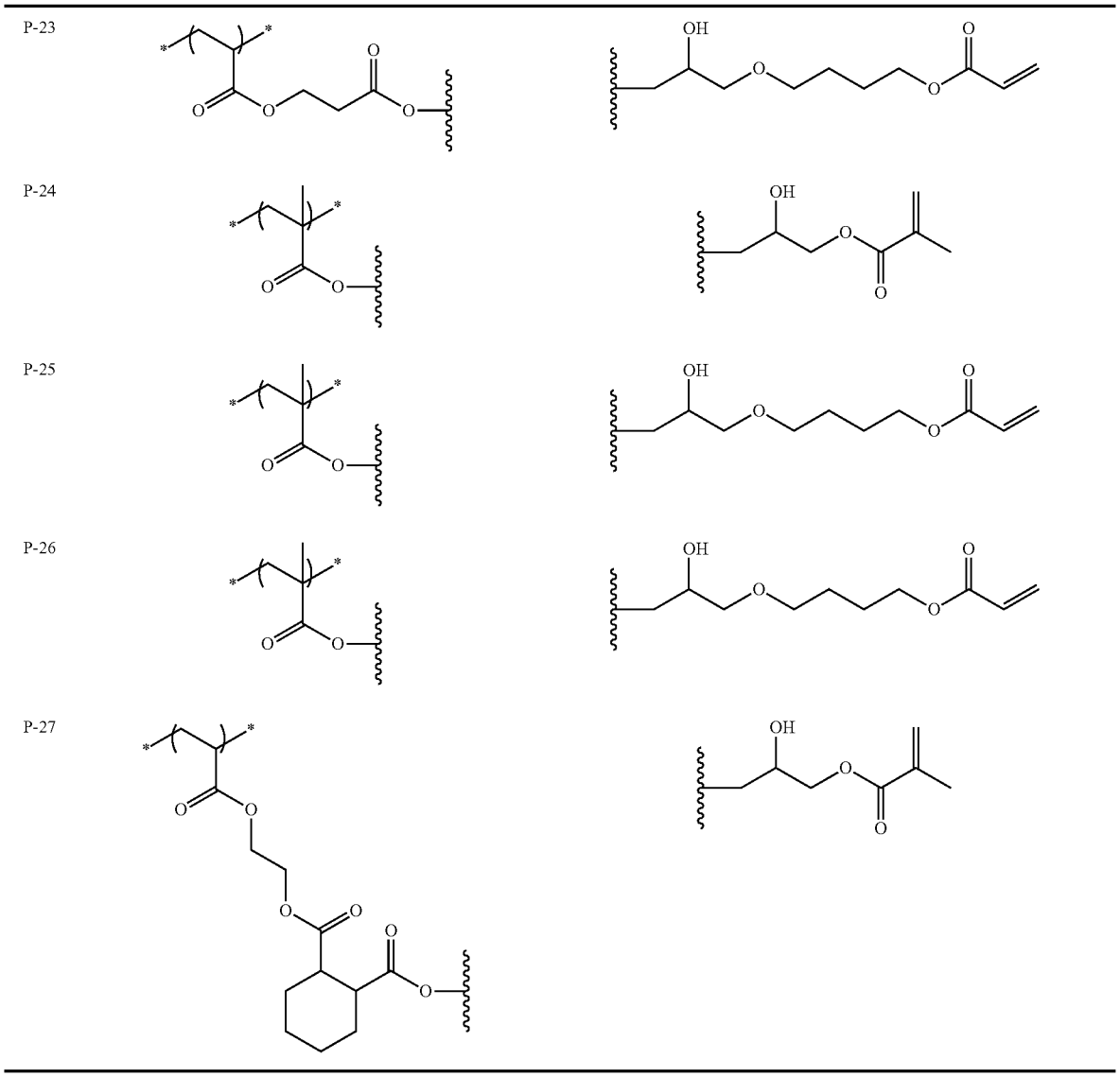
| | Structure of Compound A |
| --- | --- |
| | A-1-2 |
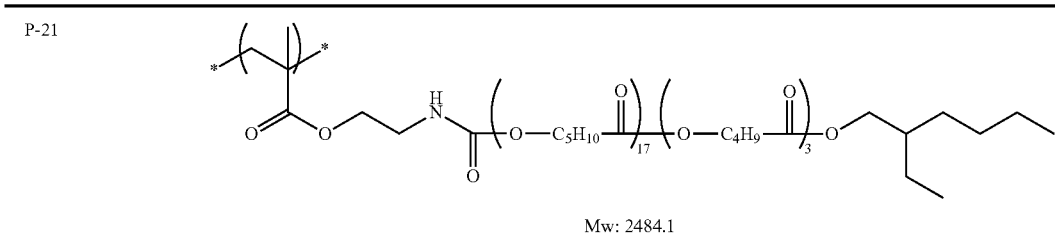
Mw: 2484.1
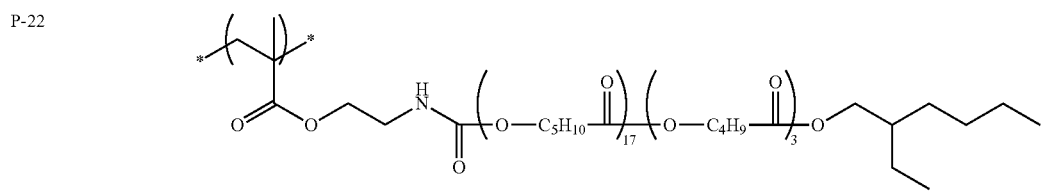
Mw: 2484.1

TABLE 3-continued
P-23 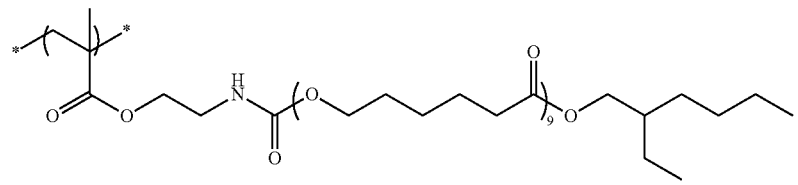
Mw: 1270.62
P-24 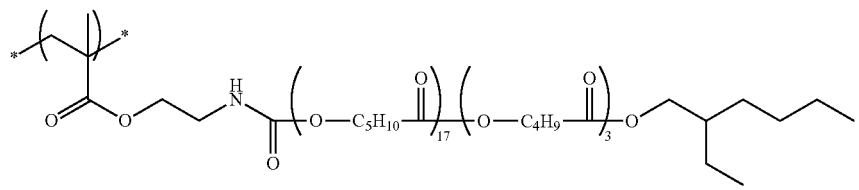
Mw: 2484.1
P-25 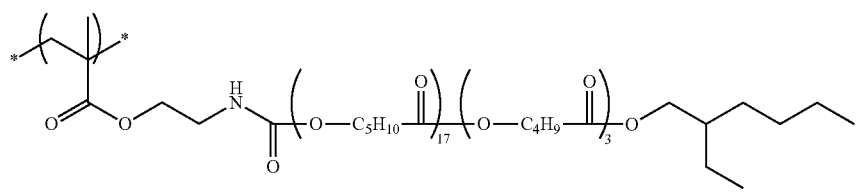
Mw: 2484.1
P-26 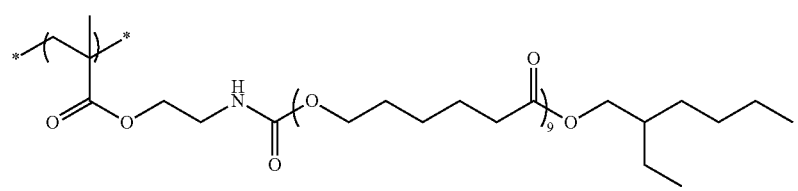
Mw: 1270.62
P-27 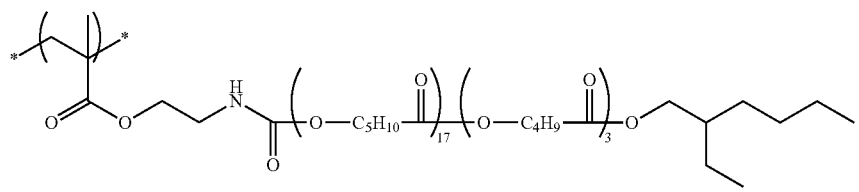
Mw: 2484.1
|  | Structure of Compound A A-1-3 | Properties of Compound A | | | Molar Ratio [mol %] of Compound A | | |
|---|---|---|---|---|---|---|---|
|  |  | Mw | Acid Value [mgKOH/g] | C=C Value [mmol/g] | A-1-1 | A-1-2 | A-1-3 |
| P-21 | 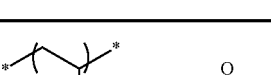 | 22000 | 78 | 0.7 | 30% | 10% | 60% |
| P-22 | 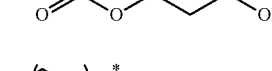 | 20000 | 78 | 0.7 | 30% | 10% | 60% |

TABLE 3-continued
| P-23 | (structure: *-CH2-C(CH3)(*)-C(=O)-O-CH2CH2-C(=O)-OH) | 21000 | 78 | 0.7 | 28% | 17% | 55% |
| P-24 | (structure: *-CH2-C(CH3)(*)-C(=O)-OH) | 18000 | 78 | 0.7 | 31% | 13% | 56% |
| P-25 | (structure: *-CH2-CH(*)-C(=O)-OH) | 21000 | 78 | 0.7 | 31% | 13% | 56% |
| P-26 | (structure: *-CH2-C(CH3)(*)-C(=O)-OH) | 22000 | 78 | 0.7 | 28% | 22% | 50% |
| P-27 | (structure: *-CH2-CH(*)-C(=O)-O-CH2CH2-O-C(=O)-cyclohexane-C(=O)-OH) | 20000 | 78 | 0.7 | 32% | 6% | 62% |
TABLE 4
| | Structure of Compound A | |
| --- | --- | --- |
| | A-1-1 | |
| | | C=C Group Structure |
| P-28 | 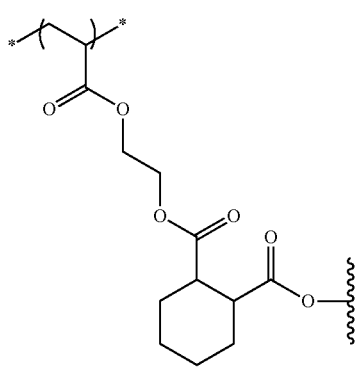 | (structure: ~-CH2-CH(OH)-CH2-O-(CH2)4-O-C(=O)-CH=CH2) |

TABLE 4-continued
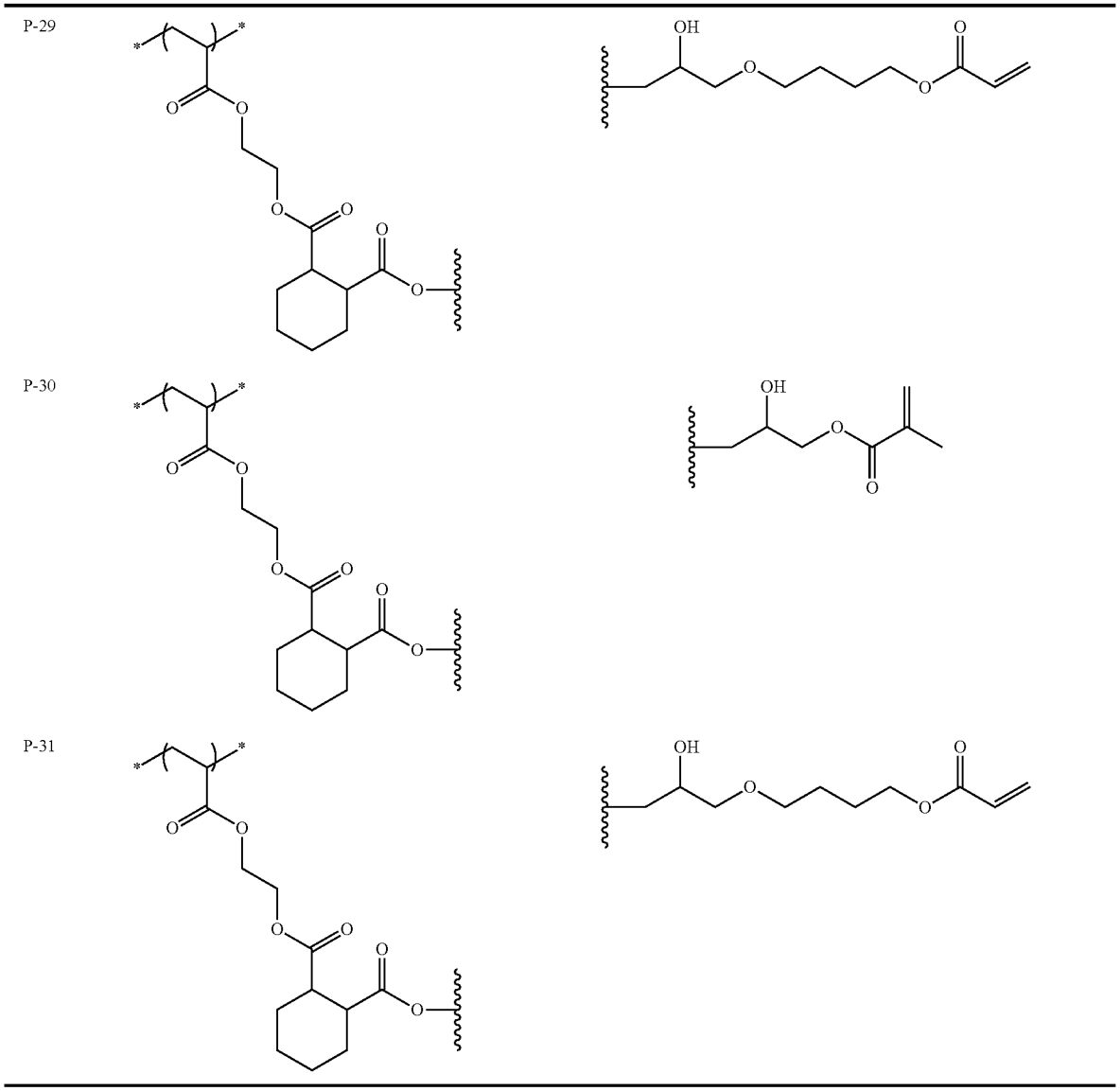
| | Structure of Compound A |
| --- | --- |
| | A-1-2 |
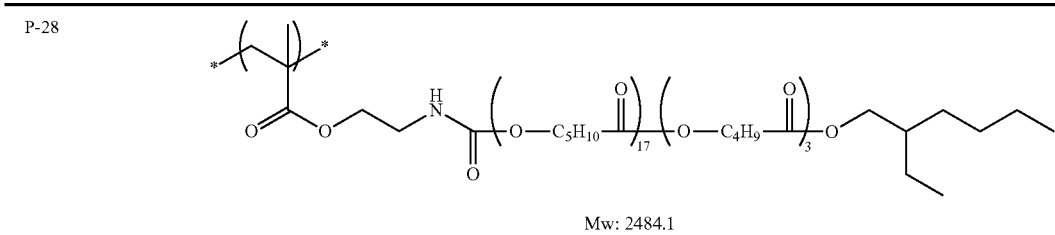
Mw: 2484.1
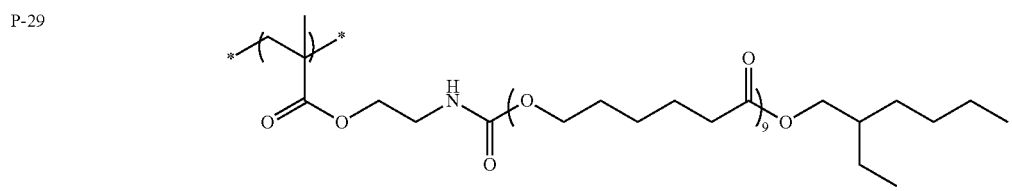
Mw: 1270.62

TABLE 4-continued
P-30
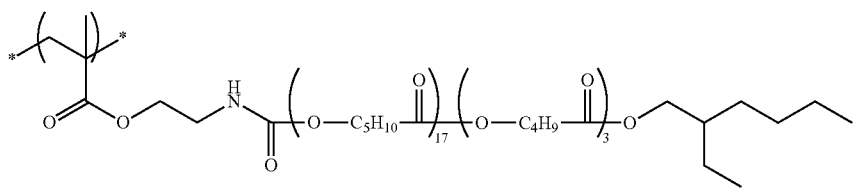
Mw: 2484.1
P-31
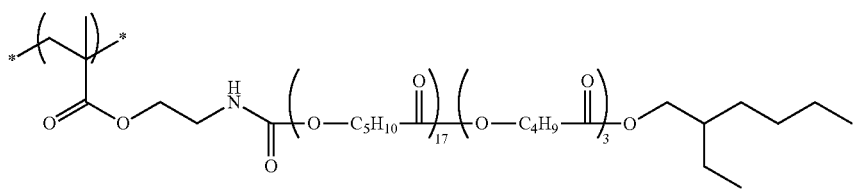
Mw: 2484.1
|  | | Properties of Compound A | | | | |
|---|---|---|---|---|---|---|
| Structure of Compound A | | Acid Value | C=C Value | Molar Ratio [mol %] of Compound A | | |
| A-1-3 | Mw | [mgKOH/g] | [mmol/g] | A-1-1 | A-1-2 | A-1-3 |
| P-28 | 21000 | 78 | 0.7 | 32% | 5% | 63% |
| P-29 | 20000 | 78 | 0.7 | 30% | 10% | 60% |

TABLE 4-continued
| | | | | | | | |
|---|---|---|---|---|---|---|---|
| P-30 | 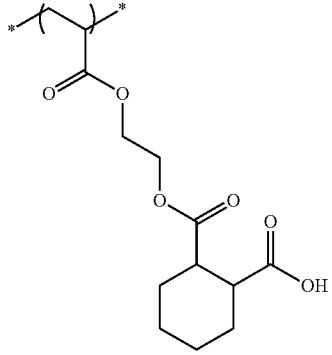 | 23000 | 78 | 0.7 | 32% | 6% | 62% |
| P-31 | 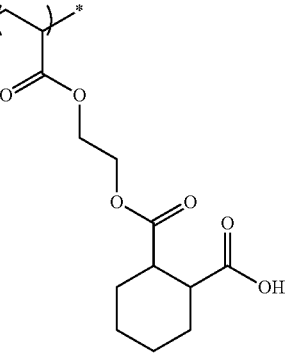 | 22000 | 78 | 0.7 | 32% | 6% | 62% |
TABLE 5
| | Structure of Compound A | |
|---|---|---|
| | A-1-1 | |
| | | C=C Group Structure |
| P-32 | 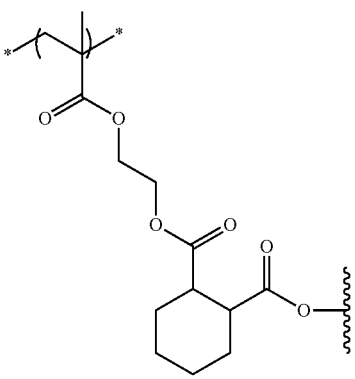 | 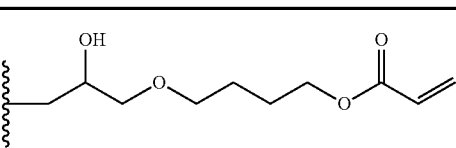 |

TABLE 5-continued
| P-33 | 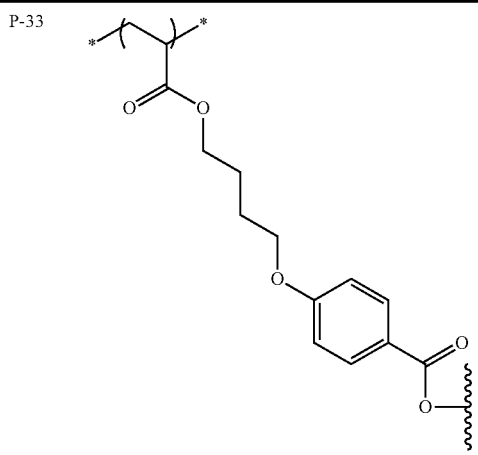 | 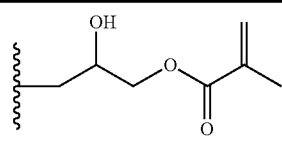 |
| --- | --- | --- |
| P-34 | 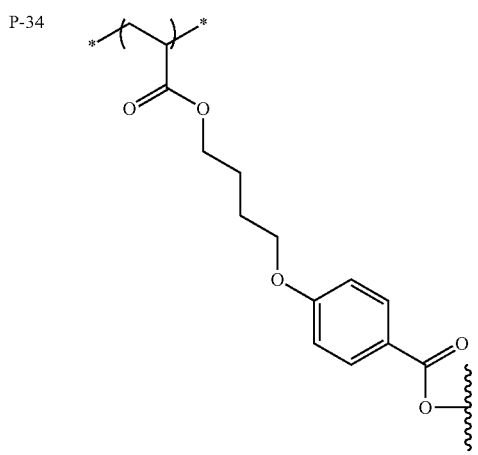 | 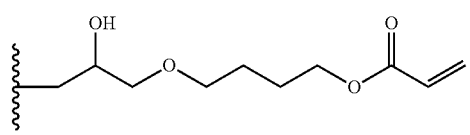 [SMILES: *CC(O)COCCCCOC(=O)C=C] |
| P-35 | 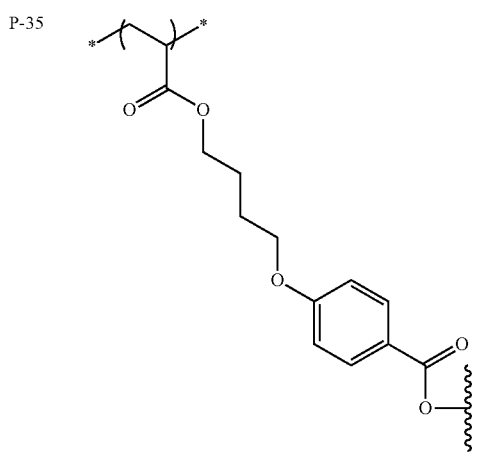 | 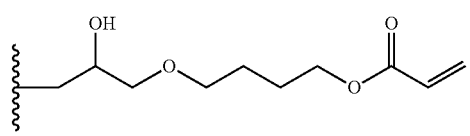 [SMILES: *CC(O)COCCCCOC(=O)C=C] |
Structure of Compound A
A-1-2
P-32
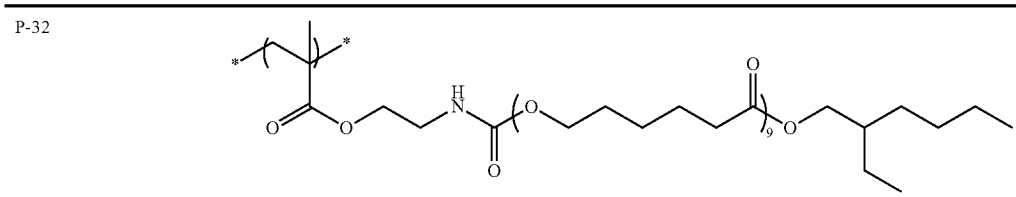
Mw: 1270.62

TABLE 5-continued
P-33
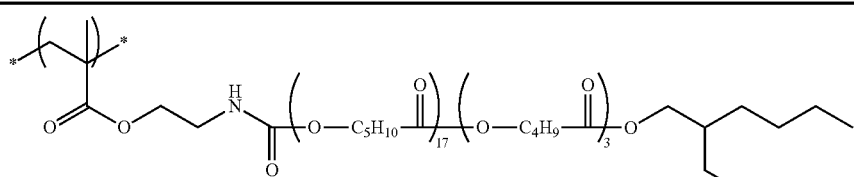
Mw: 2484.1
P-34
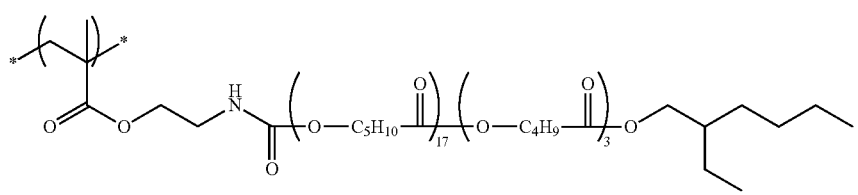
Mw: 2484.1
P-35
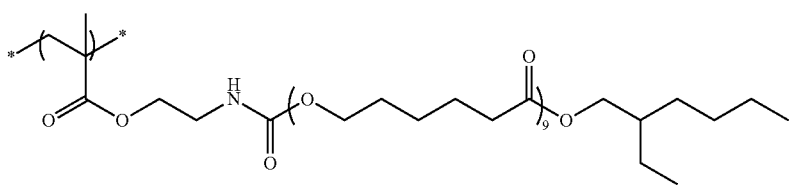
Mw: 1270.62
| | | Properties of Compound A | | | | |
|---|---|---|---|---|---|---|
| Structure of Compound A | | Acid Value | C=C Value | Molar Ratio [mol %] of Compound A | | |
| A-1-3 | Mw | [mgKOH/g] | [mmol/g] | A-1-1 | A-1-2 | A-1-3 |
| P-32 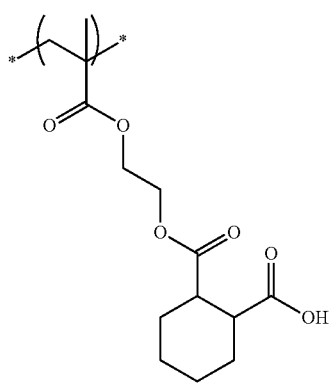 | 19000 | 78 | 0.7 | 31% | 9% | 60% |
| P-33 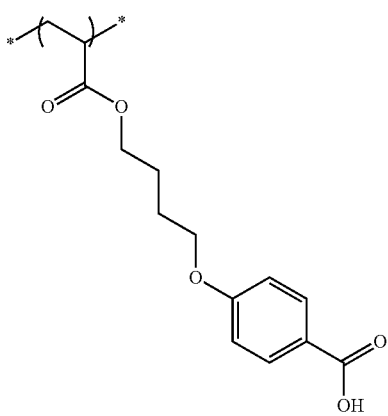 | 21000 | 78 | 0.7 | 31% | 6% | 62% |

TABLE 5-continued

| | Structure | Mw | | | | | |
|---|---|---|---|---|---|---|---|
| P-34 | [structure: polymer backbone with -C(=O)O-(CH₂)₄-O-C₆H₄-COOH side chain] | 22000 | 78 | 0.7 | 32% | 6% | 63% |
| P-35 | [structure: polymer backbone with -C(=O)O-(CH₂)₄-O-C₆H₄-COOH side chain] | 20000 | 78 | 0.7 | 30% | 10% | 60% |

TABLE 6

| Structure of Compound A |
|---|
| A-1-1 |

| | | C=C Group Structure |
|---|---|---|
| P-36 | [structure: polymer backbone with -C(=O)O-CH₂CH₂-O-C(=O)-C₆H₄-C(=O)O- side chain] | [structure: -CH₂-CH(OH)-CH₂-O-C(=O)-C(CH₃)=CH₂] |

TABLE 6-continued
| | | |
|---|---|---|
| P-37 | 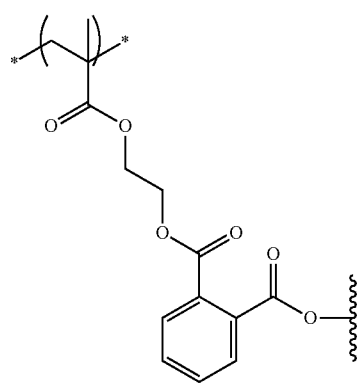 | 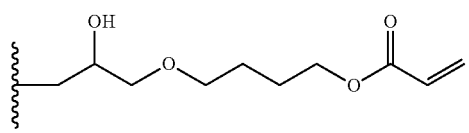 [SMILES: *CC(O)COCCCCOC(=O)C=C] |
| P-38 | 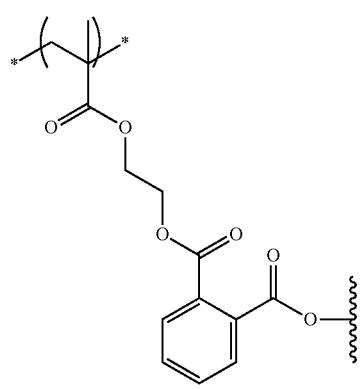 | 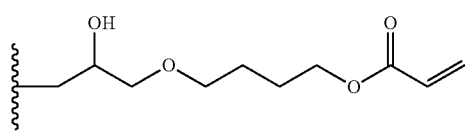 [SMILES: *CC(O)COCCCCOC(=O)C=C] |
| P-39 | 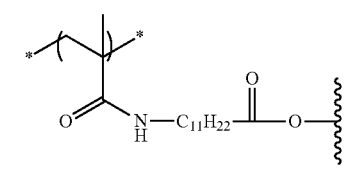 | 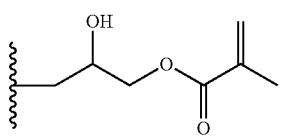 [SMILES: *CC(O)COC(=O)C(=C)C] |
| P-40 | 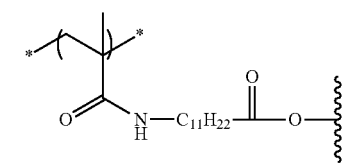 | 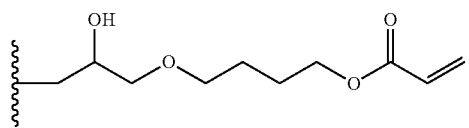 [SMILES: *CC(O)COCCCCOC(=O)C=C] |
| P-41 | 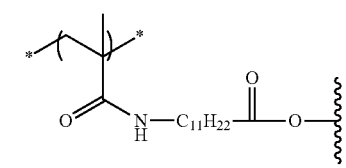 | 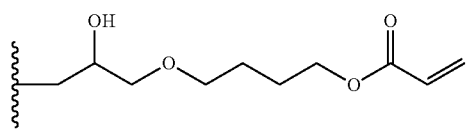 [SMILES: *CC(O)COCCCCOC(=O)C=C] |
Structure of Compound A
A-1-2
P-36
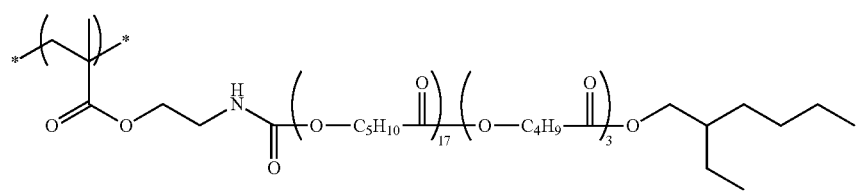
Mw: 2484.1

TABLE 6-continued
P-37
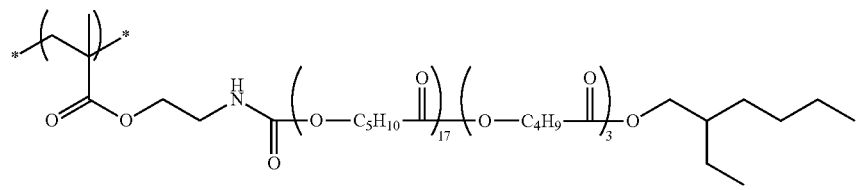
Mw: 2484.1
P-38
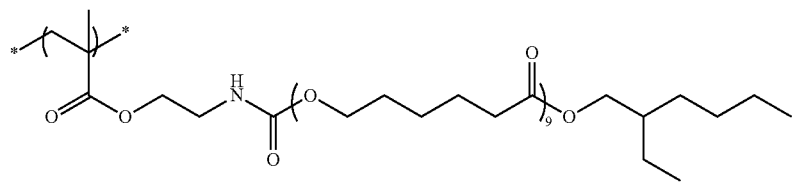
Mw: 1270.62
P-39
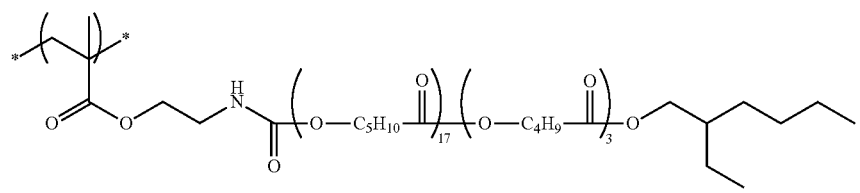
Mw: 2484.1
P-40
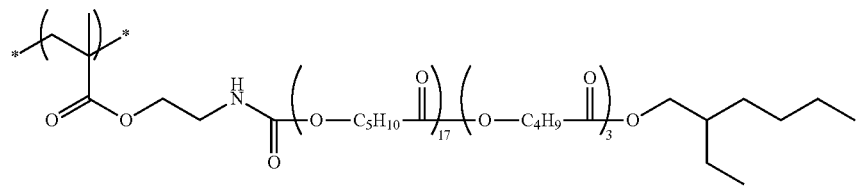
Mw: 2484.1
P-41
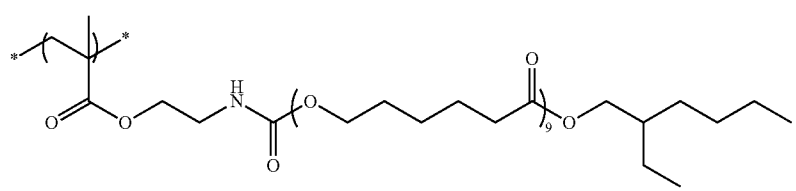
Mw: 1270.62

TABLE 6-continued

| | Structure of Compound A A-1-3 | Properties of Compound A | | | Molar Ratio [mol %] of Compound A | | |
|---|---|---|---|---|---|---|---|
| | | Mw | Acid Value [mgKOH/g] | C=C Value [mmol/g] | A-1-1 | A-1-2 | A-1-3 |
| P-36 | (structure) | 21000 | 78 | 0.7 | 32% | 6% | 62% |
| P-37 | (structure) | 20000 | 78 | 0.7 | 32% | 5% | 63% |
| P-38 | (structure) | 19000 | 78 | 0.7 | 30% | 10% | 60% |
| P-39 | (structure) | 20000 | 78 | 0.7 | 32% | 6% | 63% |
| P-40 | (structure) | 21000 | 78 | 0.7 | 32% | 5% | 63% |

TABLE 6-continued
| P-41 | 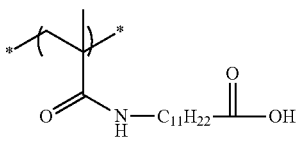 | 18000 | 78 | 0.7 | 30% | 9% | 60% |
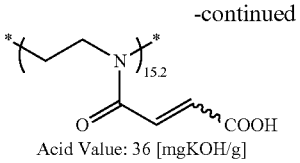
Molecular Weight: 7019.69
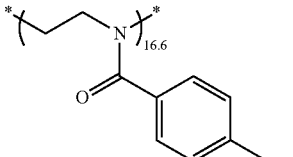
Molecular Weight: 20000
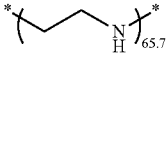
Acid Value: 36 [mgKOH/g]
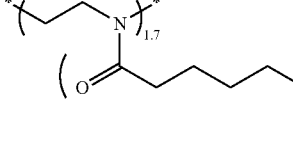
C═C Value: 0.7 [mmol/g]
P-43
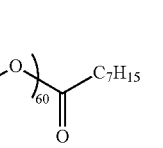
Molecular Weight: 7019.69
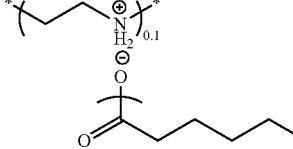
Molecular Weight: 19000
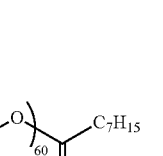
Acid Value: 36 [mgKOH/g]
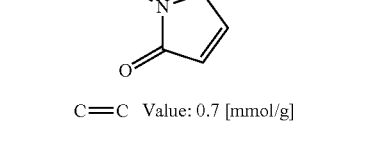
C═C Value: 0.7 [mmol/g]
P-44
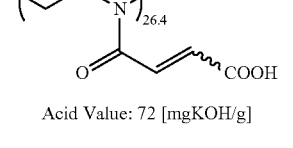
Molecular Weight: 7019.69
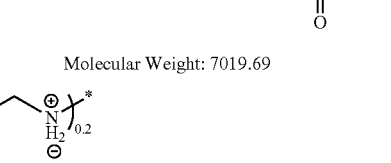
Molecular Weight: 22000
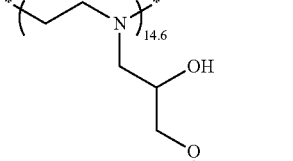
Acid Value: 72 [mgKOH/g]
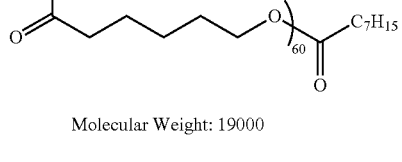
C═C Value: 0.7 [mmol/g]

-continued
P-45
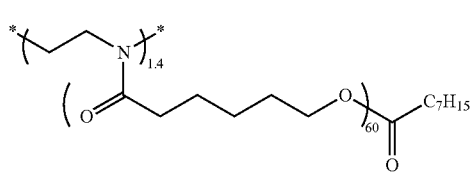
Molecular Weight: 7019.69
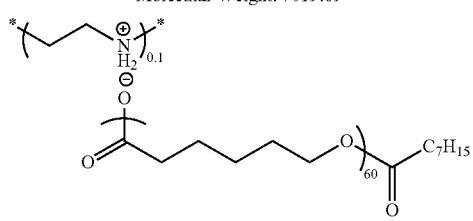
Molecular Weight: 21000
-continued
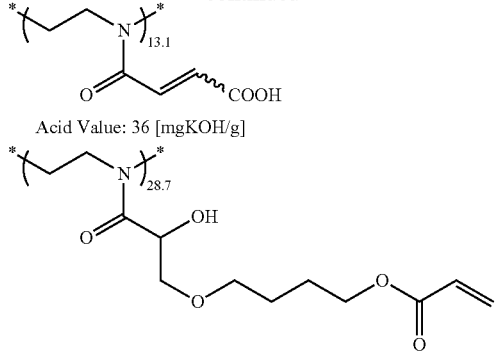
Acid Value: 36 [mgKOH/g]
C=C Value: 1.4 [mmol/g]
TABLE 7
Structure of Compound A
A-1-1
| | | C=C Group Structure |
|---|---|---|
| P-46 | 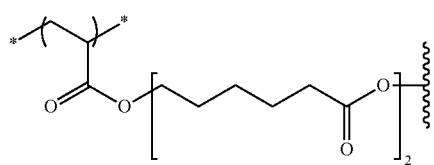 | 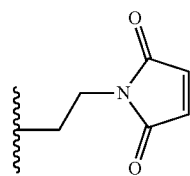 [SMILES: *CCN1C(=O)C=CC1=O] |
| P-47 | 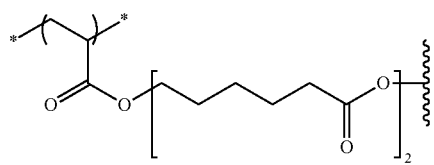 | 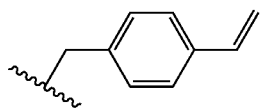 |
| P-48 | 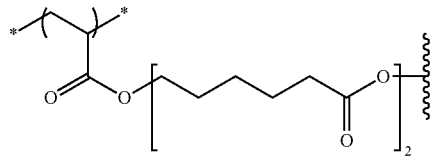 | 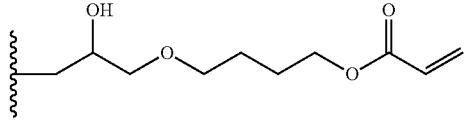 [SMILES: *CC(O)COCCCCOC(=O)C=C] |
| P-49 | 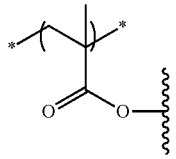 | 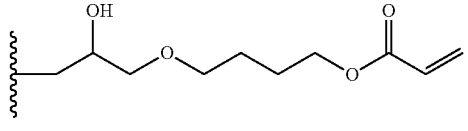 [SMILES: *CC(O)COCCCCOC(=O)C=C] |
| P-50 | 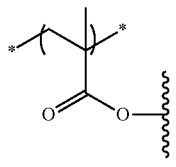 | 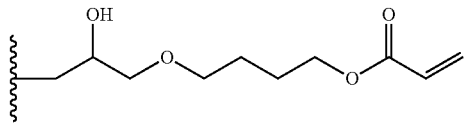 [SMILES: *CC(O)COCCCCOC(=O)C=C] |

TABLE 7-continued
| | | |
|---|---|---|
| P-51 | 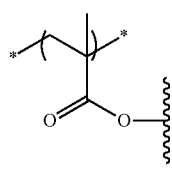 | 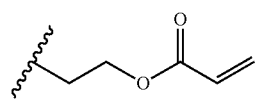 |
| P-52 | 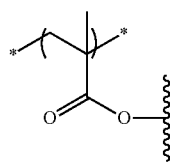 | 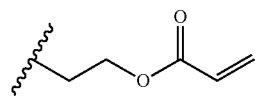 [SMILES: *CCOC(=O)C=C] |
| P-53 | 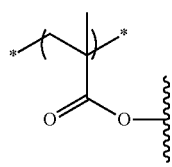 | 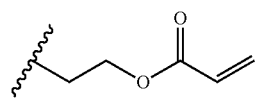 [SMILES: *CCOC(=O)C=C] |
Structure of Compound A
A-1-2
P-46
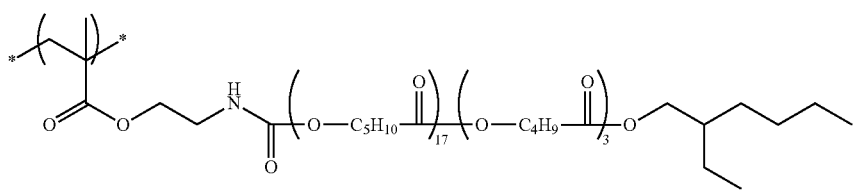
Mw: 2484.1
P-47
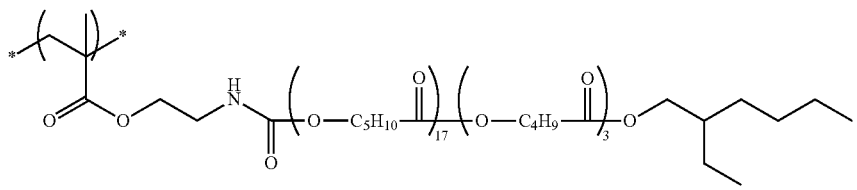
Mw: 2484.1
P-48
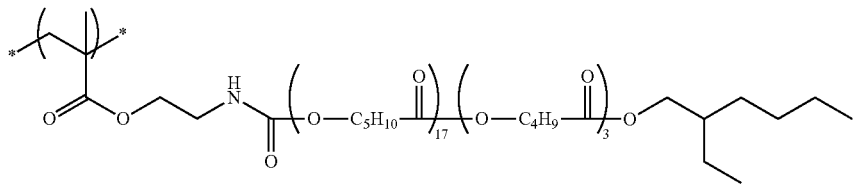
Mw: 2484.1
P-49
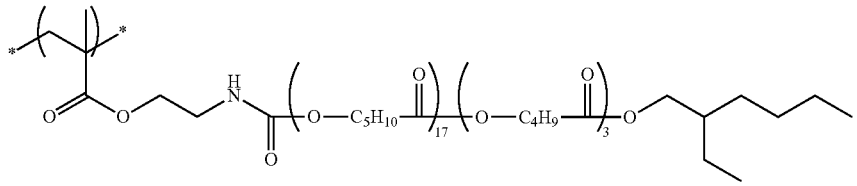
Mw: 2484.1

TABLE 7-continued
P-50 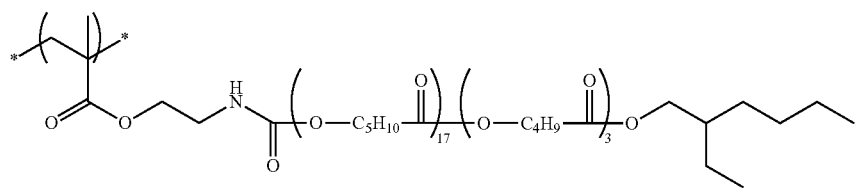
Mw: 2484.1
P-51 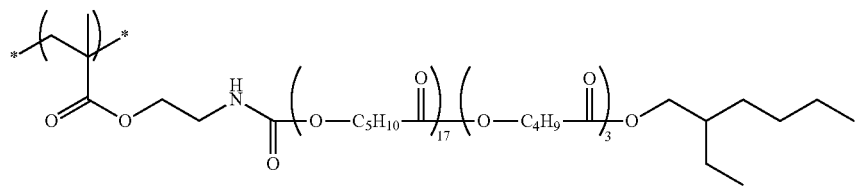
Mw: 2484.1
P-52 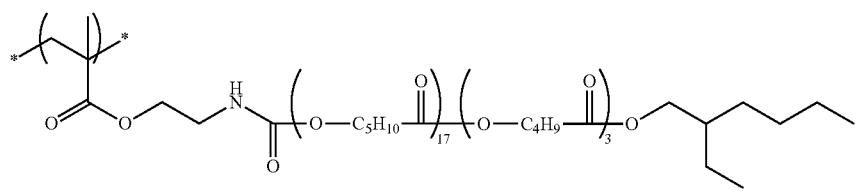
Mw: 2484.1
P-53 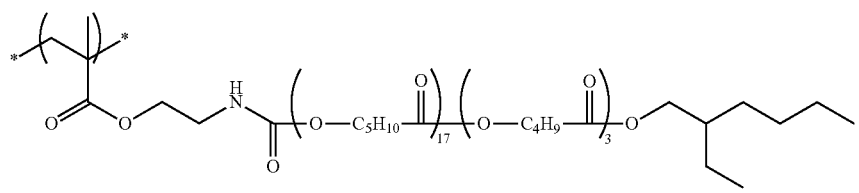
Mw: 2484.1
| | Structure of Compound A A-1-3 | Properties of Compound A | | | Molar Ratio [mol %] of Compound A | | |
|---|---|---|---|---|---|---|---|
| | | Mw | Acid Value [mgKOH/g] | C=C Value [mmol/g] | A-1-1 | A-1-2 | A-1-3 |
| P-46 | 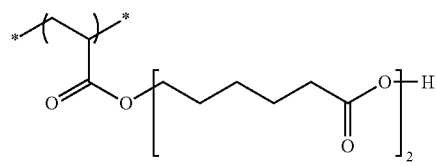 | 21000 | 78 | 0.7 | 32% | 5% | 63% |
| P-47 | 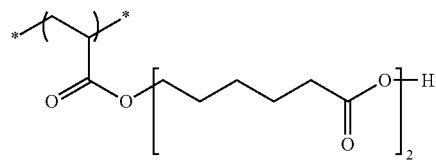 | 18000 | 78 | 0.7 | 32% | 5% | 63% |
| P-48 | 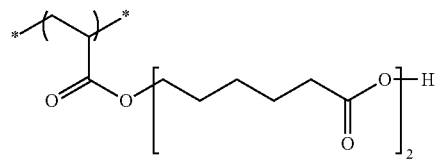 | 22000 | 24 | 0.7 | 52% | 16% | 32% |

TABLE 7-continued

| ID | Structure | | | | | |
|---|---|---|---|---|---|---|
| P-49 | [polymer with -C(=O)-OH side chain] | 21000 | 104 | 0.47 | 25% | 9% | 66% |
| P-50 | [polymer with -C(=O)-OH side chain] | 20000 | 156 | 0.7 | 19% | 6% | 75% |
| P-51 | [polymer with -C(=O)-O-(CH2)5-C(=O)-O-]2-H side chain] | 22000 | 78 | 1.4 | 48% | 5% | 47% |
| P-52 | [polymer with -C(=O)-O-(CH2)5-C(=O)-O-]2-H side chain] | 18000 | 78 | 2.1 | 58% | 2% | 39% |
| P-53 | [polymer with -C(=O)-OH side chain] | 18000 | 78 | 3.0 | 67% | 3% | 31% |

In the composition according to the embodiment of the present invention, the content of the compound A is preferably 5 to 50 mass % with respect to the total solid content of the composition. The lower limit is 7 mass % or higher and more preferably 10 mass % or higher. The upper limit is 40 mass % or lower and more preferably 30 mass % or lower.

<<Near Infrared Absorber>>

The composition according to the embodiment of the present invention can include a near infrared absorber. In the infrared transmitting filter, the near infrared absorber has a function of limiting light to be transmitted (near infrared light) to a longer wavelength side.

In the present invention, as the near infrared absorber, a compound having an absorption maximum in an infrared range (preferably a wavelength range of longer than 700 nm and 1300 nm or shorter) can be preferably used. As the near infrared absorber, a pigment or a dye may be used.

In the present invention, as the near infrared absorber, a near infrared absorbing compound that includes a i-conjugated plane having a monocyclic or fused aromatic ring can be preferably used. The number of atoms constituting the i-conjugated plane included in the near infrared absorbing compound other than hydrogen is preferably 14 or more, more preferably 20 or more, still more preferably 25 or more, and still more preferably 30 or more. For example, the upper limit is preferably 80 or less and more preferably 50 or less.

The number of monocyclic or fused aromatic rings in the i-conjugated plane included in the near infrared absorbing compound is preferably 2 or more, more preferably 3 or more, still more preferably 4 or more, and still more preferably 5 or more. The upper limit is preferably 100 or less, more preferably 50 or less, and still more preferably 30 or less. Examples of the aromatic ring include a benzene ring, a naphthalene ring, a pentalene ring, an indene ring, an azulene ring, a heptalene ring, an indacene ring, a perylene ring, a pentacene ring, a quaterrylene ring, an acenaphthene ring, a phenanthrene ring, an anthracene ring, a naphthacene ring, a chrysene ring, a triphenylene ring, a fluorene ring, a pyridine ring, a quinoline ring, an isoquinoline ring, an imidazole ring, a benzimidazole ring, a pyrazole ring, a thiazole ring, a benzothiazole ring, a triazole ring, a benzotriazole ring, an oxazole ring, a benzoxazole ring, an imidazoline ring, a pyrazine ring, a quinoxaline ring, a pyrimidine ring, a quinazoline ring, a pyridazine ring, a triazine ring, a pyrrole ring, an indole ring, an isoindole ring, a carbazole ring, and a fused ring including the above-described ring.

It is preferable that the near infrared absorbing compound is a compound having an absorption maximum in a wavelength range of 700 to 1000 nm. In this specification, "having an absorption maximum in a wavelength range of 700 to 1000 nm" denotes having a maximum absorbance in a wavelength range of 700 to 1000 nm in an absorption spectrum of the near infrared absorbing compound in a solution. Examples of a measurement solvent used for the measurement of the absorption spectra of the near infrared absorbing compound in the solution include chloroform, methanol, dimethyl sulfoxide, ethyl acetate, and tetrahydrofuran. In the case of a compound which is soluble in chloroform, chloroform is used as the measurement solvent. In the case of a compound which is not soluble in chloroform, methanol is used. In addition, in the case of a compound which is not soluble in chloroform and methanol, dimethyl sulfoxide is used.

In the present invention, as the near infrared absorbing compound, at least one selected from a pyrrolopyrrole compound, a cyanine compound, a squarylium compound, a phthalocyanine compound, a naphthalocyanine compound, a quaterrylene compound, a merocyanine compound, a croconium compound, an oxonol compound, a diimmonium compound, a dithiol compound, a triarylmethane compound, a pyrromethene compound, an azomethine compound, an anthraquinone compound, or a dibenzofuranone compound is preferable, at least one selected from a pyrrolopyrrole compound, a cyanine compound, a squarylium compound, a phthalocyanine compound, a naphthalocyanine compound, or a diimmonium compound is more preferable, at least one selected from a pyrrolopyrrole compound, a cyanine compound, and a squarylium compound is still more preferable, or a pyrrolopyrrole compound is still more preferable. Examples of the diimmonium compound include a compound described in JP2008-528706A, the content of which is incorporated herein by reference. Examples of the phthalocyanine compound include a compound described in paragraph "0093" of JP2012-077153A, oxytitaniumphthalocyanine described in JP2006-343631A, and a compound described in paragraphs "0013" to "0029" of JP2013-195480A, the contents of which are incorporated herein by reference. Examples of the naphthalocyanine compound include a compound described in paragraph "0093" of JP2012-077153A, the content of which is incorporated herein by reference. In addition, as the cyanine compound, the phthalocyanine compound, the naphthalocyanine compound, the diimmonium compound, or the squarylium compound, for example, a compound described in paragraphs "0010" to "0081" of JP2010-111750A may be used, the content of which are incorporated in this specification. In addition, the details of the cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference. In addition, a compound described in paragraphs JP2016-146619A can also be used as the near infrared absorbing compound, the content of which is incorporated herein by reference.

As the pyrrolopyrrole compound, a compound represented by Formula (PP) is preferable.

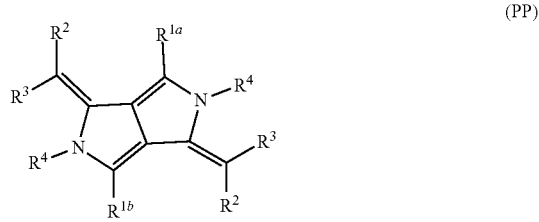

(PP)

In the formula, $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, $-BR^{4A}R^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a substituent. The details of Formula (PP) can be found in paragraphs "0017" to "0047" of JP2009-263614A, paragraphs "0011" to "0036" of JP2011-068731 A, and paragraphs "0010" to "0024" of WO2015/166873A, the contents of which are incorporated herein by reference.

$R^{1a}$ and $R^{1b}$ each independently represent preferably an aryl group or a heteroaryl group, and more preferably an aryl group. In addition, the alkyl group, the aryl group, and the heteroaryl group represented by $R^{1a}$ to $R^{1b}$ may have a substituent or may be unsubstituted. Examples of the substituent include an alkoxy group, a hydroxyl group, a halogen atom, a cyano group, a nitro group, $-OCOR^{11}$, $-SOR^{12}$, and $-SO_2R^{13}$. $R^{11}$ to $R^{13}$ each independently represent a hydrocarbon group or a heterocyclic group. In addition, examples of the substituent include substituents described in paragraphs "0020" to "0022" of 2009-263614A. Among these, as the substituent, an alkoxy group, a hydroxyl group, a cyano group, a nitro group, $-OCOR^{11}$, $-SOR^{12}$, or $-SO_2R^{13}$ is preferable. As the group represented by $R^{1a}$ and $R^{1b}$, an aryl group which has an alkoxy group having a branched alkyl group as a substituent, an aryl group which has a hydroxyl group as a substituent, or an aryl group which has a group represented by $-OCOR^{11}$ as a substituent is preferable. The number of carbon atoms in the branched alkyl group is preferably 3 to 30 and more preferably 3 to 20.

It is preferable that at least one of $R^2$ or $R^3$ represents an electron-withdrawing group, and it is more preferable that $R^2$ represents an electron-withdrawing group (preferably a cyano group) and $R^3$ represents a heteroaryl group. It is preferable that the heteroaryl group is a 5-membered or 6-membered ring. In addition, the heteroaryl group is preferably a monocyclic or a fused ring, more preferably a monocyclic or a fused ring composed of 2 to 8 rings, and still more preferably a monocyclic or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. It is preferable that the heteroaryl group has one or more nitrogen atoms. Two $R^2$'s in Formula (PP) may be the same as or different from each other. In addition, two $R^3$'s in Formula (PP) may be the same as or different from each other.

$R^4$ represents preferably a hydrogen atom, an alkyl group, an aryl group, a heteroaryl group, or a group represented by $-BR^{4A}R^{4B}$, more preferably a hydrogen atom, an alkyl group, an aryl group, or a group represented by $-BR^{4A}R^{4B}$, and still more preferably a group represented by $-BR^{4A}R^{4B}$. As the substituent represented by $R^{4A}$ and $R^{4B}$, a halogen atom, an alkyl group, an alkoxy group, an aryl group, or a heteroaryl group is preferable, an alkyl group, an aryl group, or a heteroaryl group is more preferable, and an aryl group is still more preferable. Each of the groups may further have a substituent. Two $R^4$'s in Formula (PP) may be the same as or different from each other.

Specific examples of the compound represented by Formula (PP) include the following compounds. In the following structural formulae, Me represents a methyl group, and Ph represents a phenyl group. In addition, examples of the pyrrolopyrrole compound include a compound described in paragraphs "0016" to "0058" of JP2009-263614A, a compound described in paragraphs "0037" to "0052" of JP2011-068731A, and a compound described in paragraphs "0010" to "0033" of WO2015/166873A, the contents of which are incorporated herein by reference.

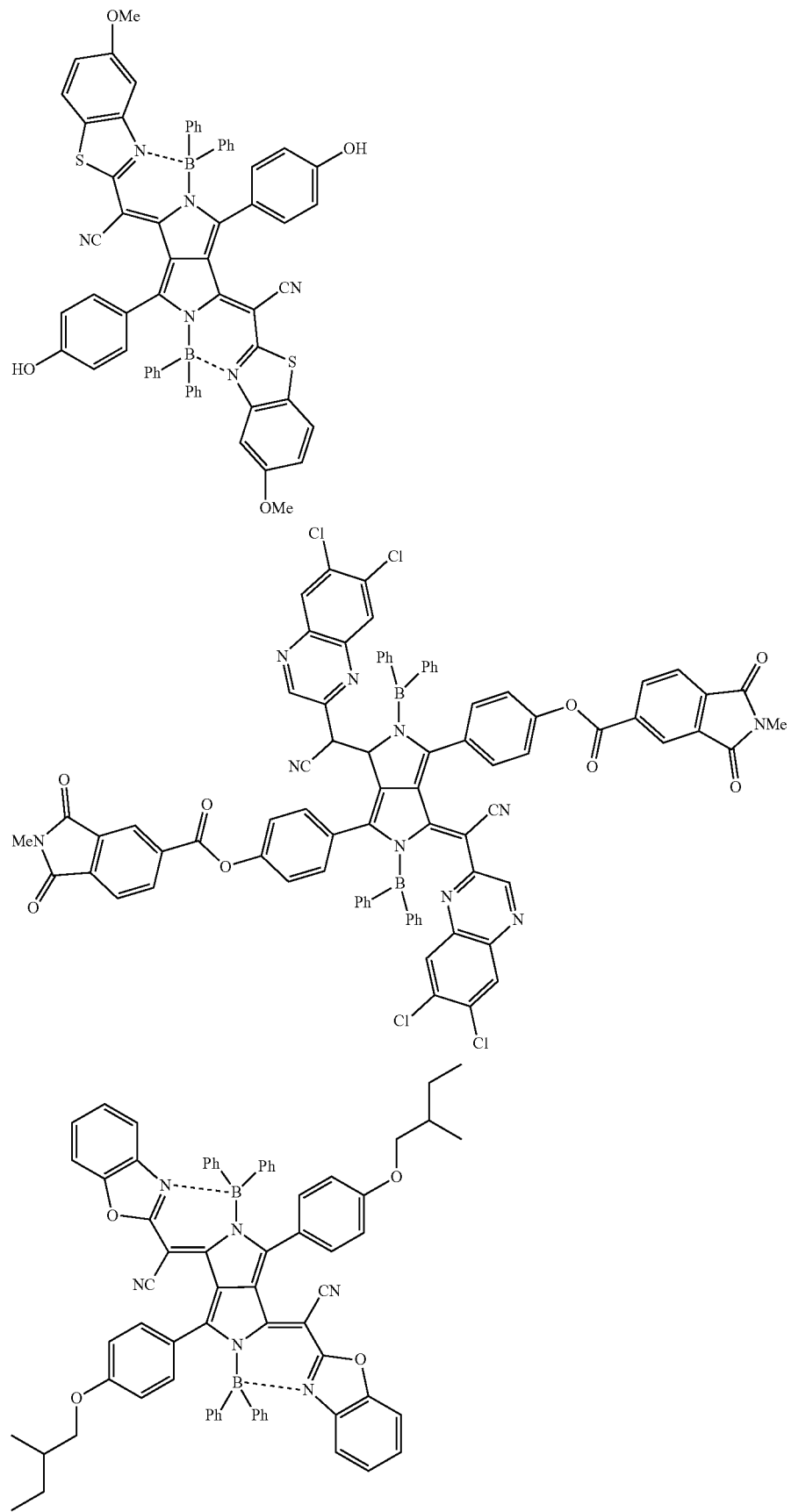

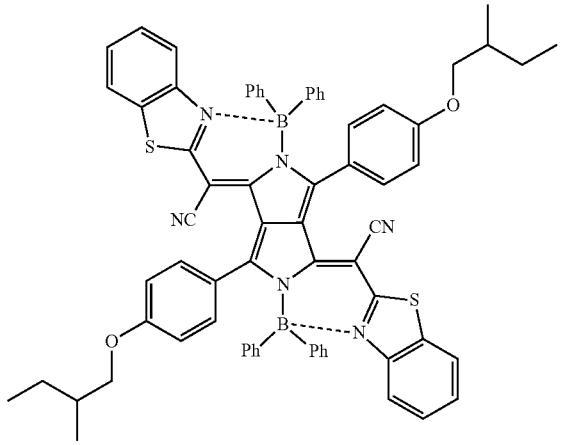

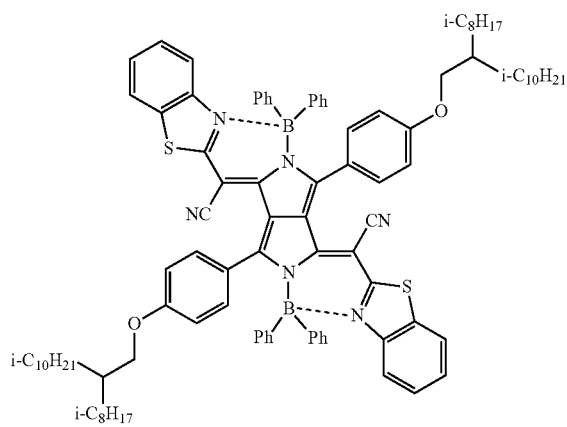

As the squarylium compound, a compound represented by the following Formula (SQ) is preferable.

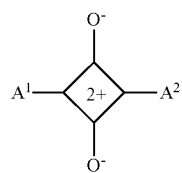

(SQ)

In Formula (SQ), $A^1$ and $A^2$ each independently represent an aryl group, a heteroaryl group, or a group represented by the following Formula (A-1).

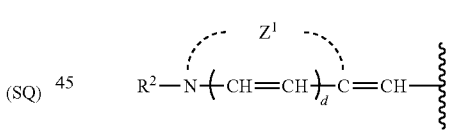

(A-1)

In Formula (A-1), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond. The details of Formula (SQ) can be found in paragraphs "0020" to "0049" of JP2011-208101A, the content of which is incorporated herein by reference.

As shown below, cations in Formula (SQ) are present without being localized.

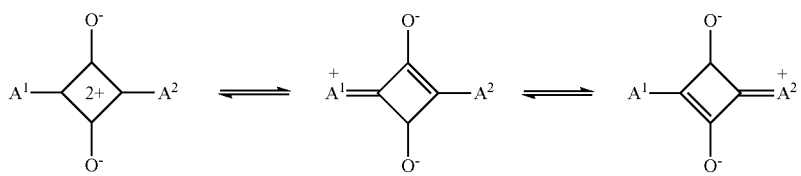

Specific examples of the squarylium compound include the following compounds. Examples of the squarylium compound include a compound described in paragraphs "0044" to "0049" of JP2011-208101A, the content of which is incorporated herein by reference.

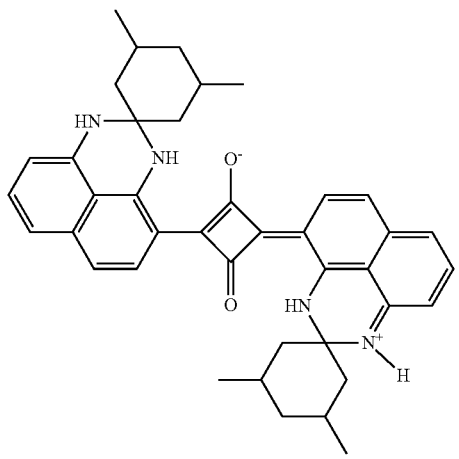 [SMILES: CC1CC(C)CC2(C1)Nc1cccc3ccc(C4=C([O-])/C(=c5\ccc6cccc7c6c5NC5(CC(C)CC(C)C5)[NH+]=7)C4=O)c(c13)N2]

As the cyanine compound, a compound represented by Formula (C) is preferable. Formula (C)

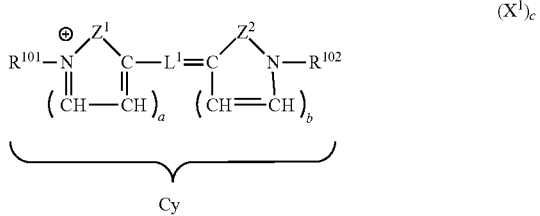

In the formula, $Z^1$ and $Z^2$ each independently represent a non-metal atomic group for forming a 5-membered or 6-membered nitrogen-containing heterocycle which may be fused.

$R^{101}$ and $R^{102}$ each independently represent an alkyl group, an alkenyl group, an alkynyl group, an aralkyl group, or an aryl group.

$L^1$ represents a methine chain including an odd number of methine groups.

a and b each independently represent 0 or 1.

In a case where a represents 0, a carbon atom and a nitrogen atom are bonded through a double bond. In a case where b represents 0, a carbon atom and a nitrogen atom are bonded through a single bond.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

Examples of the cyanine compound include a compound described in paragraphs "0044" and "0045" of JP2009-108267A, a compound described in paragraphs "0026" to "0030" of JP2002-194040, a compound described in JP2015-172004A, a compound described in JP2015-172102A, and a compound described in JP2008-088426A, the contents of which are incorporated herein by reference.

In the present invention, as the near infrared absorbing compound, a commercially available product can also be used. Examples of the commercially available product include SDO-C33 (manufactured by Arimoto Chemical Co., Ltd.); EXCOLOR IR-14, EXCOLOR IR-10A, EXCOLOR TX-EX-801B, and EXCOLOR TX-EX-805K (manufactured by Nippon Shokubai Co., Ltd.); Shigenox NIA-8041, Shigenox NIA-8042, Shigenox NIA-814, Shigenox NIA-820, and Shigenox NIA-839 (manufactured by Hakkol Chemical Co., Ltd.); Epolite V-63, Epolight 3801, and Epolight3036 (manufactured by Epolin Inc.); PRO-JET 825LDI (manufactured by Fujifilm Corporation); NK-3027 and NK-5060 (manufactured by Hayashibara Co., Ltd.); and YKR-3070 (manufactured by Mitsui Chemicals, Inc.).

In the composition according to the embodiment of the present invention, as the near infrared absorber, inorganic particles can also be used. The shape of the inorganic particles is not particularly limited and may have a sheet shape, a wire shape, or a tube shape irrespective of whether or not the shape is spherical or non-spherical. As the inorganic particles, metal oxide particles or metal particles are preferable. Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped SnO2) particles, and niobium-doped titanium dioxide (Nb-doped $TiO_2$) particles. Examples of the metal particles include silver (Ag) particles, gold (Au) particles, copper (Cu) particles, and nickel (Ni) particles. In addition, as the inorganic particles, a tungsten oxide compound can also be used. As the tungsten oxide compound, cesium tungsten oxide is preferable. The details of the tungsten oxide compound can be found in paragraph "0080" of JP2016-006476A, the content of which is incorporated herein by reference.

In the composition according to the embodiment of the present invention, the content of the near infrared absorber is preferably 1 to 30 mass % with respect to the total solid content of the composition. The upper limit is preferably 20 mass % or lower, and more preferably 10 mass % or lower. The lower limit is preferably 3 mass % or higher and more preferably 5 mass % or higher.

In addition, the total content of the near infrared absorber and the light shielding material is preferably 10 to 70 mass % with respect to the total solid content of the composition. The lower limit is preferably 20 mass % or higher and more preferably 25 mass % or higher.

In addition, the content of the near infrared absorber is preferably 5 to 40 mass % with respect to the total content of the near infrared absorber and the light shielding material. The upper limit is preferably 30 mass % or lower and more preferably 25 mass % or lower. The lower limit is preferably 10 mass % or higher and more preferably 15 mass % or higher.

In the composition according to the embodiment of the present invention, as the near infrared absorber, one infrared absorber may be used alone, or two or more infrared absorbers may be used in combination. In a case where two or more near infrared absorbers are used in combination, it is preferable that the total content of the near infrared absorbers is in the above-described range.

<<Polymerizable Compounds>>

The composition according to the embodiment of the present invention may include a polymerizable compound other than the compound A. As the polymerizable compound, a compound that is polymerizable by the action of a radical is preferable. That is, it is preferable that the polymerizable compound is a radically polymerizable compound. As the polymerizable compound, a compound having one or more ethylenically unsaturated groups is preferable, a compound having two or more ethylenically unsaturated groups is more preferable, and a compound having three or more ethylenically unsaturated groups is still more preferable. The upper limit of the number of the ethylenically unsaturated groups is, for example, preferably 15 or less and more preferably 6 or less. Examples of the ethylenically unsaturated group include a vinyl group, a styrene group, an allyl group, a methallyl group, and a (meth)acryloyl group. Among these, a (meth)acryloyl group is preferable. The polymerizable compound is preferably a (meth)acrylate compound having 3 to 15 functional groups and more preferably a (meth)acrylate compound having 3 to 6 functional groups.

The polymerizable compound may be in the form of a monomer or a polymer and is preferably a monomer. The molecular weight of the monomer type polymerizable compound is preferably 100 or higher and lower than 3000. The upper limit is preferably 2000 or lower and more preferably 1500 or lower. The lower limit is preferably 150 or higher and more preferably 250 or higher. In addition, it is preferable that the polymerizable compound is a compound substantially not having a molecular weight distribution. Here, the compound substantially not having a molecular weight distribution represents that the dispersity (weight-average molecular weight (Mw)/number-average molecular weight (Mn)) of the compound is preferably 1.0 to 1.5 and more preferably 1.0 to 1.3.

Examples of the polymerizable compound can be found in paragraphs "0033" and "0034" of JP2013-253224A, the content of which is incorporated herein by reference. As the polymerizable compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a compound having a structure in which the (meth)acryloyl group is bonded through an ethylene glycol residue and/or a propylene glycol residue is preferable. In addition, oligomers of the above-described examples can be used. For example, the details of the polymerizable compound can be found in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US2012/0235099A), the content of which is incorporated herein by reference. In addition, diglycerin ethylene oxide (EO)-modified (meth)acrylate (as a commercially available product, M-460 manufactured by Toagosei Co., Ltd.), pentaerythritol tetraacrylate (A-TMMT manufactured by Shin-Nakamura Chemical Co., Ltd.), or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used.

The polymerizable compound may have an acid group such as a carboxyl group, a sulfo group, or a phosphate group. Examples of a commercially available product of the polymerizable compound having an acid group include ARONIX M-305, M-510, and M-520 (manufactured by Toagosei Co., Ltd.). The acid value of the polymerizable compound having an acid group is preferably 0.1 to 40 mgKOH/g. The lower limit is preferably 5 mgKOH/g or higher. The upper limit is preferably 30 mgKOH/g or lower.

In addition, it is also preferable that the polymerizable compound is a compound having a caprolactone structure. The polymerizable compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. Examples of the polymerizable compound having a caprolactone structure can be found in paragraphs "0042" to "0045" of JP2013-253224A, the content of which is incorporated herein by reference. Examples of the compound having a caprolactone structure include: DPCA-20, DPCA-30, DPCA-60, and DPCA-120 which are commercially available as KAYARAD DPCA series manufactured by Nippon Kayaku Co., Ltd.; SR-494 (manufactured by Sartomer) which is a tetrafunctional acrylate having four ethyleneoxy chains; and TPA-330 which is a trifunctional acrylate having three isobutyleneoxy chains.

As the polymerizable compound, a urethane acrylate described in JP1973-041708B (JP-S48-041708B), JP1976-037193A (JP-S51-037193A), JP1990-032293B (JP-H2-032293B), or JP1990-016765B (JP-H2-016765B), or a urethane compound having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) is also preferable. In addition, an addition-polymerizable compound having an amino structure or a sulfide structure in the molecules described in JP1988-277653A (JP-S63-277653A), JP1988-260909A (JP-S63-260909A), or JP1989-105238A (JP-H1-105238A) can be used. Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

In a case where the composition according to the embodiment of the present invention includes the polymerizable compound other than the compound A, the content of the polymerizable compound other than the compound A is preferably 0.1 to 40 mass % with respect to the total solid content of the composition. For example, the lower limit is more preferably 0.5 mass % or higher and still more preferably 1 mass % or higher. For example, the upper limit is more preferably 30 mass % or lower and still more preferably 20 mass % or lower. The composition according to the embodiment of the present invention may not substantially include the polymerizable compound other than the compound A. The composition according to the embodiment of the present invention not substantially including the polymerizable compound other than the compound A represents that the content of the polymerizable compound other than the compound A is preferably 0.05 mass % or lower, more preferably 0.01 mass % or lower, and still more preferably 0 mass % with respect to the total solid content of the composition.

In addition, the total content of the compound A and the polymerizable compound other than the compound A is preferably 5 to 50 mass % with respect to the total solid content of the composition. For example, the lower limit is more preferably 7 mass % or higher and still more preferably 10 mass % or higher. For example, the upper limit is more preferably 45 mass % or lower and still more preferably 40 mass % or lower.

As the polymerizable compound, one kind may be used alone, or two or more kinds may be used in combination. In a case where two or more polymerizable compounds are used in combination, it is preferable that the total content of the two or more polymerizable compounds is in the above-described range.

<<Photopolymerization Initiator>>

The composition according to the embodiment of the present invention may include a photopolymerization initiator. The photopolymerization initiator is not particularly limited and can be appropriately selected from well-known photopolymerization initiators. For example, a compound having photosensitivity to light in a range from an ultraviolet range to a visible range is preferable. It is preferable that the photopolymerization initiator is a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. In addition, from the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from the group consisting of an oxime compound, an α-hydroxy ketone compound, an α-aminoketone compound, and an acylphosphine compound is more preferable, and an oxime compound is still more preferable. The details of the photopolymerization initiator can be found in paragraphs "0065" to "0111" of JP2014-130173A, the content of which is incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF SE). Examples of a commercially available product of the α-aminoketone compound include IRGACURE-907, IRGACURE-369, IRGACURE-379, and IRGACURE-379EG (all of which are manufactured by BASF SE). Examples of a commercially available product of the acylphosphine compound include IRGACURE-819, and DAROCUR-TPO (all of which are manufactured by BASF SE).

As the oxime compound, a compound described in JP2001-233842A, a compound described in JP2000-080068A, a compound described in JP2006-342166A, or a compound described in JP2016-021012A can be used. Examples of the oxime compound which can be preferably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. In addition, examples of the oxime compound include a compound described in J. C. S. Perkin II (1979), pp. 1653-1660, J. C. S. Perkin II (1979), pp. 156-162 and Journal of Photopolymer Science and Technology (1995), pp. 202-232, JP2000-066385A, JP2000-080068A, JP2004-534797A, or JP2006-342166A. As a commercially available product of the oxime compound, IRGACURE-OXE01, IRGACURE-OXE02, IRGACURE-OXE03, or IRGACURE-OXE04 (all of which are manufactured by BASF SE) can also be preferably used. In addition, TR-PBG-304 (manufactured by Changzhou Tronly New Electronic Materials Co., Ltd.), ADEKA ARKLS NCI-831 (manufactured by Adeka Corporation), ADEKA ARKLS NCI-930 (manufactured by Adeka Corporation), ADEKA OPTOMER N-1919 (manufactured by Adeka Corporation, a photopolymerization initiator 2 described in JP2012-014052A) can also be used.

In the present invention, an oxime compound having a fluorene ring can also be used as the photopolymerization initiator. Specific examples of the oxime compound having a fluorene ring include a compound described in JP2014-137466A. The content is incorporated herein by reference.

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

In the present invention, as the photopolymerization initiator, an oxime compound having a nitro group can be used. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to "0025" of JP4223071B, and ADEKA ARKLS NCI-831 (manufactured by Adeka Corporation).

Hereinafter, specific examples of the oxime compound which are preferably used in the present invention are shown below, but the present invention is not limited thereto.

(C-1)

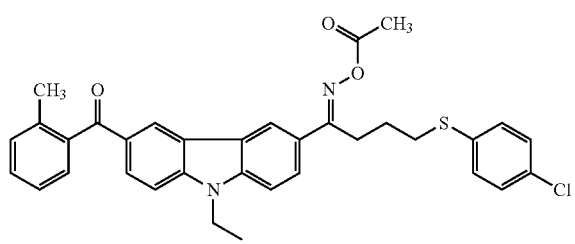

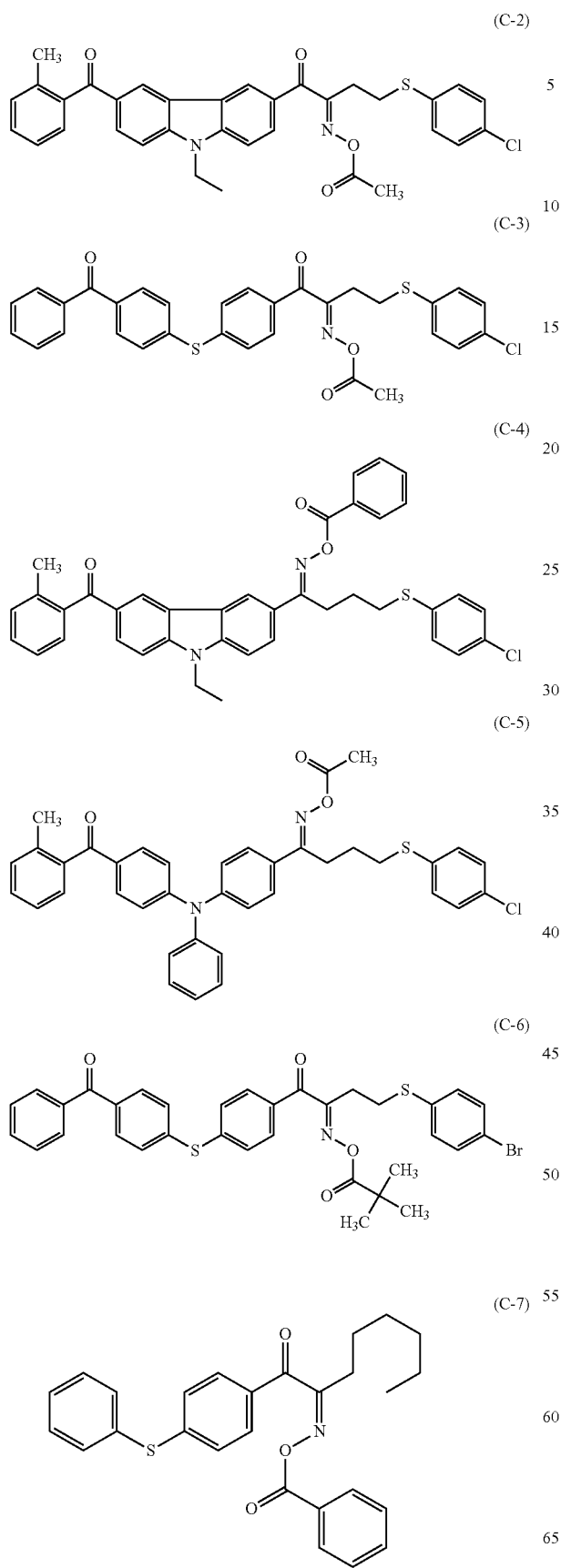
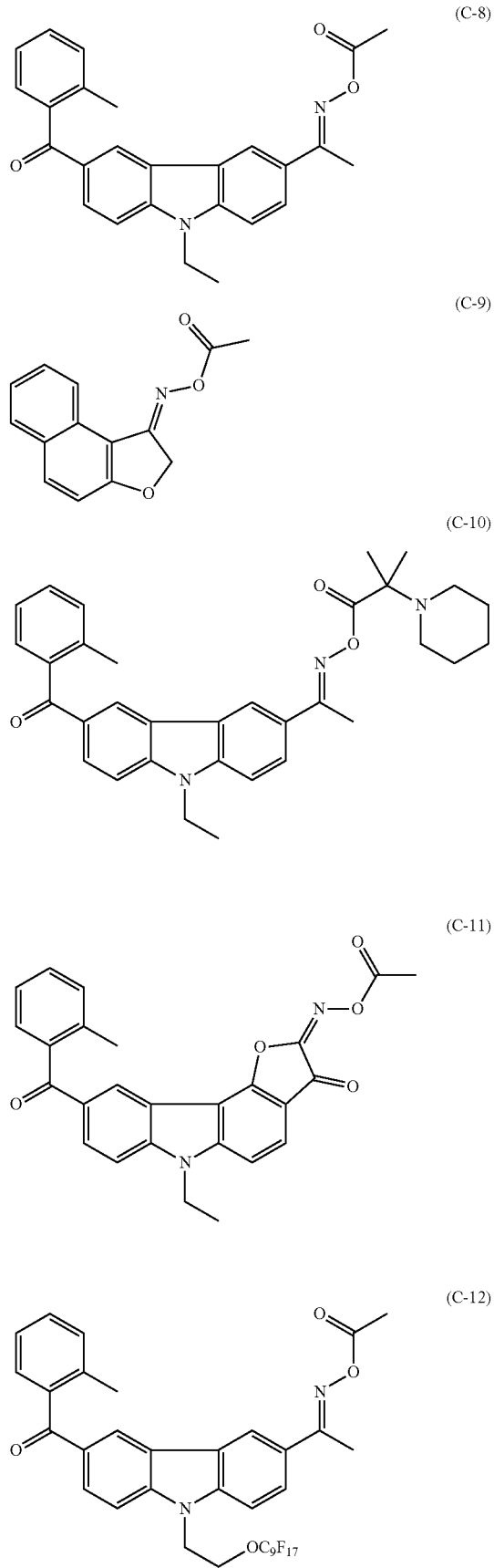

-continued

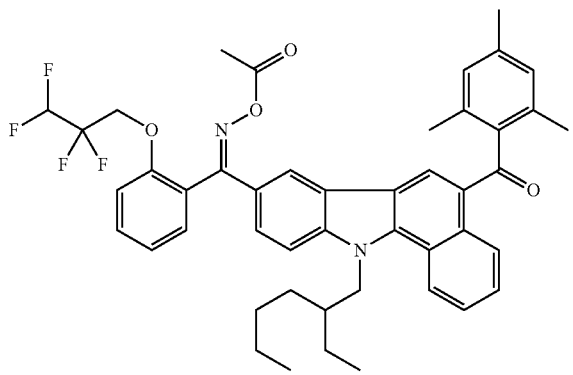

(C-13)

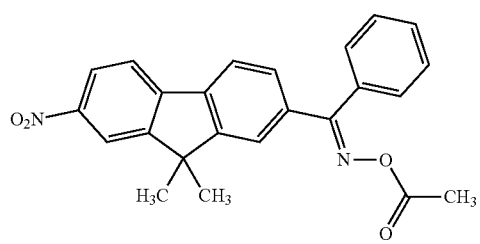

(C-14)

The oxime compound is preferably a compound having an absorption maximum in a wavelength range of 350 nm to 500 nm and more preferably a compound having an absorption maximum in a wavelength range of 360 nm to 480 nm. In addition, the oxime compound is preferably a compound having a high absorbance at 365 nm and 405 nm.

The molar absorption coefficient of the oxime compound at 365 nm or 405 nm is preferably 1000 to 300000, more preferably 2000 to 300000, and still more preferably 5000 to 200000 from the viewpoint of sensitivity.

The molar absorption coefficient of the compound can be measured using a well-known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

It is preferable that the photopolymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and still more preferably 1 to 20 mass % with respect to the total solid content of the composition. In a case where the content of the photopolymerization initiator is in the above-described range, developability is excellent. The composition according to the embodiment of the present invention may include one photopolymerization initiator or two or more photopolymerization initiators. In a case where the composition includes two or more photopolymerization initiators, it is preferable that the total content of the photopolymerization initiators is in the above-described range.

<<Resin>>

The composition according to the embodiment of the present invention may further include a resin other than the compound A. Examples of the resin other than the compound A include a resin not having a graft chain and a resin not having a radically polymerizable unsaturated bond group. In the present invention, the resin is mixed, for example, in order to disperse particles of the pigments and the like in the composition or to be added as a binder. The resin which is mainly used to disperse particles of the pigments and the like will also be called a dispersant. However, the above-described uses of the resin are merely exemplary, and the resin can be used for purposes other than the uses.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher.

Examples of the resin include a (meth)acrylic resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, and a styrene resin. Among these resins, one kind may be used alone, or a mixture of two or more kinds may be used. As the cyclic olefin resin, a norbornene resin can be preferably used from the viewpoint of improving heat resistance. Examples of a commercially available product of the norbornene resin include ARTON series (for example, ARTON F4520, manufactured by JSR Corporation). Examples of the epoxy resin include an epoxy resin which is a glycidyl-etherified product of a phenol compound, an epoxy resin which is a glycidyl-etherified product of various novolac resins, an alicyclic epoxy resin, an aliphatic epoxy resin, a heterocyclic epoxy resin, a glycidyl ester epoxy resin, a glycidyl amine epoxy resin, an epoxy resin which is a glycidylated product of a halogenated phenol, a condensate of a silicon compound having an epoxy group and another silicon compound, and a copolymer of a polymerizable unsaturated compound having an epoxy group and another polymerizable unsaturated compound. In addition, for example, MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer) can also be used. In addition, as the resin, a resin described in Examples of WO2016/088645A can also be used.

The resin used in the present invention may have an acid group. Examples of the acid group include a carboxyl group, a phosphate group, a sulfo group, and a phenolic hydroxyl group. Among these, a carboxyl group is preferable. Among these acid groups, one kind may be used alone, or two or more kinds may be used in combination. The resin having an acid group can also be used as an alkali-soluble resin.

As the resin having an acid group, a polymer having a carboxyl group at a side chain is preferable. Specific examples of the resin include an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac resin, an acidic cellulose derivative having a carboxyl group at a side chain thereof, and a resin obtained by adding an acid anhydride to a polymer having a hydroxyl group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of other monomers include a N-position-substituted maleimide monomer described in JP1998-300922A (JP-H10-300922A) such as N-phenylmaleimide or N-cyclohexylmaleimide. Among these monomers which are copolymerizable with the (meth)acrylic acid, one kind may be used alone, or two or more kinds may be used in combination.

The resin having an acid group may further have a polymerizable group. Examples of the polymerizable group include an allyl group, a methallyl group, and a (meth)acryloyl group. Examples of a commercially available product of the resin include DIANAL NR series (manufactured by Mitsubishi Rayon Co., Ltd.), PHOTOMER 6173 (a carboxyl group-containing polyurethane acrylate oligomer; manufactured by Diamond Shamrock Co., Ltd.), VISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.).

As the resin having an acid group, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer that includes a repeating unit derived from monomer components including a compound represented by the following Formula (ED1) and/or a compound represented by the following Formula (ED2) (hereinafter, these compounds will also be referred to as "ether dimer") is also preferable.

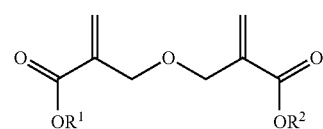
(ED1)

In Formula (ED1), $R^1$ and $R^2$ each independently represent a hydrogen atom or a hydrocarbon group having 1 to 25 carbon atoms which may have a substituent.

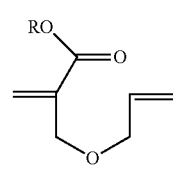
(ED2)

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph "0317" of JP2013-029760A, the content of which is incorporated herein by reference. Among these ether dimers, one kind may be used alone, or two or more kinds may be used in combination.

The resin having an acid group may include a repeating unit which is derived from a compound represented by the following Formula (X).

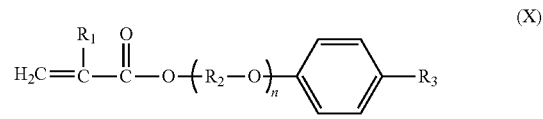
(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

The details of the resin having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference. In addition, as the resin having an acid group, a commercially available product may also be used. Examples of the commercially available product include ACRYBASE FF-426 (manufactured by Fujikura Kasei Co., Ltd.).

The acid value of the resin having an acid group is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

Examples of the resin having an acid group include resins having the following structures. In the following structural formulae, Me represents a methyl group.

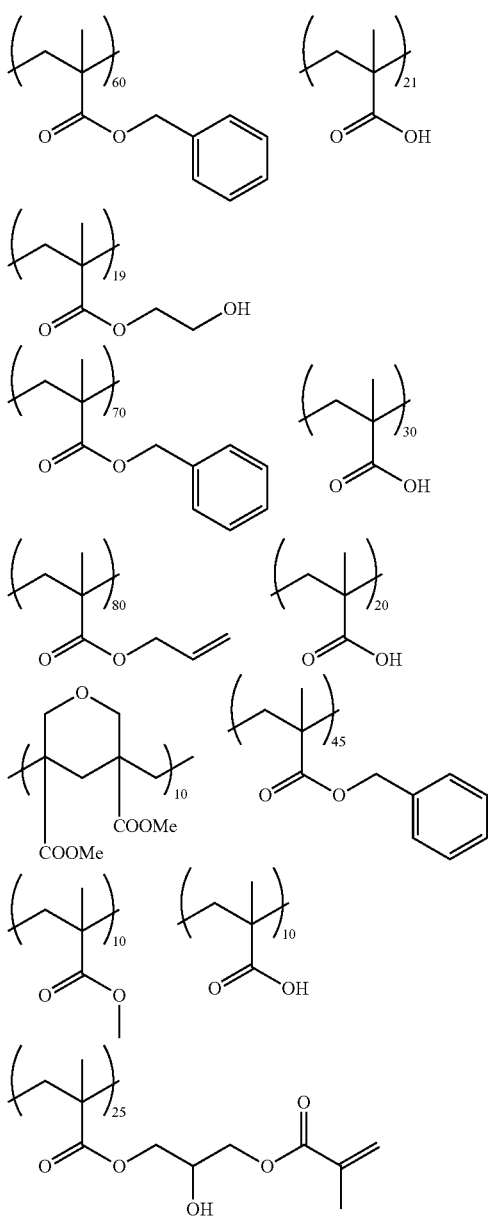

The composition according to the embodiment of the present invention may include a resin as a dispersant. Examples of the dispersant include an acidic dispersant (acidic resin) and a basic dispersant (basic resin). Here, the acidic dispersant (acidic resin) refers to a resin in which the amount of an acid group is more than the amount of a basic group. In a case where the sum of the amount of an acid group and the amount of a basic group in the acidic dispersant (acidic resin) is represented by 100 mol %, the amount of the acid group in the acidic resin is preferably 70 mol % or higher and more preferably substantially 100 mol %. The acid group in the acidic dispersant (acidic resin) is preferably a carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) refers to a resin in which the amount of a basic group is more than the amount of an acid group. In a case where the sum of the amount of an acid group and the amount of a basic group in the basic dispersant (basic resin) is represented by 100 mol %, the amount of the basic group in the basic resin is preferably higher than 50 mol %. The basic group in the basic dispersant is preferably an amino group.

It is preferable that the resin A used as the dispersant further includes a repeating unit having an acid group. By the resin, which is used as the dispersant, including the repeating unit having an acid group, in a case where a pattern is formed using a photolithography method, the amount of residues formed in an underlayer of a pixel can be reduced.

It is preferable that the resin used as the dispersant is a graft copolymer. Since the graft copolymer has affinity to the solvent due to the graft chain, the pigment dispersibility and the dispersion stability over time are excellent. The details of the graft copolymer can be found in the description of paragraphs "0025" to "0094" of JP2012-255128A, the content of which is incorporated herein by reference. In addition, specific examples of the graft copolymer include the following resins. The following resin may also be a resin having an acid group (alkali-soluble resin). In addition, other examples of the graft copolymer include resins described in paragraphs "0072" to "0094" of JP2012-255128A, the content of which is incorporated herein by reference.

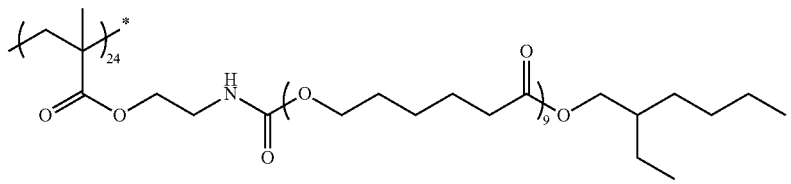

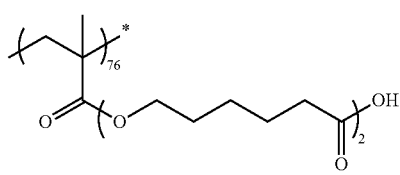

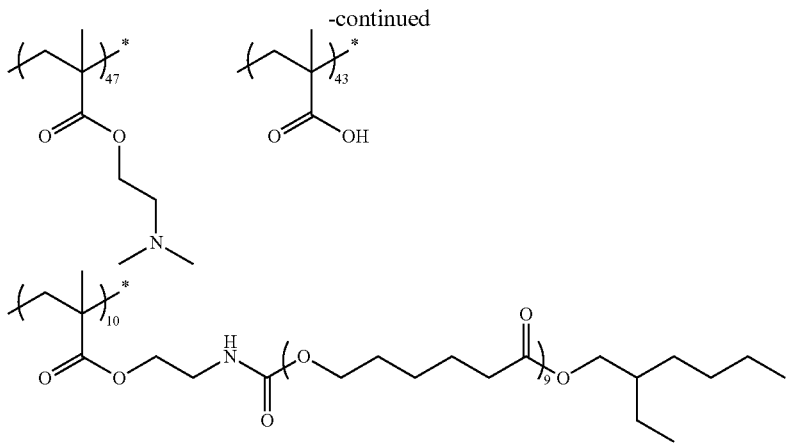

In addition, in the present invention, as the resin (dispersant), an oligoimine dispersant having a nitrogen atom at at least either a main chain or a side chain is also preferably used. As the oligoimine dispersant, a resin, which includes a structural unit having a partial structure X with a functional group (pKa: 14 or lower) and a side chain Y having 40 to 10000 atoms and has a basic nitrogen atom at at least either a main chain or a side chain, is preferable. The basic nitrogen atom is not particularly limited as long as it is a nitrogen atom exhibiting basicity. The oligoimine dispersant can be found in the description of paragraphs "0102" to "0166" of JP2012-255128A, the content of which is incorporated herein by reference. As the oligoimine dispersant, a resin described in paragraphs "0168" to "0174" of JP2012-255128A can be used.

The dispersant is available as a commercially available product, and specific examples thereof include Disperbyk-111 (manufactured by BYK Chemie) and SOLSPERSE 76500 (manufactured by Lubrication Technology Inc.). In addition, a pigment dispersant described in paragraphs "0041" to "0130" of JP2014-130338A can also be used, the content of which is incorporated herein by reference. In addition, the resin having an acid group or the like can also be used as a dispersant.

In a case where the composition according to the embodiment of the present invention includes a resin, the content of the resin is preferably higher than 0 mass % and 30 mass % or lower with respect to the total solid content of the composition according to the embodiment of the present invention.

In addition, in the composition according to the embodiment of the present invention, a ratio (mass of polymerizable compound/total mass of resin and compound A) of the mass of the polymerizable compound to the total mass of the resin and the compound A is preferably 0 to 2, more preferably 0 to 1, and still more preferably 0 to 0.8. According to this aspect, the amount of the polymerizable compound can be reduced and the thickness of the film can be reduced.

<<Pigment Derivative>>

The composition according to the embodiment of the present invention may further include a pigment derivative. Examples of the pigment derivative include a compound having a structure in which a portion of a pigment is substituted with an acid group, a basic group, a group having a salt structure, or a phthalimidomethyl group. As the pigment derivative, a compound represented by Formula (B1) is preferable.

$$P-(L-(X)_n)_m \quad (B1)$$

In Formula (B1), P represents a colorant structure, L represents a single bond or a linking group, X represents an acid group, a basic group, a group having a salt structure, or a phthalimidomethyl group, m represents an integer of 1 or more, n represents an integer of 1 or more, in a case where m represents 2 or more, a plurality of L's and a plurality of X's may be different from each other, and in a case where n represents 2 or more, a plurality of X's may be different from each other.

In Formula (B1), P represents a colorant structure, preferably at least one selected from the group consisting of a pyrrolopyrrole colorant structure, a diketo pyrrolopyrrole colorant structure, a quinacridone colorant structure, an anthraquinone colorant structure, a dianthraquinone colorant structure, a benzoisoindole colorant structure, a thiazine indigo colorant structure, an azo colorant structure, a quinophthalone colorant structure, a phthalocyanine colorant structure, a naphthalocyanine colorant structure, a dioxazine colorant structure, a perylene colorant structure, a perinone colorant structure, a benzimidazolone colorant structure, a benzothiazole colorant structure, a benzimidazole colorant structure, and a benzoxazole colorant structure, more preferably at least one selected from the group consisting of a pyrrolopyrrole colorant structure, a diketo pyrrolopyrrole colorant structure, a quinacridone colorant structure, and a benzimidazolone colorant structure, and still more preferably a pyrrolopyrrole colorant structure.

In Formula (B1), L represents a single bond or a linking group. The linking group is preferably a group composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent.

In Formula (B1), X represents an acid group, a basic group, a group having a salt structure, or a phthalimidomethyl group. Among these, an acid group or a basic group is preferable. Examples of the acid group include a carboxyl group and a sulfo group. Examples of the basic group include an amino group.

Examples of the pigment derivative include compounds having the following structures. In addition, for example, compounds described in JP1981-118462A (JP-S56-118462A), JP1988-264674A (JP-S63-264674A), JP1989-217077A (JP-H1-217077A), JP1991-9961A (JP-H3-9961A), JP1991-026767A (JP-H3-026767A), JP1991-153780A (JP-H3-153780A), JP1991-045662A (JP-H3-045662A), JP1992-285669A (JP-H4-285669A), JP1994-145546A (JP-H6-145546A), JP1994-212088A (JP-H6-

212088A), JP1994-240158A (JP-H6-240158A), JP1998-030063A (JP-H10-030063A), JP1998-195326A (JP-H10-195326A), paragraphs "0086" to "0098" of WO2011/024896A, and paragraphs "0063" to "0094" of WO2012/102399A can be used, the contents of which are incorporated herein by reference.
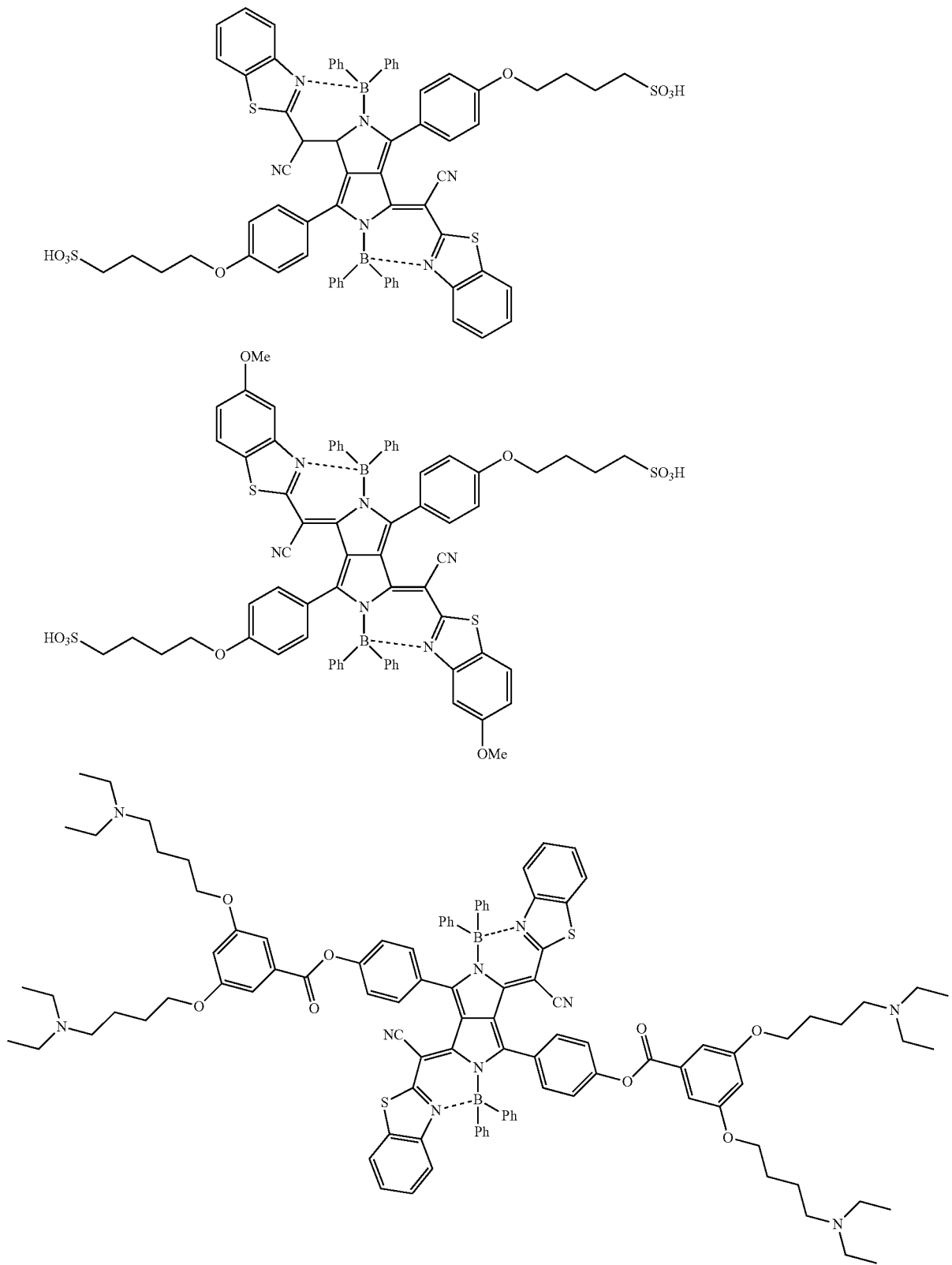

-continued

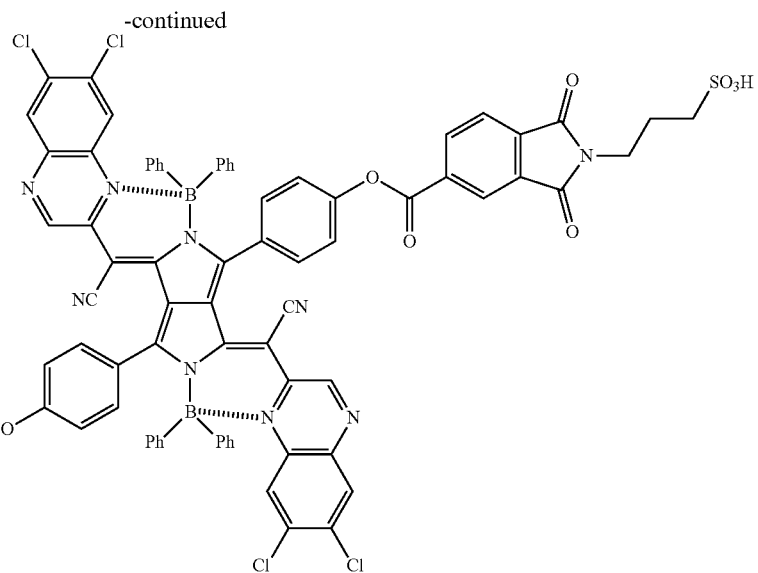

In a case where the composition according to the embodiment of the present invention includes the pigment derivative, the content of the pigment derivative is preferably 1 to 50 parts by mass with respect to 100 parts by mass of the pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is in the above-described range, the pigment dispersibility can be improved, and aggregation of the pigment can be effectively suppressed. As the pigment derivative, one kind may be used alone, or two or more kinds may be used in combination. In a case where two or more pigment derivatives are used in combination, it is preferable that the total content of the two or more pigment derivatives is in the above-described range.

<<Solvent>>

The composition according to the embodiment of the present invention may include a solvent. Examples of the solvent include an organic solvent. The solvent is not particularly limited as long as it satisfies the solubility of the respective components and the coating properties of the composition. Examples of the organic solvent include esters, ethers, ketones, and aromatic hydrocarbons. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, and propylene glycol monomethyl ether acetate. In the present invention, as the organic solvent, one kind may be used alone, or two or more kinds may be used in combination. In this case, it may be preferable that the content of the aromatic hydrocarbon (for example, benzene, toluene, xylene, or ethylbenzene) as the solvent is low (for example, 50 mass parts per million (ppm) or lower, 10 mass ppm or lower, or 1 mass ppm or lower with respect to the total mass of the organic solvent) in consideration of environmental aspects and the like.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 µm or less, more preferably 5 µm or less, and still more preferably 3 µm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 10 to 90 mass %, more preferably 20 to 80 mass %, and still more preferably 25 to 75 mass % with respect to the total mass of the composition.

<<Polymerization Inhibitor>>

The composition according to the embodiment of the present invention may include a polymerization inhibitor. Examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine salt (for example, an ammonium salt or a cerium (III) salt). Among these, p-methoxyphenol is preferable. The content of the polymerization inhibitor is preferably 0.001 to 5 mass % with respect to the total solid content of the composition.

<<Silane Coupling Agent>>

The composition according to the embodiment of the present invention may include a silane coupling agent. In the present invention, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction and a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. Examples of the functional group other than a hydrolyzable group include a vinyl group, a styrene group, a (meth)acryloyl group, a mercapto group, an epoxy group, an oxetanyl group, an amino group, an ureido group, a sulfide group, an isocyanate group, and a phenyl group. Among these, a (meth)acryloyl group or an epoxy group is preferable. Examples of the silane coupling agent include a compound described in paragraphs "0018" to "0036" of JP2009-288703A and a compound described in paragraphs "0056" to "0066" of JP2009-242604A, the content of which is incorporated herein by reference.

The content of the silane coupling agent is preferably 0.01 to 15.0 mass % and more preferably 0.05 to 10.0 mass % with respect to the total solid content of the composition. As the silane coupling agent, one kind may be used alone, or two or more kinds may be used. In a case where two or more silane coupling agents are used in combination, it is preferable that the total content of the two or more silane coupling agents is in the above-described range.

<<Surfactant>>

The composition according to the embodiment of the present invention may include a surfactant. As the surfactants, various surfactants such as a fluorine surfactant, a nonionic surfactant, a cationic surfactant, an anionic surfactant, or a silicone surfactant can be used. The details of the surfactant can be found in paragraphs "0238" to "0245" of WO2015/166779A, the content of which is incorporated herein by reference.

In the present invention, it is preferable that the surfactant is a fluorine surfactant. By the composition according to the embodiment of the present invention containing a fluorine surfactant, liquid characteristics (for example, fluidity) are further improved, and liquid saving properties can be further improved. In addition, a film having reduced thickness unevenness can be formed.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-041318A (paragraphs "0060" to "0064" of corresponding WO2014/17669A) and a surfactant described in paragraphs "0117" to "0132" of JP2011-132503A, the content of which is incorporated herein by reference. Examples of a commercially available product of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

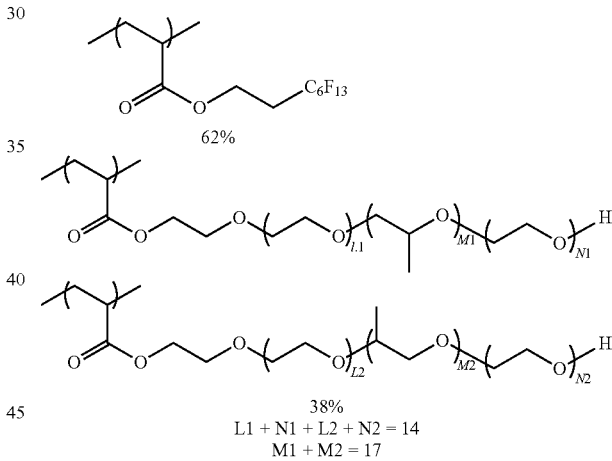

62%

38%
L1 + N1 + L2 + N2 = 14
M1 + M2 = 17

The weight-average molecular weight of the compound is preferably 3000 to 50000 and, for example, 14000. In the compound, "%" representing the proportion of a repeating unit is mass %.

In addition, as the fluorine surfactant, a fluorine-containing polymer having an ethylenically unsaturated group at a side chain can also be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE)), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010, SUR-FYNOL 104, 400, and 440 (all of which are manufactured by Nissin Chemical Co., Ltd.).

The content of the surfactant is preferably 0.001 to 5.0 mass % and more preferably 0.005 to 3.0 mass % with respect to the total solid content of the composition according to the embodiment of the present invention. As the surfactant, one kind may be used alone, or two or more kinds may be used. In a case where two or more surfactants are used in combination, it is preferable that the total content of the two or more surfactants is in the above-described range.

<<Ultraviolet Absorber>>

The composition according to the embodiment of the present invention can include an ultraviolet absorber. As the ultraviolet absorber, for example, a conjugated diene compound, an aminobutadiene compound, a methyldibenzoyl compound, a coumarin compound, a salicylate compound, a benzophenone compound, a benzotriazole compound, an acrylonitrile compound, or a hydroxyphenyltriazine compound can be used. The details can be found in paragraphs "0052" to "0072" of JP2012-208374A and paragraphs "0317" to "0334" of JP2013-068814A, the contents of which are incorporated herein by reference. Examples of a commercially available product of the conjugated diene compound include UV-503 (manufactured by Daito Chemical Co., Ltd.). In addition, as the benzotriazole compound, MYUA series (manufactured by Miyoshi Oil&Fat Co., Ltd.; The Chemical Daily, Feb. 1, 2016) may be used. As the ultraviolet absorber, a compound represented by any one of Formulae (UV-1) to (UV-3) is preferable, a compound represented by any one of Formula (UV-1) or (UV-3) is more preferable, and a compound represented by Formula (UV-1) is still more preferable.

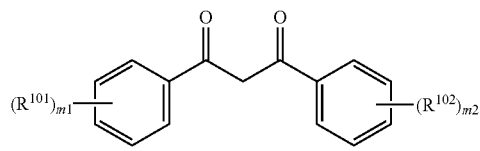
(UV-1)

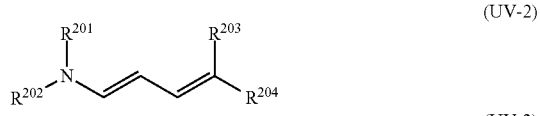
(UV-2)

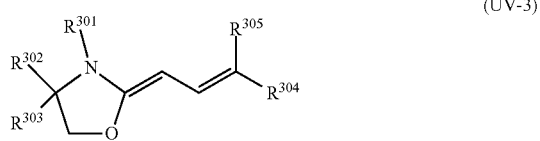
(UV-3)

In Formula (UV-1), $R^{101}$ and $R^{102}$ each independently represent a substituent, and m1 and m2 each independently represent 0 to 4.

In Formula (UV-2), $R^{201}$ and $R^{202}$ each independently represent a hydrogen atom or an alkyl group, and $R^{203}$ and $R^{204}$ each independently represent a substituent.

In Formula (UV-3), $R^{301}$ to $R^{303}$ each independently represent a hydrogen atom or an alkyl group, and $R^{304}$ and $R^{305}$ each independently represent a substituent.

Specific examples of the compounds represented by Formulae (UV-1) to (UV-3) include the following compounds.

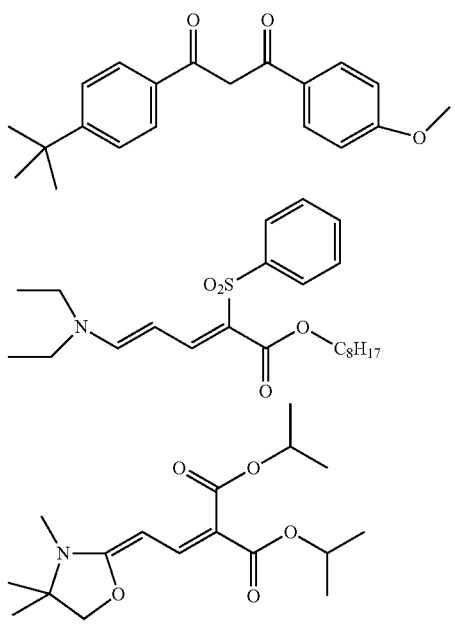

In the composition according to the embodiment of the present invention, the content of the ultraviolet absorber is preferably 0.01 to 10 mass % and more preferably 0.01 to 5 mass % with respect to the total solid content of the composition. In the present invention, as the ultraviolet absorber, one kind may be used alone, or two or more kinds may be used. In a case where two or more ultraviolet absorbers are used in combination, it is preferable that the total content of the two or more ultraviolet absorbers is in the above-described range.

<<Antioxidant>>

The composition according to the embodiment of the present invention may include an antioxidant. Examples of the antioxidant include a phenol compound, a phosphite compound, and a thioether compound. As the phenol compound, any phenol compound which is known as a phenol antioxidant can be used. As the phenol compound, for example, a hindered phenol compound is preferable. A compound having a substituent at a position (ortho position) adjacent to a phenolic hydroxyl group is preferable. As the substituent, a substituted or unsubstituted alkyl group having 1 to 22 carbon atoms is preferable. In addition, as the antioxidant, a compound having a phenol group and a phosphite group in the same molecule is also preferable. In addition, as the antioxidant, a phosphorus antioxidant can also be preferably used. Examples of the phosphorus antioxidant include tris[2-[[2,4,8,10-tetrakis(1,1-dimethylethyl) dibenzo[d,f][1,3,2]dioxaphosphepin-6-yl]oxy]ethyl]amine, tris[2-[(4,6,9,11-tetra-t-butyldibenzo[d,f][1,3,2]dioxaphosphepin-2-yl)oxy]ethyl]amine, and ethyl bis(2,4-di-t-butyl-6-methylphenyl)phosphite. Examples of the commercially available product of the antioxidant include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation).

In the composition according to the embodiment of the present invention, the content of the antioxidant is preferably 0.01 to 20 mass % and more preferably 0.3 to 15 mass % with respect to the total solid content of the composition. As the antioxidant, one kind may be used alone, or two or more kinds may be used in combination. In a case where two or more antioxidants are used in combination, it is preferable that the total content of the two or more antioxidants is in the above-described range.

<<Other Components>>

Optionally, the composition according to the embodiment of the present invention may further include a sensitizer, a curing accelerator, a filler, a thermal curing accelerator, a plasticizer, and other auxiliary agents (for example, conductive particles, a filler, an antifoaming agent, a flame retardant, a leveling agent, a peeling accelerator, an aromatic chemical, a surface tension adjuster, or a chain transfer agent). By the composition appropriately including the components, properties such as film properties can be adjusted. The details of the components can be found in, for example, paragraph "0183" of JP2012-003225A (corresponding to paragraph "0237" of US2013/0034812A) and paragraphs "0101" to "0104" and "0107" to "0109" of JP2008-250074A, the content of which is incorporated herein by reference.

For example, in a case where a film is formed by coating, the viscosity (23° C.) of the composition according to the embodiment of the present invention is preferably 1 to 100 mPa·s. The lower limit is preferably 2 mPa·s or higher and more preferably 3 mPa·s or higher. The upper limit is preferably 50 mPa·s or lower, more preferably 30 mPa·s or lower, and still more preferably 15 mPa·s or lower.

It is more preferable that the composition according to the embodiment of the present invention satisfies at least one of the following spectral characteristics (1) to (4).

(1) A ratio Amin1/Bmax1 of a minimum value Amin1 of an absorbance of the composition in a wavelength range of 400 to 640 nm to a maximum value Bmax1 of an absorbance of the composition in a wavelength range of 800 to 1300 nm is 5 or higher, preferably 7.5 or higher, more preferably 15 or higher, and still more preferably 30 or higher. According to this aspect, a film that can shield light in a wavelength range of 400 to 640 nm and allows transmission of infrared light having a wavelength of longer than 670 nm can be formed.

(2) A ratio Amin2/Bmax2 of a minimum value Amin2 of an absorbance of the composition in a wavelength range of 400 to 750 nm to a maximum value Bmax2 of an absorbance of the composition in a wavelength range of 900 to 1300 nm is 5 or higher, preferably 7.5 or higher, more preferably 15 or higher, and still more preferably 30 or higher. According to this aspect, a film that can shield light in a wavelength range of 400 to 750 nm and allows transmission of infrared light having a wavelength of longer than 850 nm can be formed.

(3) A ratio Amin3/Bmax3 of a minimum value Amin3 of an absorbance of the composition in a wavelength range of 400 to 830 nm to a maximum value Bmax3 of an absorbance of the composition in a wavelength range of 1000 to 1300 nm is 5 or higher, preferably 7.5 or higher, more preferably 15 or higher, and still more preferably 30 or higher. According to this aspect, a film that can shield light in a wavelength range of 400 to 830 nm and allows transmission of infrared light having a wavelength of longer than 940 nm can be formed.

(4) A ratio Amin4/Bmax4 of a minimum value Amin4 of an absorbance of the composition in a wavelength range of 400 to 950 nm to a maximum value Bmax4 of an absorbance of the composition in a wavelength range of 1100 to 1300 nm is 5 or higher, preferably 7.5 or higher, more preferably 15 or higher, and still more preferably 30 or higher. According to this aspect, a film that can shield light in a wavelength range of 400 to 950 nm and allows transmission of infrared light having a wavelength of longer than 1040 nm can be formed.

In a case where a film having a thickness of 1 µm, 2 µm, 3 µm, 4 µm, or 5 µm after drying is formed using the composition according to the embodiment of the present invention, it is preferable that spectral characteristics are satisfied in which in which a maximum value of a light transmittance of the film in a thickness direction in a wavelength range of 400 to 640 nm is 20% or lower and a minimum value of a light transmittance of the film in the thickness direction in a wavelength range of 1100 to 1300 nm is 70% or higher. The maximum value in a wavelength range of 400 to 640 nm is more preferably 15% or lower and still more preferably 10% or lower. The minimum value in a wavelength range of 1100 to 1300 nm is more preferably 75% or higher and still more preferably 80% or higher.

In addition, it is more preferable that the composition according to the embodiment of the present invention satisfies at least one of the following spectral characteristics (1) to (4).

(1) An aspect in which, in a case where a film having a thickness of 1 µm, 2 µm, 3 µm, 4 µm, or 5 µm after drying is formed using the composition according to the embodiment of the present invention, a maximum value of a light transmittance of the film in a thickness direction in a wavelength range of 400 to 640 nm is 20% or lower (preferably 15% or lower and more preferably 10% or lower), and a minimum value of a light transmittance of the film in the thickness direction in a wavelength range of 800 to 1300 nm is 70% or higher (preferably 75% or higher and more preferably 80% or higher).

(2) An aspect in which, in a case where a film having a thickness of 1 µm, 2 µm, 3 µm, 4 µm, or 5 µm after drying is formed using the composition according to the embodiment of the present invention, a maximum value of a light transmittance of the film in a thickness direction in a wavelength range of 400 to 750 nm is 20% or lower (preferably 15% or lower and more preferably 10% or lower), and a minimum value of a light transmittance of the film in the thickness direction in a wavelength range of 900 to 1300 nm is 70% or higher (preferably 75% or higher and more preferably 80% or higher).

(3) An aspect in which, in a case where a film having a thickness of 1 µm, 2 µm, 3 µm, 4 µm, or 5 µm after drying is formed using the composition according to the embodiment of the present invention, a maximum value of a light transmittance of the film in a thickness direction in a wavelength range of 400 to 830 nm is 20% or lower (preferably 15% or lower and more preferably 10% or lower), and a minimum value of a light transmittance of the film in the thickness direction in a wavelength range of 1000 to 1300 nm is 70% or higher (preferably 75% or higher and more preferably 80% or higher).

(4) An aspect in which, in a case where a film having a thickness of 1 µm, 2 µm, 3 µm, 4 µm, or 5 µm after drying is formed using the composition according to the embodiment of the present invention, a maximum value of a light transmittance of the film in a thickness direction in a wavelength range of 400 to 950 nm is 20% or lower (preferably 15% or lower and more preferably 10% or lower), and a minimum value of a light transmittance of the film in the thickness direction in a wavelength range of 1100 to 1300 nm is 70% or higher (preferably 75% or higher and more preferably 80% or higher).

A storage container of the composition according to the embodiment of the present invention is not particularly limited, and a well-known storage container can be used. In addition, as the storage container, in order to suppress infiltration of impurities into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

The use of the composition according to the embodiment of the present invention is not particularly limited. The composition according to the embodiment of the present invention can be preferably used to form an infrared transmitting filter or the like.

<Method of Preparing Composition>

The composition according to the embodiment of the present invention can be prepared by mixing the above-described components with each other. During the preparation of the composition, all the components may be dissolved or dispersed in a solvent at the same time to prepare the composition. Optionally, two or more solutions or dispersions to which the respective components are appropriately added may be prepared, and the solutions or dispersions may be mixed with each other during use (during application) to prepare the composition.

In addition, in a case where the composition according to the embodiment of the present invention includes particles of a pigment or the like, it is preferable that a process of dispersing the particles is provided. Examples of a mechanical force used for dispersing the particles in the process of dispersing the particles include compression, squeezing, impact, shearing, and cavitation. Specific examples of the process include a beads mill, a sand mill, a roll mill, a ball mill, a paint shaker, a Microfluidizer, a high-speed impeller, a sand grinder, a flow jet mixer, high-pressure wet atomization, and ultrasonic dispersion. During the pulverization of the particles using a sand mill (beads mill), it is preferable that the process is performed under conditions for increasing the pulverization efficiency, for example, by using beads having a small size and increasing the filling rate of the beads. In addition, it is preferable that rough particles are removed by filtering, centrifugal separation, and the like after pulverization. In addition, as the process and the disperser for dispersing the particles, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In addition, in the process of dispersing the particles, particles may be refined in a salt milling step. A material, a device, process conditions, and the like used in the salt milling step can be found in, for example, JP2015-194521A and JP2012-046629A.

During the preparation of the composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 μm and is preferably about 0.01 to 3.0 μm and more preferably about 0.05 to 0.5 μm. In a case where the pore size of the filter is in the above-described range, fine foreign matter can be reliably removed. In addition, it is preferable that a fibrous filter material is used. Examples of the fibrous filter material include polypropylene fiber, nylon fiber, and glass fiber. Specific examples include a filter cartridge of SBP type series (for example, SBP008), TPR type series (for example, TPR002 or TPR005), and SHPX type series (for example, SHPX003) all of which are manufactured by Roki Techno Co., Ltd.

In a case where a filter is used, a combination of different filters (for example, a first filter and a second filter) may be used. At this time, the filtering using each of the filters may be performed once, or twice or more.

In addition, a combination of filters having different pore sizes in the above-described range may be used. Here, the pore size of the filter can refer to a nominal value of a manufacturer of the filter. A commercially available filter can be selected from various filters manufactured by Pall Corporation (for example, DFA4201NIEY), Toyo Roshi Kaisha, Ltd., Entegris Japan Co., Ltd. (former Mykrolis Corporation), or Kits Microfilter Corporation.

The second filter may be formed of the same material as that of the first filter.

In addition, the filtering using the first filter may be performed only on the dispersion, and the filtering using the second filter may be performed on a mixture of the dispersion and other components.

<Film>

Next, a film according to the embodiment of the present invention will be described. The film according to the embodiment of the present invention is obtained from the above-described composition according to the embodiment of the present invention. The film according to the embodiment of the present invention can be preferably used as an infrared transmitting filter. The film according to the embodiment of the present invention may be a film having a pattern or a film (flat film) not having a pattern. In addition, the film according to the embodiment of the present invention may be used in a state where it is laminated on a support, or the film according to the embodiment of the present invention may be peeled off from a support.

It is preferable that the film according to the embodiment of the present invention satisfies spectral characteristics in which a maximum value of a light transmittance of the film in a thickness direction in a wavelength range of 400 to 640 nm is 20% or lower and in which a minimum value of a light transmittance of the film in the thickness direction in a wavelength range of 1100 to 1300 nm is 70% or higher. The maximum value in a wavelength range of 400 to 640 nm is more preferably 15% or lower and still more preferably 10% or lower. The minimum value in a wavelength range of 1100 to 1300 nm is more preferably 75% or higher and still more preferably 80% or higher.

It is more preferable that the film according to the embodiment of the present invention satisfies at least one of the following spectral characteristics (1) to (4).

(1): an aspect in which a maximum value of a light transmittance of the film in a thickness direction in a wavelength range of 400 to 640 nm is 20% or lower (preferably 15% or lower and more preferably 10% or lower), and a minimum value of a light transmittance of the film in the thickness direction in a wavelength range of 800 to 1300 nm is 70% or higher (preferably 75% or higher and more preferably 80% or higher). According to this aspect, a film that can shield light in a wavelength range of 400 to 640 nm and allows transmission of infrared light having a wavelength of longer than 670 nm can be formed.

(2): an aspect in which a maximum value of a light transmittance of the film in a thickness direction in a wavelength range of 400 to 750 nm is 20% or lower (preferably 15% or lower and more preferably 10% or lower), and a minimum value of a light transmittance of the film in the thickness direction in a wavelength range of 900 to 1300 nm is 70% or higher (preferably 75% or higher and more preferably 80% or higher). According to this aspect, a film that can shield light in a wavelength range of 400 to 750 nm and allows transmission of infrared light having a wavelength of longer than 850 nm can be formed.

(3): an aspect in which a maximum value of a light transmittance of the film in a thickness direction in a wavelength range of 400 to 830 nm is 20% or lower (preferably 15% or lower and more preferably 10% or lower), and a minimum value of a light transmittance of the film in the thickness direction in a wavelength range of 1000 to 1300 nm is 70% or higher (preferably 75% or higher and more preferably 80% or higher). According to this aspect, a film that can shield light in a wavelength range of 400 to 830 nm and allows transmission of infrared light having a wavelength of longer than 940 nm can be formed.

(4): an aspect in which a maximum value of a light transmittance of the film in a thickness direction in a wavelength range of 400 to 950 nm is 20% or lower (preferably 15% or lower and more preferably 10% or lower), and a minimum value of a light transmittance of the film in the thickness direction in a wavelength range of 1100 to 1300 nm is 70% or higher (preferably 75% or higher and more preferably 80% or higher). According to this aspect, a film that can shield light in a wavelength range of 400 to 950 nm and allows transmission of infrared light having a wavelength of longer than 1040 nm can be formed.

The thickness of the film according to the embodiment of the present invention can be adjusted according to the purpose. The thickness of the film is preferably 100 μm or less, more preferably 15 μm or less, still more preferably 5 μm or less, and still more preferably 1 μm or less. The lower limit value is preferably 0.1 μm. For example, the lower limit of the thickness is preferably 0.1 μm or more, more preferably 0.2 μm or more, and still more preferably 0.3 μm or more.

The film according to the embodiment of the present invention can be used in various devices including a solid image pickup element such as a charge coupled device (CCD) or a complementary metal-oxide semiconductor (CMOS), an infrared sensor, or an image display device.

<Film Forming Method>

Next, a film forming method according to the embodiment of the present invention will be described. The film according to the embodiment of the present invention can be formed through a step of applying the composition according to the embodiment of the present invention.

In the film forming method according to the embodiment of the present invention, it is preferable that the composition is applied to a support. Examples of the support include a substrate formed of a material such as silicon, non-alkali glass, soda glass, PYREX (registered trade name) glass, or quartz glass. For example, an organic film or an inorganic film may be formed on the substrate. Examples of a material of the organic film include the resin described above regarding the composition. In addition, as the support, a substrate formed of the resin can also be used. In addition, a charge coupled device (CCD), a complementary metal-oxide semiconductor (CMOS), a transparent conductive film, or the like may be formed on the support. In addition, a black matrix that separates pixels from each other may be formed on the support. In addition, optionally, an undercoat layer may be provided on the support to improve adhesiveness with a layer above the support, to prevent diffusion of materials, or to make a surface of the substrate flat. In addition, in a case where a glass substrate is used as the support, it is preferable that an inorganic film is formed on the glass substrate or the glass substrate may be dealkalized to be used.

As a method of applying the composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet— Infinite Possibilities in Patent—" (February, 2005, S.B. Research Co., Ltd.) and methods described in JP2003-262716A, JP2003-185831A, JP2003-261827A, JP2012-126830A, and JP2006-169325A.

A composition layer formed by applying the composition may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By setting the pre-baking temperature to be 150° C. or lower, the characteristics can be effectively maintained, for example, even in a case where a photoelectric conversion film of an image sensor is formed of an organic material.

The pre-baking time is preferably 10 to 3000 seconds, more preferably 40 to 2500 seconds, and still more preferably 80 to 220 seconds. Drying can be performed using a hot plate, an oven, or the like.

The film forming method according to the embodiment of the present invention may further include a step of forming a pattern. As the pattern forming method, a pattern forming method using a photolithography method is preferable. It is preferable that the pattern forming method using a photolithography method includes: a step (exposure step) of exposing the composition layer, which is formed by applying the composition according to the embodiment of the present invention, in a pattern shape; and a step (development step)

of forming a pattern by removing a non-exposed portion of the composition layer by development. Optionally, the pattern forming method may further include a step (post-baking step) of baking the developed pattern. Hereinafter, the respective steps will be described.

In the exposure step, the composition layer is exposed in a pattern shape. For example, the composition layer can be exposed in a pattern shape using an exposure device such as a stepper through a mask having a predetermined mask pattern. As a result, an exposed portion can be cured. As radiation (light) used during the exposure, ultraviolet rays such as g-rays or i-rays are preferable, and i-rays are more preferable. The irradiation dose (exposure dose) is preferably 0.03 to 2.5 J/cm$^2$, more preferably 0.05 to 1.0 J/cm$^2$, and most preferably 0.08 to 0.5 J/cm$^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 W/m$^2$ to 100000 W/m$^2$ (for example, 5000 W/m$^2$, 15000 W/m$^2$, or 35000 W/m$^2$). Conditions of the oxygen concentration and conditions of the exposure illuminance may be appropriately combined. For example, conditions are oxygen concentration: 10 vol % and illuminance: 10000 W/m$^2$, or oxygen concentration: 35 vol % and illuminance: 20000 W/m$^2$.

Next, a pattern is formed by removing a non-exposed portion of the exposed composition layer by development. The non-exposed portion of the composition layer can be removed by development using a developer. As a result, a non-exposed portion of the composition layer in the exposure step is eluted into the developer, and only the photocured portion remains on the support. As the developer, an alkali developer which does not cause damages to a solid image pickup element as a substrate, a circuit or the like is desired. For example, the temperature of the developer is preferably 20° C. to 30° C. The development time is preferably 20 to 180 seconds. In addition, in order to further improve residue removing properties, a step of shaking the developer off per 60 seconds and supplying a new developer may be repeated multiple times.

Examples of the alkaline agent used as the developer include: an organic alkaline compound such as ammonia water, ethylamine, diethylamine, dimethylethanolamine, diglycolamine, diethanolamine, hydroxyamine, ethylenediamine, tetramethylammonium hydroxide, tetraethyl ammonium hydroxide, tetrapropylammonium hydroxide, tetrabutylammonium hydroxide, benzyltrimethylammonium hydroxide, dimethyl bis(2-hydroxyethyl)ammonium hydroxide, choline, pyrrole, piperidine, or 1,8-diazabicyclo [5.4.0]-7-undecene; and an inorganic alkaline compound such as sodium hydroxide, potassium hydroxide, sodium carbonate, sodium bicarbonate, sodium silicate, or sodium metasilicate. As the developer, an alkaline aqueous solution in which the above alkaline agent is diluted with pure water is preferably used. A concentration of the alkaline agent in the alkaline aqueous solution is preferably 0.001 to 10 mass % and more preferably 0.01 to 1 mass %. In addition, the developer may include a surfactant to be used. Examples of the surfactant include the surfactants described above regarding the composition. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In a case where a developer including the alkaline aqueous solution is used, it is preferable that the layer is rinsed with pure water after development.

After the development, the film can also be dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and still more preferably 90° C. or lower. The lower limit is, for example, 50° C. or higher. The film after the development is post-baked continuously or batchwise using heating means such as a hot plate, a convection oven (hot air circulation dryer), a high-frequency heater under the above-described conditions. In addition, in a case where a pattern is formed through a low-temperature process, post-baking is not necessarily performed.

<Infrared Transmitting Filter>

Next, an infrared transmitting filter according to the embodiment of the present invention will be described. The infrared transmitting filter according to the embodiment of the present invention includes the film according to the embodiment of the present invention.

The infrared transmitting filter according to the embodiment of the present invention can be used in combination with a color filter that includes a chromatic colorant. The color filter can be manufactured using a coloring composition including a chromatic colorant. Examples of the chromatic colorant include the chromatic colorants described regarding the composition according to the embodiment of the present invention. The coloring composition may further include, for example, a resin, a polymerizable compound, a photopolymerization initiator, a surfactant, a solvent, a polymerization inhibitor, and an ultraviolet absorber. In more detail, for example, the materials described above regarding the composition according to the embodiment of the present invention can be used.

In addition, it is also preferable that the infrared transmitting filter according to the embodiment of the present invention includes a pixel of the film according to the embodiment of the present invention and a pixel selected from the group consisting of a red pixel, a green pixel, a blue pixel, a magenta pixel, a yellow pixel, a cyan pixel, a black pixel, and an achromatic pixel.

<Solid Image Pickup Element>

A solid image pickup element according to the embodiment of the present invention includes the film according to the embodiment of the present invention. The configuration of the solid image pickup element is not particularly limited as long as it includes the film according to the embodiment of the present invention and functions as a solid image pickup element. For example, the following configuration can be adopted.

The solid image pickup element includes a plurality of photodiodes and transfer electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the film according to the embodiment of the present invention is formed on the device protective film. Further, a configuration in which light collecting means (for example, a microlens; hereinafter, the same shall be applied) is provided above the device protective film and below the film according to the embodiment of the present invention (on a side thereof close the support), or a configuration in which light collecting means is provided on the film according to the embodiment of the present invention may be adopted. In addition, the color filter may have a structure in which a film which forms each pixel is embedded in a space which is partitioned in, for example, a lattice shape by a partition wall. In this case, it is preferable that the partition wall has a lower refractive index than each pixel. Examples of an imaging device having such a structure include a device described in JP2012-227478A and JP2014-179577A.

<Image Display Device>

An image display device according to the embodiment of the present invention includes the film according to the embodiment of the present invention. Examples of the image display device include a liquid crystal display device or an organic electroluminescence (organic EL) display device. The definition and details of the image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques". The image display device may include a white organic EL element. It is preferable that the white organic EL element has a tandem structure. The tandem structure of the organic EL element is described in, for example, JP2003-045676A, or pp. 326-328 of "Forefront of Organic EL Technology Development—Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

<Infrared Sensor>

An infrared sensor according to the embodiment of the present invention includes the film according to the embodiment of the present invention. The configuration of the infrared sensor is not particularly limited as long as it functions as an infrared sensor. Hereinafter, an embodiment of the infrared sensor used in the present invention will be described using the drawings.

In FIG. 1, reference numeral 110 represents a solid image pickup element. In an imaging region provided on a solid image pickup element 110, near infrared cut filters 111 and infrared transmitting filters 114 are provided. In addition, color filters 112 are laminated on the near infrared cut filters 111. Microlenses 115 are disposed on an incidence ray hv side of the color filters 112 and the infrared transmitting filters 114. A planarizing layer 116 is formed so as to cover the microlenses 115.

Spectral characteristics of the near infrared cut filters 111 can be selected according to the emission wavelength of an infrared light emitting diode (infrared LED) to be used.

The color filters 112 is not particularly limited as long as pixels which allow transmission of light having a specific wavelength in a visible range and absorbs the light are formed therein, and well-known color filters of the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected according to the emission wavelength of the infrared LED to be used. For example, in a case where the emission wavelength of the infrared LED is 850 nm, a maximum value of a light transmittance of the infrared transmitting filter 114 in the thickness direction of the film in a wavelength range of 400 to 640 nm is preferably 20% or lower, more preferably 15% or lower, and still more preferably 10% or lower. It is preferable that the transmittance satisfies the above-described conditions in the entire wavelength range of 400 to 640 nm.

A minimum value of a light transmittance of the infrared transmitting filter 114 in the thickness direction of the film in a wavelength range of 800 nm or longer (preferably 800 to 1300 nm) is preferably 70% or higher, more preferably 75% or higher, and still more preferably 80% or higher. It is preferable that the transmittance satisfies the above-described conditions in a part of a wavelength range of 800 nm or longer, and it is more preferable that the transmittance satisfies the above-described conditions at a wavelength corresponding to the emission wavelength of the infrared LED.

The thickness of the infrared transmitting filter 114 is preferably 100 µm or less, more preferably 15 µm or less, still more preferably 5 µm or less, and still more preferably 1 µm or less. The lower limit value is preferably 0.1 µm. In a case where the thickness is in the above-described range, the film can satisfy the above-described spectral characteristics.

A method of measuring the spectral characteristics, the thickness, and the like of the infrared transmitting filter 114 is as follows.

The thickness is obtained by measuring the thickness of the dried substrate including the film using a stylus surface profilometer (DEKTAK 150, manufactured by ULVAC Inc.).

The spectral characteristics of the film are values obtained by measuring the transmittance in a wavelength range of 300 to 1300 nm using an ultraviolet-visible-near infrared spectrophotometer (U-4100, manufactured by Hitachi High-Technologies Corporation).

In addition, for example, in a case where the emission wavelength of the infrared LED is 940 nm, it is preferable that a maximum value of a light transmittance of the infrared transmitting filter 114 in a thickness direction in a wavelength range of 450 to 640 nm is 20% or lower, that a light transmittance of the infrared transmitting filter 114 in the thickness direction at a wavelength of 835 nm is 20% or lower, and that a minimum value of a light transmittance of the infrared transmitting filter 114 in the thickness direction in a wavelength range of 1000 to 1300 nm is 70% or higher.

In the infrared sensor shown in FIG. 1, a near infrared cut filter (other near infrared cut filter) other than the near infrared cut filter 111 may be further disposed on the planarizing layer 116. As the other near infrared cut filter, for example, a layer containing copper and/or a dielectric multilayer film may be provided. The details of the groups are as described above. In addition, as the other near infrared cut filter, a dual band pass filter may be used.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %".

<Measurement of Weight-Average Molecular Weight>

The weight-average molecular weights of the compound A and the resin were measured by gel permeation chromatography (GPC) using the following conditions.

Kind of column: a column in which TOSOH TSK gel Super HZM-H, TOSOH TSK gel Super HZ4000, and TOSOH TSK gel Super HZ2000 were linked to each other Developing solvent: tetrahydrofuran Column temperature: 40° C.

Flow rate (sample injection volume): 1.0 μl (sample concentration: 0.1 mass %)

Device name: HLC-8220 GPC (manufactured by Tosoh Corporation)

Detector: refractive index (RI) detector

Calibration curve base resin: a polystyrene resin

<Method of Measuring Acid Value>

The acid values of the compound A and the resin indicate the mass of potassium hydroxide required to neutralize an acidic component per 1 g of solid content. The acid values of the compound A and the resin were measured as follows. That is, a measurement sample was dissolved in a mixed solvent including tetrahydrofuran and water at a ratio (mass ratio; tetrahydrofuran/water) of 9/1, and the obtained solution was neutralized and titrated with a 0.1 mol/L sodium hydroxide aqueous solution at 25° C. using a potentiometric titrator (trade name: AT-510, manufactured by Kyoto Electronics Manufacturing Co., Ltd.). An inflection point of a titration pH curve was set as a titration end point, and the acid value was calculated from the following expression.

$$A = 56.11 \times Vs \times 0.5 \times f/w$$

A: the acid value (mgKOH/g)

Vs: the amount (mL) of the 0.1 mol/L sodium hydroxide aqueous solution used for the titration f: the titer of the 0.1 mol/L sodium hydroxide aqueous solution w: the mass (g) of the measurement sample (expressed in terms of solid contents)

<Measurement of C=C Value>

The C=C value in the compound A represents the molar amount of the C=C group per 1 g of the solid content of the compound A. The C=C value in the compound A was calculated from the following expression after extracting a low molecular weight component (A) of the C=C group portion (for example, methacrylic acid in P-1 or acrylic acid in P-2) from the compound A by an alkali treatment and measuring the content of the low molecular weight component (A) by high-performance liquid chromatography (HPLC). Specifically, 0.1 g of a measurement sample was dissolved in tetrahydrofuran/methanol=50 mL/15 mL, 10 mL of a 4 mol/L sodium hydroxide aqueous solution was added, and a reaction was caused to occur at 40° C. for 2 hours. The reaction solution was neutralized with 10.2 mL of a 4 mol/L methanesulfonic acid aqueous solution, and 5 mL of ion exchange water and 2 mL of methanol were added to obtain a mixed solution. This mixed solution was transferred to a 100 mL measuring flask and was made up to volume with methanol to prepare a HPLC measurement sample. The HPLC measurement sample was measured under the following conditions. The content of the low molecular weight component (a) was calculated from a calibration curve of the separately prepared low molecular weight component (a), and the C=C value was calculated from the following Expression.

C=C value [mmol/g]=(Content [ppm] of Low Molecular Weight Component (a)/Molecular weight [g/mol] of Low Molecular Weight Component (a))/(Weight [g] of Prepared Polymer Solution×(Solid Content Concentration [mass %] of Polymer Solution/100)×100Value Calculation Expression>

<HPLC Measurement Conditions>

Measuring device: Agilent-1200

Column: Synergi 4u Polar-RP 80A, manufactured by Phenomenex, 250 mm×4.60 mm (inner diameter)+guard column Column temperature: 40° C.

Analysis time: 15 min

Flow rate: 1.0 mL/min (maximum liquid feeding pressure: 182 bar)

Injection volume: 5 μL

Detection wavelength: 210 nm

Eluent: tetrahydrofuran (containing no stabilizer; for HPLC)/buffer solution (ion exchange water solution containing 0.2 vol % of phosphoric acid and 0.2 vol % of triethylamine)=55/45 (vol %)

Test Example 1

<Preparation of Dispersion>

Raw materials shown in the following table were mixed with each other, 230 parts by mass of zirconia beads having a diameter of 0.3 mm were further added to the mixture, and the solution was dispersed using a paint shaker for 5 hours. Next, the beads were separated by filtration. As a result, a dispersion was manufactured. Numerical values in the following table are represented by "part(s) by mass".

TABLE 8

| | Coloring Material or Near Infrared Absorber | | Pigment Derivative | | Dispersant | | Solvent | |
|---|---|---|---|---|---|---|---|---|
| | Kind | Part(s) by Mass | Kind | Part(s) by Mass | Kind | Part(s) by Mass | Kind | Part(s) by Mass |
| Pigment Dispersion 1 | PR254 | 12.96 | — | — | P-7 | 15.12 | PGMEA | 71.92 |
| Pigment Dispersion 2 | PR254 | 12.96 | — | — | P-6 | 15.12 | PGMEA | 71.92 |
| Pigment Dispersion 3 | PY139 | 12.96 | — | — | P-16 | 15.12 | PGMEA | 71.92 |
| Pigment Dispersion 4 | PY139 | 12.96 | — | — | P-8 | 15.12 | PGMEA | 71.92 |
| Pigment Dispersion 5 | PB15:6 | 12.96 | — | — | P-9 | 15.12 | PGMEA | 71.92 |
| Pigment Dispersion 6 | PB15:6 | 12.96 | — | — | P-2 | 15.12 | PGMEA | 71.92 |
| Pigment Dispersion 7 | PV23 | 12.96 | — | — | P-16 | 15.12 | PGMEA | 71.92 |
| Pigment Dispersion 8 | PV23 | 12.96 | — | — | P-1 | 15.12 | PGMEA | 71.92 |
| Pigment Dispersion 9 | PR254 PY139 | 8.95 4.01 | — | — | P-5 | 15.12 | PGMEA | 71.92 |
| Pigment Dispersion 10 | PR254 PY139 | 8.95 4.01 | — | — | P-16 | 15.12 | PGMEA | 71.92 |
| Pigment Dispersion 11 | PB15:6 PV23 | 10.23 2.73 | — | — | P-3 | 15.12 | PGMEA | 71.92 |
| Pigment Dispersion 12 | PB15:6 PV23 | 10.23 2.73 | — | — | P-8 | 15.12 | PGMEA | 71.92 |
| Pigment Dispersion 13 | PY139 PV23 | 4.32 8.64 | — | — | P-2 | 15.12 | PGMEA | 71.92 |
| Pigment Dispersion 14 | PBk32 | 12.96 | — | — | P-19 | 15.12 | PGMEA | 71.92 |
| Pigment Dispersion 15 | IB | 12.96 | — | — | P-22 | 15.12 | PGMEA | 71.92 |
| Pigment Dispersion 16 | A1 | 10.96 | A1 | 2 | P-7 | 15.12 | PGMEA | 71.92 |
| Pigment Dispersion 17 | A2 | 12.96 | — | — | P-8 | 15.12 | PGMEA | 71.92 |
| Pigment Dispersion 18 | PR254 PY139 | 8.95 4.01 | — | — | Dispersant 1 | 15.12 | PGMEA | 71.92 |
| Pigment Dispersion 19 | PB15:6 PV23 | 10.23 2.73 | — | — | Dispersant 3 | 15.12 | PGMEA | 71.92 |
| Pigment Dispersion 20 | PY139 | 12.96 | — | — | Dispersant 3 | 15.12 | PGMEA | 71.92 |
| Pigment Dispersion 21 | PV23 | 12.96 | — | — | Dispersant 2 | 15.12 | PGMEA | 71.92 |

TABLE 8-continued

| | Coloring Material or Near Infrared Absorber | | Pigment Derivative | | Dispersant | | Solvent | |
|---|---|---|---|---|---|---|---|---|
| | Kind | Part(s) by Mass | Kind | Part(s) by Mass | Kind | Part(s) by Mass | Kind | Part(s) by Mass |
| Pigment Dispersion 22 | A1 | 12.96 | — | — | Dispersant 3 | 15.12 | PGMEA | 71.92 |

<Preparation of Composition>
Raw materials shown in the following tables were mixed with each other to prepare a composition (curable composition). Numerical values in the following table are represented by "part(s) by mass".

TABLE 9

| | Pigment Diserpsion | | Near Infrared Absorber | | Resin | | Polymerization Compound | | Photopolymerization Initiator | |
|---|---|---|---|---|---|---|---|---|---|---|
| | Kind | Part(s) by Mass | Kind | Part(s) by Mass | Kind | Part(s) by Mass | Kind | Part(s) by Mass | Kind | Part(s) by Mass |
| Example 1 | Pigment Dispersion 1 Pigment Dispersion 5 Pigment Dispersion 3 Pigment Dispersion 16 | 26.14 29.41 13.07 14.71 | | | D1 | 2.38 | E3 | 1.42 | F5 | 1.036 |
| Example 2 | Pigment Dispersion 2 Pigment Dispersion 6 Pigment Dispersion 4 Pigment Dispersion 17 | 26.14 29.41 13.07 14.71 | | | D1 | 2.38 | E1 | 1.42 | F3 | 1.036 |
| Example 3 | Pigment Dispersion 1 Pigment Dispersion 5 Pigment Dispersion 3 Pigment Dispersion 16 | 26.75 30.09 13.37 15.05 | | | D1 | 0.10 | E1 | 1.17 | F5 | 0.856 |
| Example 4 | Pigment Dispersion 1 Pigment Dispersion 5 Pigment Dispersion 3 | 26.75 30.09 13.37 | A3 | 1.95 | D1 | 1.81 | E1 | 1.17 | F5 | 0.856 |

TABLE 9-continued

| | | | | | | | | | | | | |
|---|---|---|---|---|---|---|---|---|---|---|---|---|
| Example 5 | Pigment Dispersion 1 Pigment Dispersion 5 Pigment Dispersion 3 | 26.75 30.09 13.37 | A4 | 1.95 | D1 | 1.81 | E3 | 1.17 | F3 | 0.856 |
| Example 6 | Pigment Dispersion 1 Pigment Dispersion 5 Pigment Dispersion 3 | 26.75 30.09 13.37 | A5 | 1.95 | D1 | 1.81 | E1 | 1.17 | F5 | 0.856 |
| Example 7 | Pigment Dispersion 1 Pigment Dispersion 5 Pigment Dispersion 3 | 26.75 30.09 13.37 | A6 | 1.95 | D1 | 1.81 | E1 | 1.17 | F1 | 0.856 |
| Example 8 | Pigment Dispersion 2 Pigment Dispersion 4 Pigment Dispersion 5 Pigment Dispersion 8 | 17.05 19.68 39.35 9.18 | | | D1 | 0.10 | E1 | 1.17 | F1 | 0.856 |
| Example 9 | Pigment Dispersion 1 Pigment Dispersion 3 Pigment Dispersion 5 | 28.2 17.71 39.35 | | | D1 | 0.10 | E2 | 1.17 | F5 | 0.856 |
| Example 10 | Pigment Dispersion 1 Pigment Dispersion 3 Pigment Dispersion 5 | 28.2 17.71 39.35 | | | D1 | 3.03 | | | F5 | 0.856 |
| Example 11 | Pigment Dispersion 1 Pigment Dispersion 3 Pigment Dispersion 5 | 30.49 19.15 42.55 | | | | | | | F5 | 0.856 |
| Example 12 | Pigment Dispersion 14 Pigment Dispersion 6 Pigment Dispersion 4 | 51.16 17.05 17.05 | | | D1 | 0.10 | E2 | 1.17 | F5 | 0.856 |

TABLE 9-continued

| | | Part(s) by Mass | | Kind | Part(s) by Mass | Kind | Part(s) by Mass | Kind | Part(s) by Mass |
|---|---|---|---|---|---|---|---|---|---|
| Example 13 | Pigment Dispersion 15<br>Pigment Dispersion 6<br>Pigment Dispersion 4 | 51.16<br>17.05<br>17.05 | | D1 | 0.10 | E2 | 1.17 | F5 | 0.856 |
| Example 14 | Pigment Dispersion 10<br>Pigment Dispersion 12 | 43.69<br>43.2 | | D1 | 0.36 | E3 | 0.82 | F2 | 0.824 |
| Example 15 | Pigment Dispersion 9<br>Pigment Dispersion 11 | 43.69<br>43.2 | | D1 | 0.36 | E3 | 0.82 | F2 | 0.824 |
| Example 16 | Pigment Dispersion 3<br>Pigment Dispersion 7 | 28.42<br>56.84 | | D2 | 0.11 | E1<br>E5 | 0.63<br>0.27 | F4 | 0.735 |
| Example 17 | Pigment Dispersion 4<br>Pigment Dispersion 8 | 28.42<br>56.84 | | D2 | 0.11 | E4<br>E5 | 0.63<br>0.27 | F4 | 0.735 |
| Example 18 | Pigment Dispersion 13 | 85.26 | — | — | D2 | 0.11 | E5 | 0.90 | F4 | 0.735 |
| Example 19 | Pigment Dispersion 10<br>Pigment Dispersion 19 | 43.69<br>43.2 | | D1 | 0.36 | E3 | 0.82 | F3 | 0.824 |
| Example 20 | Pigment Dispersion 20<br>Pigment Dispersion 8 | 28.42<br>56.84 | | D1 | 0.11 | E3<br>E4 | 0.63<br>0.27 | F3 | 0.735 |
| Comparative Example 1 | Pigment Dispersion 18<br>Pigment Dispersion 19 | 43.69<br>43.2 | | D2 | 0.36 | E3 | 0.82 | F2 | 0.824 |
| Comparative Example 2 | Pigment Dispersion 20<br>Pigment Dispersion 21 | 28.42<br>56.84 | | D2 | 0.11 | E4<br>E5 | 0.63<br>0.27 | F4 | 0.735 |

| | Ultraviolet Absorber | | Surfactant | | Polymerization Inhibitor | | Solvent | |
|---|---|---|---|---|---|---|---|---|
| | Kind | Part(s) by Mass | Kind | Part(s) by Mass | Kind | Part(s) by Mass | Kind | Part(s) by Mass |
| Example 1 | | | H1 | 4.17 | I1 | 0.0006 | PGMEA | 7.66 |
| Example 2 | | | H1 | 4.17 | I1 | 0.0006 | PGMEA | 7.66 |
| Example 3 | | | H1 | 4.17 | I1 | 0.0006 | PGMEA | 8.44 |
| Example 4 | | | H1 | 4.17 | I1 | 0.0006 | PGMEA | 19.83 |
| Example 5 | | | H1 | 4.17 | I1 | 0.0006 | PGMEA | 19.83 |
| Example 6 | | | H1 | 4.17 | I1 | 0.0006 | PGMEA | 19.83 |

TABLE 9-continued

| | | | | | | | | |
|---|---|---|---|---|---|---|---|---|
| Example 7 | | | H1 | 4.17 | I1 | 0.0006 | PGMEA | 19.83 |
| Example 8 | | | H1 | 4.17 | I1 | 0.0006 | PGMEA | 8.44 |
| Example 9 | | | H1 | 4.17 | I1 | 0.0006 | PGMEA | 8.44 |
| Example 10 | | | H1 | 4.17 | I1 | 0.0006 | PGMEA | 6.68 |
| Example 11 | | | H1 | 4.17 | I1 | 0.0006 | PGMEA | 2.79 |
| Example 12 | | | H1 | 4.17 | I1 | 0.0006 | PGMEA | 8.44 |
| Example 13 | | | H1 | 4.17 | I1 | 0.0006 | PGMEA | 8.44 |
| Example 14 | | | H1 | 4.17 | I1 | 0.0004 | PGMEA | 6.94 |
| Example 15 | | | H1 | 4.17 | I1 | 0.0004 | PGMEA | 6.94 |
| Example 16 | G1 | 0.391 | H1 | 4.17 | I1 | 0.0005 | PGMEA | 8.43 |
| Example 17 | G1 | 0.391 | H1 | 4.17 | I1 | 0.0005 | PGMEA | 8.43 |
| Example 18 | G1 | 0.391 | H1 | 4.17 | I1 | 0.0005 | PGMEA | 8.43 |
| Example 19 | | | H1 | 4.17 | I1 | 0.0004 | PGMEA | 6.94 |
| Example 20 | G1 | 0.391 | H1 | 4.17 | I1 | 0.0005 | PGMEA | 8.43 |
| Comparative Example 1 | | | H1 | 4.17 | I1 | 0.0004 | PGMEA | 6.94 |
| Comparative Example 2 | G1 | 0.391 | H1 | 4.17 | I1 | 0.0005 | PGMEA | 8.43 |

The raw materials shown above in the table are as follows.

(Near Infrared Absorber)

A1 and A2: compounds having the following structure (in the following structural formulae, Me represents a methyl group, and Ph represents a phenyl group)

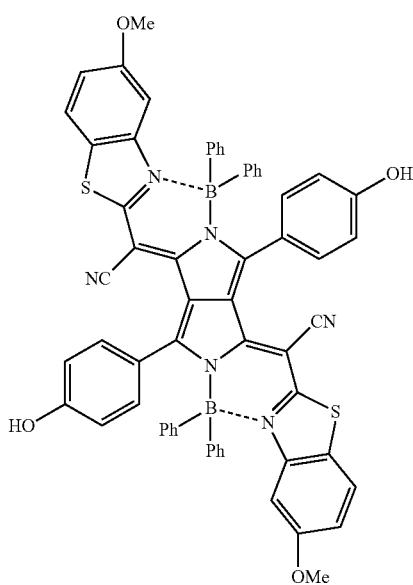
(A1)

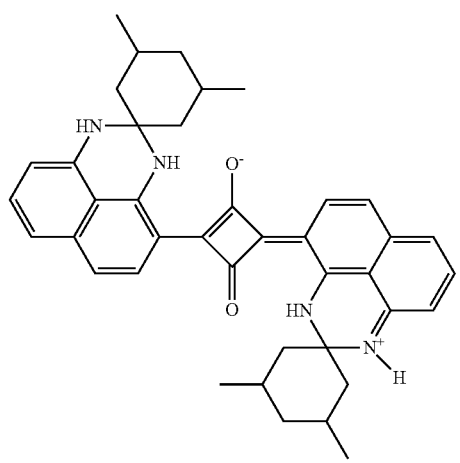
(A2)

A3: a compound a-1 described in paragraph "0173" of JP2016-146619A

A4: a compound a-2 described in paragraph "0173" of JP2016-146619A

A5: a compound a-3 described in paragraph "0173" of JP2016-146619A

A6: NK-5060 (manufactured by Hayashibara Co., Ltd., Cyanine Compound)

(Coloring Material)

PR254: C.I. Pigment Red 254
PY139: C.I. Pigment Yellow 139
PB 15:6: C.I. Pigment Blue 15:6
PV23: C.I. Pigment Violet 23
PBk 32: C.I. Pigment Black 32
IB: IRGAPHOR BLACK (manufactured by BASF SE)

(Pigment Derivative)
B1: a compound having the following structure (in the following structural formula, Ph represents a phenyl group)

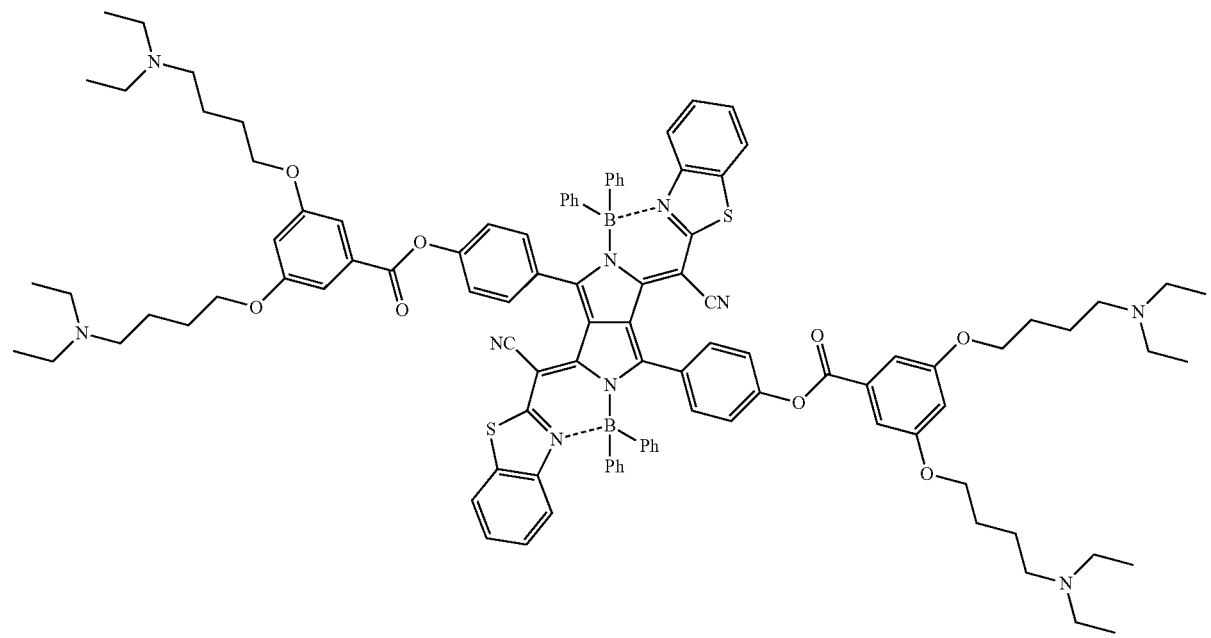

(B1)

(Dispersant)
P-1, P-2, P-3, P-5, P-6, P-7, P-8, P-9, P-16, P-19, and P-22: propylene glycol monomethyl ether acetate (PGMEA) 30 mass % solution of P-1, P-2, P-3, P-5, P-6, P-7, P-8, P-9, P-16, P-19, and P-22 described above as the specific examples of the compound A Dispersant 1: a PGMEA 30 mass % solution of a resin having the following structure (a numerical value added to a main chain represents a molar ratio, and a numerical value added to a side chain represents the number of repeating units; Mw: 20000)

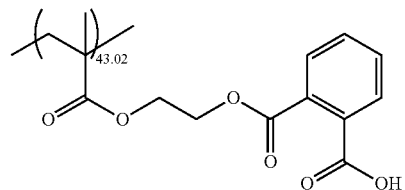

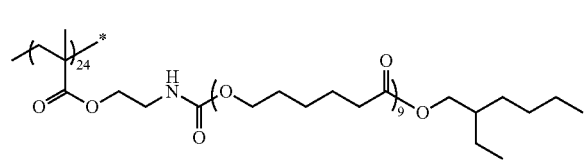

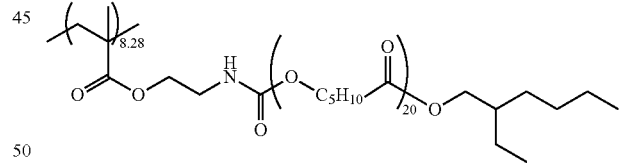

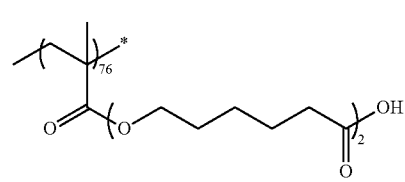

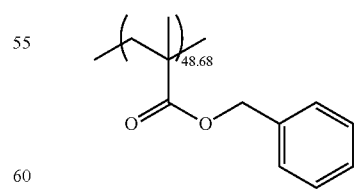

Dispersant 2: a PGMEA 30 mass % solution of a resin having the following structure (a numerical value added to a main chain represents a molar ratio, and a numerical value added to a side chain represents the number of repeating units; Mw: 33000)

Dispersant 3: a PGMEA 30 mass % solution of a resin having the following structure (a numerical value added to a main chain represents a molar ratio, and a numerical value added to a side chain represents the number of repeating units; Mw: 24000)

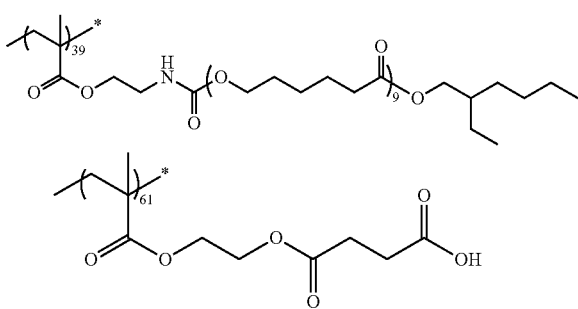

(Resin)

D1: a PGMEA 40 mass % solution of a resin having the following structure (a numerical value added to a main chain represents a molar ratio; Mw=11000)

D2: a PGMEA 40 mass % solution of a resin having the following structure (a numerical value added to a main chain represents a molar ratio; Mw=14000)

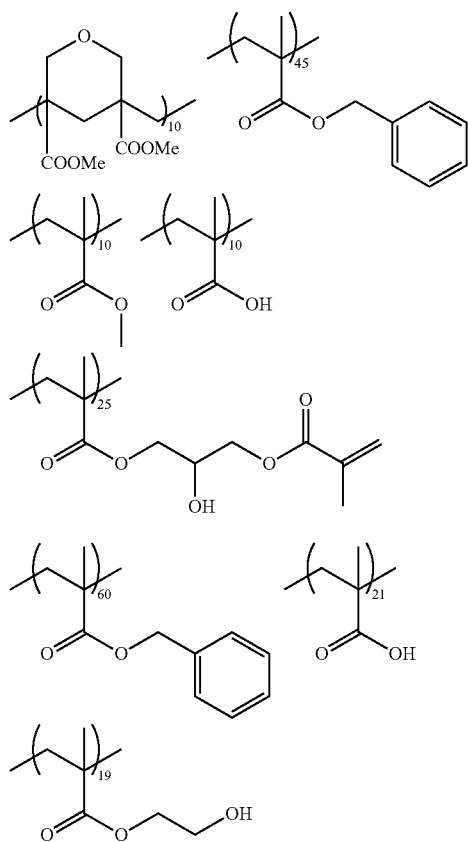

(Polymerizable Compound)

E1: KAYARAD DPHA (manufactured by Nippon Kayaku Co., Ltd.)

E2: ARONIX M-305 (manufactured by Toagosei Co., Ltd.)

E3: NK ESTER A-TMMT (manufactured by Shin-Nakamura Chemical Co., Ltd.)

E4: KAYARAD RP-1040 (manufactured by Nippon Kayaku Co., Ltd.)

E5: ARONIX TO-2349 (manufactured by Toagosei Co., Ltd.)

(Photopolymerization Initiator)

F1: IRGACURE OXEO 1 (manufactured by BASF SE)
F2: IRGACURE OXE02 (manufactured by BASF SE)
F3: IRGACURE OXE03 (manufactured by BASF SE)
F4: IRGACURE 369 (manufactured by BASF SE)
F5: IRGACURE OXE04 (manufactured by BASF SE)

(Ultraviolet Absorber)

G1: UV-503 (manufactured by Daito Chemical Co., Ltd.)

(Surfactant)

H1: a 1 mass % PGMEA solution of the following mixture (Mw: 14000; in the following formula, "%" representing the proportion of a repeating unit is mass %)

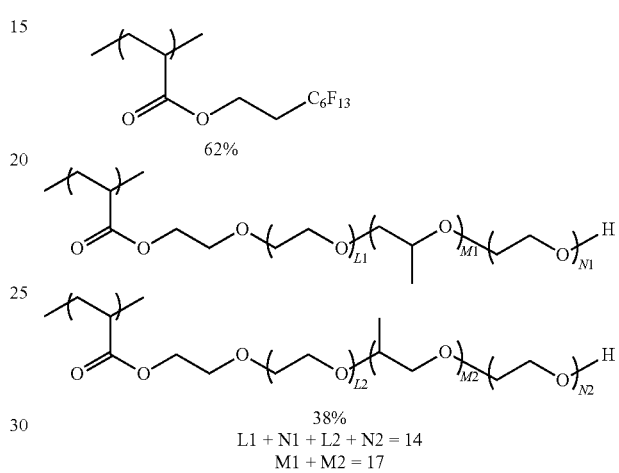

$L1 + N1 + L2 + N2 = 14$
$M1 + M2 = 17$ (Polymerization Inhibitor)

I1: p-methoxyphenol (Solvent)

PGMEA: propylene glycol monomethyl ether acetate

<Absorbance and Spectral Characteristics>

Specifically, each of the compositions was applied to a glass substrate using a spin coating method such that the thickness after post-baking was as shown in the following table, was dried using a hot plate at 100° C. for 120 seconds, and then was further heated (post-baked) using a hot plate at 200° C. for 300 seconds. As a result, a film was formed. Regarding the glass substrate on which the film was formed, the transmittance in a wavelength range of 300 to 1300 nm, the minimum value Amin of the absorbance in a wavelength range of 400 to 640 nm, and the maximum value Bmax of the absorbance in a wavelength range of 1100 to 1300 nm were measured using an ultraviolet-visible-near infrared spectrophotometer U-4100 (manufactured by Hitachi High-Technologies Corporation; ref. glass substrate).

<Evaluation of Color Unevenness>

CT-4000 (manufactured by Fujifilm Electronic Materials Co., Ltd.) was applied to a glass substrate using a spin coating method such that the thickness was 0.1 μm, and was heated using a hot plate at 220° C. for 1 hour. As a result, an underlayer was formed. Each of the compositions was applied to the glass substrate with the underlayer using a spin coating method and then was heated using a hot plate at 100° C. for 2 minutes. As a result, a composition layer having a thickness shown in the following table was obtained.

The composition layer was irradiated with light having a wavelength of 365 nm to be exposed at an exposure dose of 500 mJ/cm². Next, the glass substrate was further heated (post-baked) using a hot plate at 220° C. for 300 seconds to form a film. A distribution in brightness was analyzed using the glass substrate (substrate for evaluation) on which the film was formed, and the color unevenness was evaluated based on the number of pixels having a deviation of ±10% or higher from the average.

A method of measuring the distribution in brightness will be described. the substrate for evaluation was disposed between and an observation lens of an optical microscope and a light source, light was emitted toward the observation lens, and the transmitted light state was observed using the optical microscope MX-50 (manufactured by Olympus Corporation) in which a digital camera is provided. Any selected five regions on the film surface were imaged. The brightness values of the obtained images were stored after being converted into numerical values as a density distribution having a scale of 256 tones from 0 to 255. The distribution in brightness was analyzed based on the image, and the color unevenness was evaluated based on the number of pixels having a deviation of higher than +10% from the average. The evaluation standards are as follows.

5: the number of pixels having a deviation of higher than ±10% from the average was 1000 or less 4: the number of pixels having a deviation of higher than ±10% from the average was more than 1000 and 3000 or less 3: the number of pixels having a deviation of higher than ±10% from the average was more than 3000 and 5000 or less 2: the number of pixels having a deviation of higher than ±10% from the average was more than 5000 and 15000 or less 1: the number of pixels having a deviation of higher than ±10% from the average was more than 15000 coating method and then was heated using a hot plate at 100° C. for 2 minutes. As a result, a composition layer having a thickness shown in the following table was obtained.

Using an i-ray stepper FPA-3000 i5+ (manufactured by Canon Corporation), the composition layer was irradiated with light having a wavelength of 365 nm to be exposed at an exposure dose of 500 mJ/cm$^2$ through a mask pattern in which square pixels having a one side length of 1.1 μm were arranged in a 4 mm×3 mm region of the substrate.

Next, puddle development was performed on the exposed composition layer at 23° C. for 60 seconds using a tetramethylammonium hydroxide (TMAH) 0.3 mass % aqueous solution. Next, the silicon wafer was rinsed by spin showering and was cleaned with pure water. Next, water droplets were blown away using high-pressure air, and the silicon wafer was naturally dried. Next, the silicon wafer was further heated (post-baked) using a hot plate at 220° C. for 300 seconds to form a pattern. The obtained pattern was observed using an optical microscope, the number of adhered patterns among all the patterns was counted to evaluate adhesiveness.

5: all the patterns adhered

4: the proportion of adhered patterns was 90% or higher and lower than 100% with respect to all the patterns 3: the proportion of adhered patterns was 80% or higher and lower than 90% with respect to all the patterns 2: the proportion of adhered patterns was 70% or higher and lower than 80% with respect to all the patterns.

1: the proportion of adhered patterns was lower than 70% with respect to all the patterns

TABLE 10

| | Thickness μm | Maximum Transmittance 400 to 640 nm | Minimum Transmittance 1100 to 1300 nm | Absorbance Amin | Absorbance Bmax | Absorbance Ratio Amin/Bmax | Evaluation Color Unevenness | Evaluation Adhesiveness |
|---|---|---|---|---|---|---|---|---|
| Example 1 | 1.6 | 1.8 | 89.2 | 1.74 | 0.05 | 35.2 | 5 | 5 |
| Example 2 | 1.6 | 2.0 | 80.4 | 1.70 | 0.09 | 17.9 | 3 | 3 |
| Example 3 | 1.5 | 1.9 | 88.4 | 1.72 | 0.05 | 32.1 | 5 | 5 |
| Example 4 | 1.5 | 1.7 | 90.3 | 1.77 | 0.04 | 39.9 | 5 | 5 |
| Example 5 | 1.5 | 2.1 | 89.9 | 1.68 | 0.05 | 36.3 | 5 | 5 |
| Example 6 | 1.5 | 2.2 | 88.7 | 1.66 | 0.05 | 31.9 | 5 | 5 |
| Example 7 | 1.5 | 2.4 | 91.3 | 1.62 | 0.04 | 41.0 | 5 | 5 |
| Example 8 | 0.85 | 6.3 | 81.3 | 1.20 | 0.09 | 13.4 | 3 | 3 |
| Example 9 | 0.85 | 7.7 | 90.1 | 1.11 | 0.05 | 24.6 | 5 | 5 |
| Example 10 | 0.85 | 9.0 | 91.1 | 1.05 | 0.04 | 25.8 | 5 | 4 |
| Example 11 | 0.78 | 6.1 | 93.1 | 1.21 | 0.03 | 39.1 | 4 | 4 |
| Example 12 | 0.85 | 5.3 | 90.1 | 1.28 | 0.05 | 28.2 | 4 | 4 |
| Example 13 | 0.85 | 5.2 | 88.7 | 1.28 | 0.05 | 24.7 | 3 | 4 |
| Example 14 | 0.85 | 5.5 | 97.5 | 1.26 | 0.01 | 114.6 | 4 | 4 |
| Example 15 | 0.85 | 5.0 | 93.0 | 1.30 | 0.03 | 41.3 | 2 | 4 |
| Example 16 | 0.60 | 9.1 | 95.5 | 1.04 | 0.02 | 52.1 | 5 | 5 |
| Example 17 | 0.60 | 9.2 | 92.0 | 1.04 | 0.04 | 28.6 | 3 | 3 |
| Example 18 | 0.60 | 9.8 | 94.0 | 1.01 | 0.03 | 37.5 | 5 | 5 |
| Example 19 | 0.85 | 8.0 | 92.3 | 1.10 | 0.03 | 31.5 | 3 | 2 |
| Example 20 | 0.60 | 9.5 | 88.1 | 1.02 | 0.06 | 18.6 | 3 | 2 |
| Comparative Example 1 | 0.85 | 5.0 | 90.8 | 1.30 | 0.04 | 31.0 | 1 | 1 |
| Comparative Example 2 | 0.60 | 9.7 | 92.0 | 1.01 | 0.04 | 28.0 | 1 | 1 |

<Evaluation of Adhesiveness>

CT-4000 (manufactured by Fujifilm Electronic Materials Co., Ltd.) was applied to a silicon wafer using a spin coating method such that the thickness was 0.1 μm, and was heated using a hot plate at 220° C. for 1 hour. As a result, an underlayer was formed. Each of the compositions was applied to the silicon wafer with the underlayer using a spin As shown in the table, with each of the composition according to Examples, a film having reduced color unevenness was able to be formed. Further, the adhesiveness with the substrate was also excellent.

In addition, the film using each of the compositions according to Examples was incorporated into a solid image pickup element using a well-known method. Using the obtained solid image pickup element, a subject was irradiated with an infrared light emitting diode (infrared LED) as a light source in a low-illuminance environment (0.001 Lux) to acquire images. Next, the imaging performance of the solid image pickup element was evaluated. The subject was able to be clearly recognized on the image. In addition, incidence angle dependence was good.

Test Example 2

A composition for forming a near infrared cut filter was applied to a silicon wafer using a spin coating method such that the thickness of the formed film was 1.0 km. Next, the silicon wafer was heated using a hot plate at 100° C. for 2 minutes. Next, using an i-ray stepper exposure device FPA-3000 i5+(manufactured by Canon Corporation), the coating film was exposed through a mask having a 2 μm×2 μm Bayer pattern at an exposure dose of 1000 mJ/cm$^2$.

Next, puddle development was performed at 23° C. for 60 seconds using a tetramethylammonium hydroxide (TMAH) 0.3 mass % aqueous solution. Next, the silicon wafer was rinsed by spin showering and was cleaned with pure water. Next, the silicon wafer was heated using a hot plate at 200° C. for 5 minutes. As a result, a 2 μm×2 μm Bayer pattern (near infrared cut filter) was formed.

Next, a Red composition was applied to the Bayer pattern of the near infrared cut filter using a spin coating method such that the thickness of the formed film was 1.0 μm Next, the silicon wafer was heated using a hot plate at 100° C. for 2 minutes. Next, using an i-ray stepper exposure device FPA-3000 i5+(manufactured by Canon Corporation), the coating film was exposed through a mask having a 2 μm×2 μm Bayer pattern at an exposure dose of 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was cleaned with pure water. Next, the silicon wafer was heated using a hot plate at 200° C. for 5 minutes. As a result, the Red composition was patterned on the Bayer pattern of the near infrared cut filter. Likewise, a Green composition and a Blue composition were sequentially patterned to form red, green, and blue color patterns.

Next, each of the compositions according to Examples 1 to 18 was applied to the pattern-formed film using a spin coating method such that the thickness of the formed film was 2.0 μm. Next, the silicon wafer was heated using a hot plate at 100° C. for 2 minutes. Next, using an i-ray stepper exposure device FPA-3000 i5+(manufactured by Canon Corporation), the coating film was exposed through a mask having a 2 m×2 μm Bayer pattern at an exposure dose of 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was cleaned with pure water. Next, the silicon wafer was heated using a hot plate at 200° C. for 5 minutes. As a result, the infrared transmitting filter was patterned on a portion where the Bayer pattern of the near infrared cut filter was not formed. This filter was incorporated into a solid image pickup element using a well-known method.

The obtained solid image pickup element was irradiated with light emitted from an infrared light emitting diode (infrared LED) as a light source in a low-illuminance environment (0.001 Lux) to acquire images. Next, the imaging performance of the solid image pickup element was evaluated. The subject was able to be clearly recognized on the image. In addition, incidence angle dependence was good.

The Red composition, the Green composition, the Blue composition, and the composition for forming a near infrared cut filter used in Test Example 2 are as follows.

(Red Composition)

The following components were mixed and stirred, and the obtained mixture was filtered through a nylon filter (manufactured by Pall Corporation) having a pore size of 0.45 m to prepare a Red composition.

| | |
|---|---|
| Red Pigment Dispersion | 51.7 parts by mass |
| Resin 104 | 0.6 parts by mass |
| Polymerizable compound 104 | 0.6 parts by mass |
| Photopolymerization Initiator 101 | 0.4 parts by mass |
| Surfactant 101 | 4.2 parts by mass |
| Ultraviolet absorber (UV-503, manufactured by Daito Chemical Co., Ltd.) | 0.3 parts by mass |
| PGMEA | 42.6 parts by mass |

(Green Composition)

The following components were mixed and stirred, and the obtained mixture was filtered through a nylon filter (manufactured by Pall Corporation) having a pore size of 0.45 μm to prepare a Green composition.

| | |
|---|---|
| Green Pigment Dispersion | 73.7 parts by mass |
| Resin 104 | 0.3 parts by mass |
| Polymerizable compound 101 | 1.2 parts by mass |
| Photopolymerization Initiator 101 | 0.6 parts by mass |
| Surfactant 101 | 4.2 parts by mass |
| Ultraviolet absorber (UV-503, manufactured by Daito Chemical Co., Ltd.) | 0.5 parts by mass |
| PGMEA | 19.5 parts by mass |

(Blue Composition)

The following components were mixed and stirred, and the obtained mixture was filtered through a nylon filter (manufactured by Pall Corporation) having a pore size of 0.45 μm to prepare a Blue composition.

| | |
|---|---|
| Blue Pigment Dispersion | 44.9 parts by mass |
| Resin 104 | 2.1 parts by mass |
| Polymerizable compound 101 | 1.5 parts by mass |
| Polymerizable compound 104 | 0.7 parts by mass |
| Photopolymerization Initiator 101 | 0.8 parts by mass |
| Surfactant 101 | 4.2 parts by mass |
| Ultraviolet absorber (UV-503, manufactured by Daito Chemical Co., Ltd.) | 0.3 parts by mass |
| PGMEA | 45.8 parts by mass |

(Composition for Forming Near Infrared Cut Filter)

| | |
|---|---|
| Near infrared absorber dispersion 1 | 60 parts by mass |
| Polymerizable compound 101 | 6 parts by mass |
| Resin 101 | 4.45 parts by mass |
| Photopolymerization Initiator 101 | 1.99 parts by mass |
| Surfactant 101 | 4.17 parts by mass |
| Polymerization inhibitor 1 (p-methoxyphenol) | 0.003 parts by mass |
| PGMEA | 23.39 parts by mass |

Raw materials used in the Red composition, the Green composition, the Blue composition, and the composition for forming a near infrared cut filter are as follows.

Red Pigment Dispersion 9.6 parts by mass of C.I. Pigment Red 254, 4.3 parts by mass of C.I. Pigment Yellow 139, 6.8 parts by mass of a dispersant (Disperbyk-161, manufactured by BYK Chemie), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Red pigment dispersion was obtained.

Green Pigment Dispersion 6.4 parts by mass of C.I. Pigment Green 36, 5.3 parts by mass of C.I. Pigment Yellow 150, 5.2 parts by mass of a dispersant (Disperbyk-161, manufactured by BYK Chemie), and 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Green pigment dispersion was obtained.

Blue Pigment Dispersion 9.7 parts by mass of C.I. Pigment Blue 15:6, 2.4 parts by mass of C.I. Pigment Violet 23, 5.5 parts by mass of a dispersant (Disperbyk-161, manufactured by BYK Chemie), 82.4 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Blue pigment dispersion was obtained.

Near Infrared Absorber Dispersion 2.5 parts by mass of a near infrared absorber A1, 0.5 parts by mass of a pigment derivative B1, 1.8 parts by mass of a dispersant C3, and 79.3 parts by mass of PGMEA were mixed with each other to obtain a mixed solution, 230 parts by mass of zirconia beads having a diameter of 0.3 mm was further added to the mixed solution, the solution was dispersed using a paint shaker for 5 hours, and the beads were separated by filtration. As a result, a near infrared absorber dispersion 1 was manufactured.

Polymerizable Compound 101: KAYARAD DPHA (Manufactured by Nippon Kayaku Co., Ltd.)

Polymerizable compound 104: a compound having the following structure

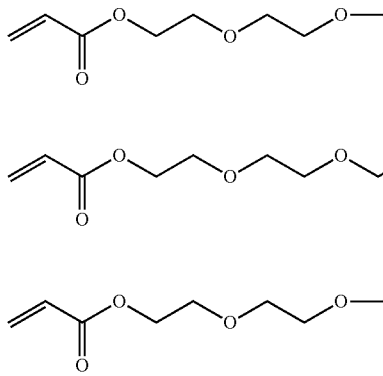
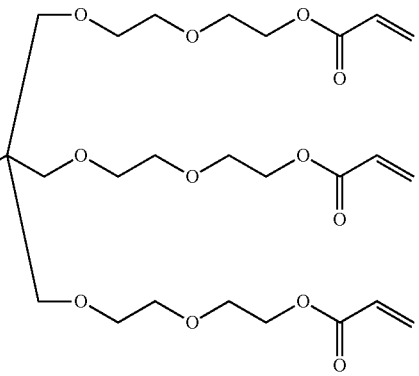

Resin 101: CYCLOMER P(ACA)230AA (Manufactured by Daicel Corporation)

Resin 104: a resin having the following structure (acid value: 70 mgKOH/g, Mw=11000; a ratio in a structural unit is a molar ratio)

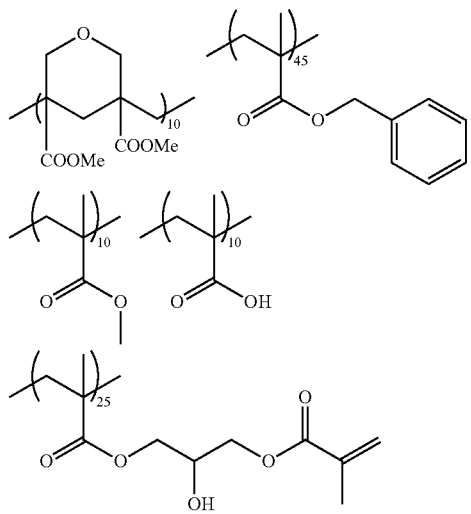

Photopolymerization Initiator 101: IRGACURE-OXE 01 (manufactured by BASF SE)

Surfactant 101: a 1 mass % PGMEA solution of the following mixture (Mw: 14000; in the following formula, "%" representing the proportion of a repeating unit is mass %)

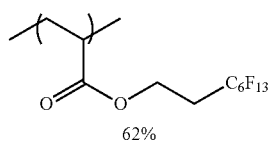

-continued

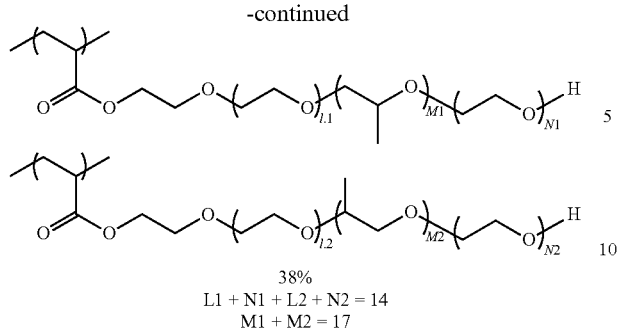

38%
L1 + N1 + L2 + N2 = 14
M1 + M2 = 17

EXPLANATION OF REFERENCES

110: solid image pickup element
111: near infrared cut filter
112: color filter
114: infrared transmitting filter
115: microlens
116: planarizing layer

What is claimed is:

1. A composition comprising:
a light shielding material; and
a compound A having a weight-average molecular weight of 3000 or higher,
wherein the compound A includes a repeating unit having a radically polymerizable ethylenically unsaturated group, a repeating unit having a graft chain, and a repeating unit having an acid group,
the radically polymerizable ethylenically unsaturated group included in the repeating unit having a radically polymerizable ethylenically unsaturated group is at least one selected from a vinyl group, a vinyloxy group, an allyl group, a methallyl group, a (meth)acryloyl group, a styrene group, a cinnamoyl group, and a maleimide group,
a content of the repeating unit having the radically polymerizable ethylenically unsaturated group is 10 to 80 mol % with respect to all the repeating units of the compound A,
a content of the repeating unit having the graft chain is 1.0 to 60 mol % with respect to all the repeating units of the compound A,
a content of the repeating unit having the acid group is 10 to 80 mol % with respect to all the repeating units of the compound A, and
a ratio Amin/Bmax of a minimum value Amin of an absorbance of the composition in a wavelength range of 400 to 640 nm to a maximum value Bmax of an absorbance of the composition in a wavelength range of 1100 to 1300 nm is 5 or higher.

2. The composition according to claim 1,
wherein the graft chain includes at least one structure selected from a polyester structure, a polyether structure, a poly(meth)acryl structure, a polyurethane structure, a polyurea structure, and a polyamide structure.

3. The composition according to claim 2,
wherein the graft chain includes a polyester structure.

4. The composition according to claim 1,
wherein the weight-average molecular weight of the repeating unit having a graft chain is 1000 or higher.

5. The composition according to claim 1,
wherein the compound A includes a repeating unit represented by the following Formula (A-1-1) and a repeating unit represented by the following Formula (A-1-2),

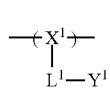 (A-1-1)

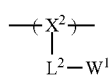 (A-1-2)

in Formula (A-1-1), $X^1$ represents a main chain of the repeating unit, $L^1$ represents a single bond or a divalent linking group, and $Y^1$ represents a group having a radically polymerizable ethylenically unsaturated group, and in Formula (A-1-2), $X^2$ represents a main chain of the repeating unit, $L^2$ represents a single bond or a divalent linking group, and $W^1$ represents a graft chain.

6. The composition according to claim 1,
wherein an amount of the radically polymerizable ethylenically unsaturated group in the compound A is 0.2 to 5.0 mmol/g.

7. The composition according to claim 1,
wherein an acid value of the compound A is 20 to 150 mgKOH/g.

8. The composition according to claim 1,
wherein the light shielding material includes two or more chromatic colorants and forms black using a composition of the two or more chromatic colorant.

9. The composition according to claim 1,
wherein the light shielding material includes an organic black colorant.

10. The composition according to claim 1, further comprising:
a near infrared absorber.

11. A film which is formed using the composition according to claim 1.

12. An infrared transmitting filter comprising:
the film according to claim 11.

13. A solid image pickup element comprising:
the film according to claim 11.

14. An image display device comprising:
the film according to claim 11.

15. An infrared sensor comprising:
the film according to claim 11.

* * * * *